US012707840B2

(12) United States Patent
Byun et al.

(10) Patent No.: US 12,707,840 B2
(45) Date of Patent: Aug. 11, 2026

(54) DISPLAY APPARATUS

(71) Applicant: Samsung Display Co., Ltd., Yongin-si (KR)

(72) Inventors: Minwoo Byun, Yongin-si (KR); Jihyun Ka, Yongin-si (KR); Chulkyu Kang, Yongin-si (KR); Wonkyu Kwak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 409 days.

(21) Appl. No.: 18/404,255

(22) Filed: Jan. 4, 2024

(65) Prior Publication Data

US 2024/0306450 A1 Sep. 12, 2024

(30) Foreign Application Priority Data

Mar. 6, 2023 (KR) ........................ 10-2023-0029277

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/121; H10K 59/1213; H10K 59/1216; H10K 59/131; G09G 2310/02; G09G 2300/0426; G09G 2310/08; G09G 2300/0842; G09G 3/3233
See application file for complete search history.

(56) References Cited

U.S. PATENT DOCUMENTS

| | | | | |
|---|---|---|---|---|
| 10,559,261 | B2 | 2/2020 | Chang et al. | |
| 11,470,729 | B2 | 10/2022 | Kim et al. | |
| 2015/0077413 | A1 | 3/2015 | Kim | |
| 2021/0287605 | A1 | 9/2021 | Wang et al. | |
| 2021/0351260 | A1* | 11/2021 | Kim ..................... | H10K 59/131 |
| 2022/0173189 | A1 | 6/2022 | Kim et al. | |
| 2022/0366852 | A1 | 11/2022 | Jeong et al. | |
| 2023/0009113 | A1 | 1/2023 | Son et al. | |

(Continued)

FOREIGN PATENT DOCUMENTS

| | | |
|---|---|---|
| KR | 10-2015-0032071 | 3/2015 |
| KR | 10-2018-0003707 | 1/2018 |
| KR | 10-2018-0078109 | 7/2018 |

(Continued)

OTHER PUBLICATIONS

International Search Report corresponding to International Application No. PCT/KR2024/000783, dated Apr. 11, 2024.

*Primary Examiner* — Brook Kebede

(57) ABSTRACT

Each pixel of a display apparatus includes a first transistor, a second transistor connected to a first gate of the first transistor and a data line, a third transistor connected to the first gate of the first transistor and a first voltage line, a first capacitor including a first electrode connected to the first gate of the first transistor and a second electrode connected to the second terminal of the first transistor, and a second capacitor including a first electrode connected to the first voltage line and a second electrode connected to the second terminal of the first transistor. The first electrode of the second capacitor and the first voltage line are disposed on a same layer.

30 Claims, 38 Drawing Sheets

(56) References Cited

U.S. PATENT DOCUMENTS

2023/0066949 A1 * 3/2023 Jeong ....................... G09G 3/32

FOREIGN PATENT DOCUMENTS

| | | |
|---|---|---|
| KR | 10-2066096 | 2/2020 |
| KR | 10-2021-0114578 | 9/2021 |
| KR | 10-2022-0014366 | 2/2022 |
| KR | 10-2022-0076872 | 6/2022 |
| KR | 10-2457500 | 10/2022 |
| KR | 10-2023-0009249 | 1/2023 |
| KR | 10-2486663 | 1/2023 |

* cited by examiner

| BHz | AS | SS | SS | SS | ··· | SS | SS |
|---|---|---|---|---|---|---|---|

Figure 17B:
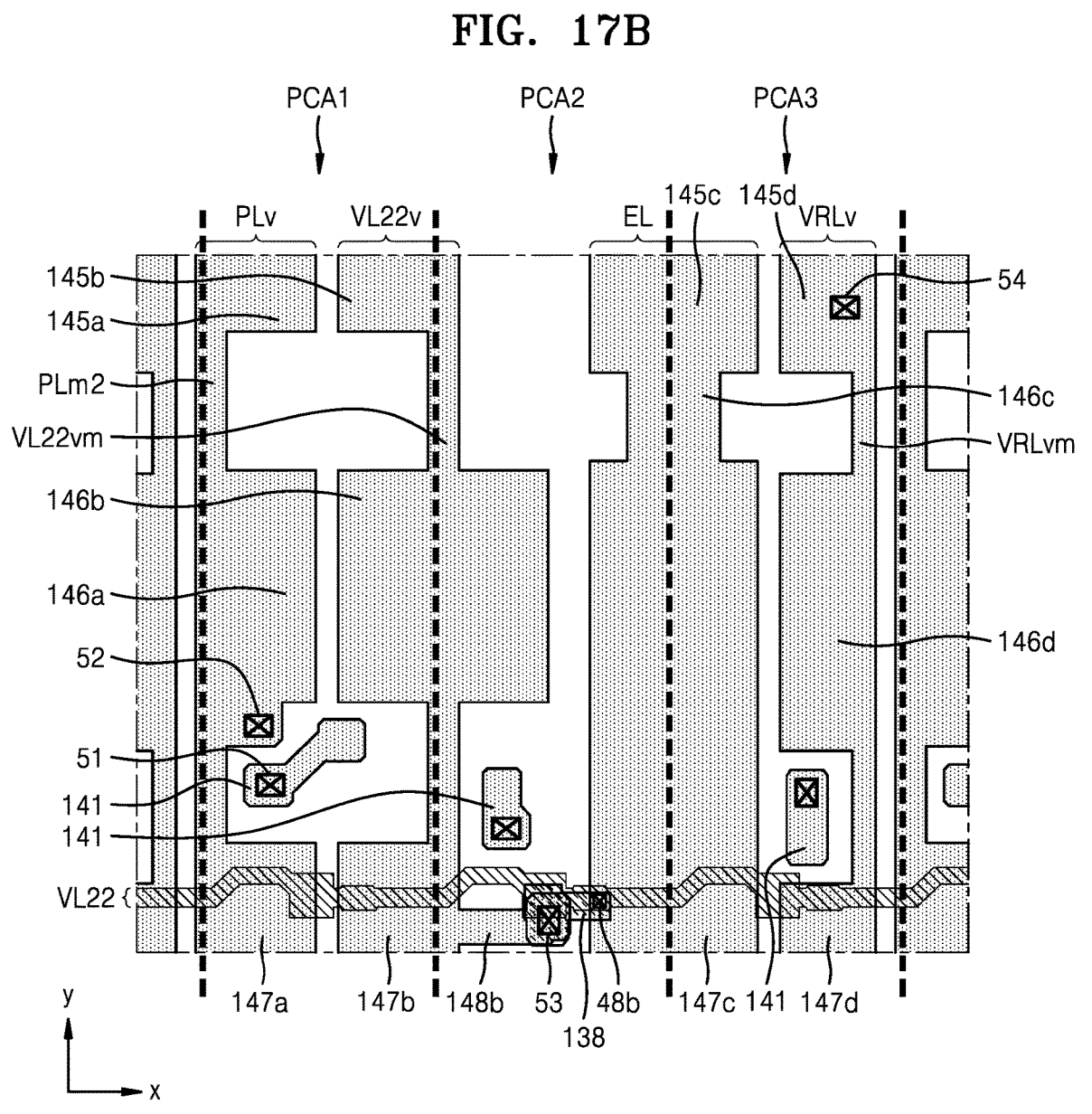

PCA1
PCA2
PCA3
PLv
VL22v
EL
145c
145d
VRLv
145b
145a
PLm2
VL22vm
146b
146a
52
51
141
141
VL22
54
146c
VRLvm
146d
147a
147b
148b
53
48b
138
147c
141
147d
y
x

DISPLAY APPARATUS

CROSS-REFERENCE TO RELATED APPLICATION

This application claims priority to and benefits of Korean Patent Application No. 10-2023-0029277 under 35 U.S.C. § 119, filed on Mar. 6, 2023, in the Korean Intellectual Property Office (KIPO), the disclosure of which is incorporated herein by reference in its entirety.

BACKGROUND

1. Technical Field

One or more embodiments relate to pixels and a display apparatus including the same.

2. Description of the Related Art

Applications of display devices have recently diversified. Moreover, since display devices have become thinner and lighter, their range of use has increased.

Given that display apparatuses are utilized in various ways, various methods may be used to design the shapes of display apparatuses, and the number of functions that may be connected or linked to display apparatuses is increasing.

SUMMARY

One or more embodiments include a display apparatus having an improved display quality. However, aspects of embodiments are not limited thereto, and the above characteristics do not limit the scope of embodiments according to the disclosure.

Additional aspects will be set forth in part in the description which follows and, in part, will be apparent from the description, or may be learned by practice of the presented embodiments of the disclosure.

According to one or more embodiments, a display apparatus includes a plurality of pixels, wherein each of the plurality of pixels includes a first transistor including a first terminal, a second terminal, a first gate, and a second gate connected to the second terminal, a second transistor connected to the first gate of the first transistor and a data line, a third transistor connected to the first gate of the first transistor and a first voltage line, a fourth transistor connected to the first terminal of the first transistor and a second voltage line, a first capacitor including a first electrode connected to the first gate of the first transistor and a second electrode connected to the second terminal of the first transistor, and a second capacitor including a first electrode connected to the first voltage line and a second electrode connected to the second terminal of the first transistor. The first electrode of the second capacitor and the first voltage line are disposed on a same layer.

The second electrode of the second capacitor may be connected to the second gate of the first transistor.

The first electrode of the first capacitor may include an upper electrode and a lower electrode, the upper electrode and the first gate of the first transistor may be disposed on a same layer, the lower electrode and the first electrode of the second capacitor may be disposed on a same layer, and the lower electrode may be connected to the upper electrode.

During one frame, a gate signal may be supplied to a gate of the third transistor once, and a gate signal may be supplied to a gate of the fourth transistor two or more times.

Each of the plurality of pixels may further include a fifth transistor connected to the second terminal of the first transistor and a third voltage line, a sixth transistor connected to the second terminal of the first transistor and a light-emitting diode, and a seventh transistor connected to the light-emitting diode and a fourth voltage line, and a same gate signal may be supplied to a gate of the fifth transistor and a gate of the seventh transistor.

A timing at which a gate signal is applied to a gate of the fourth transistor may precede a timing at which a gate signal is applied to a gate of the sixth transistor.

Each of the plurality of pixels may further include a fifth transistor connected to the second terminal of the first transistor and a third voltage line, a sixth transistor connected to the second terminal of the first transistor and a light-emitting diode, and a seventh transistor connected to the light-emitting diode and a fourth voltage line, and a gate signal supplied to a gate of the fifth transistor and a gate signal supplied to a gate of the seventh transistor may be different.

During one frame, a gate signal may be supplied to the gate of the fifth transistor once, and a gate signal may be supplied to the gate of the seventh transistor two or more times.

One frame may include a first scan period including a first non-emission period and a first emission period and a second scan period including a second non-emission period and a second emission period. Each of the plurality of pixels may further include a fifth transistor connected to the second terminal of the first transistor and a third voltage line. The first non-emission period may include a writing period in which a first gate signal is applied to a gate of the second transistor, a first period in which a second gate signal is applied to a gate of the fifth transistor and a third gate signal is applied to a gate of the third transistor, before the writing period, and a second period in which the third gate signal is applied to a gate of the third transistor and a fourth gate signal is applied to a gate of the fourth transistor, between the writing period and the first period.

The second non-emission period may include a third period in which the second gate signal is applied to the gate of the fifth transistor.

According to one or more embodiments, a display apparatus includes a plurality of pixels, wherein each of the plurality of pixels includes a first transistor including a first terminal, a second terminal, a first gate, and a second gate connected to the second terminal, a second transistor connected to the first gate of the first transistor and a data line, a third transistor connected to the first gate of the first transistor and a first voltage line, a fourth transistor connected to the first terminal of the first transistor and a second voltage line, a fifth transistor connected to the second terminal of the first transistor and a light-emitting diode, a first capacitor including a first electrode connected to the first gate of the first transistor and a second electrode connected to the second terminal of the first transistor, and a second capacitor including a first electrode connected to the first voltage line and a second electrode connected to the second terminal of the first transistor. A timing at which a gate signal is applied to a gate of the fourth transistor precedes a timing at which a gate signal is applied to a gate of the fifth transistor.

The second electrode of the second capacitor may be connected to the second gate of the first transistor.

The first electrode of the first capacitor may include an upper electrode and a lower electrode, the upper electrode and the first gate of the first transistor may be disposed on a same layer, and the lower electrode and the first electrode of the second capacitor may be disposed on a same layer, and the lower electrode may be connected to the upper electrode.

During one frame, a gate signal may be supplied to a gate of the third transistor once, and a gate signal may be supplied to a gate of the fourth transistor two or more times.

Each of the plurality of pixels may further include a sixth transistor connected to the second terminal of the first transistor and a third voltage line, and a seventh transistor connected to the light-emitting diode and a fourth voltage line. A same gate signal may be supplied to a gate of the sixth transistor and a gate of the seventh transistor.

Each of the plurality of pixels may further include a sixth transistor connected to the second terminal of the first transistor and a third voltage line, and a seventh transistor connected to the light-emitting diode and a fourth voltage line. A gate signal supplied to a gate of the sixth transistor and a gate signal supplied to a gate of the seventh transistor may be different.

During one frame, a gate signal may be supplied to the gate of the sixth transistor once, and a gate signal may be supplied to the gate of the seventh transistor two or more times.

According to one or more embodiments, a display apparatus includes a plurality of pixels, wherein each of the plurality of pixels includes a first transistor including a first terminal, a second terminal, a first gate, and a second gate connected to the second terminal, a second transistor connected to the first gate of the first transistor and a data line, a third transistor connected to the first gate of the first transistor and a first voltage line, a fourth transistor connected to the first terminal of the first transistor and a second voltage line, a first capacitor including a first electrode connected to the first gate of the first transistor and a second electrode connected to the second terminal of the first transistor, a second capacitor including a first electrode connected to the second voltage line and a second electrode connected to the second terminal of the first transistor, and a third capacitor including a first electrode connected to the second terminal of the first transistor and a second electrode connected to one electrode of a light-emitting diode.

Each of the plurality of pixels may further include a fifth transistor connected to the second terminal of the first transistor and a third voltage line, a sixth transistor connected to the second terminal of the first transistor and the light-emitting diode, and a seventh transistor connected to the light-emitting diode and a fourth voltage line. A same gate signal may be supplied to a gate of the fifth transistor and a gate of the seventh transistor. A timing at which a gate signal is applied to a gate of the fourth transistor may precede a timing at which a gate signal is applied to a gate of the sixth transistor.

According to an embodiment, each of the plurality of pixels may further include a fifth transistor connected to the second terminal of the first transistor and a third voltage line, a sixth transistor connected to the second terminal of the first transistor and the light-emitting diode, and a seventh transistor connected to the light-emitting diode and a fourth voltage line. A gate signal supplied to a gate of the fifth transistor and a gate signal supplied to a gate of the seventh transistor may be different. A timing at which a gate signal is applied to a gate of the fourth transistor may precede a timing at which a gate signal is applied to a gate of the sixth transistor.

According to one or more embodiments, a display apparatus includes a plurality of pixels, wherein each of the plurality of pixels includes a first transistor including a first terminal, a second terminal, a first gate, and a second gate connected to the second terminal, a second transistor connected to the first gate of the first transistor and a data line, a third transistor connected to the first gate of the first transistor and a first voltage line, a fourth transistor connected to the first terminal of the first transistor and a second voltage line, a fifth transistor connected to the second terminal of the first transistor and a first electrode of a light-emitting diode, a first capacitor including a first electrode connected to the first gate of the first transistor and a second electrode connected to the second terminal of the first transistor, and a second capacitor including a first electrode connected to the second terminal of the first transistor and a second electrode connected to a second electrode of the light-emitting diode.

The first electrode of the second capacitor may be connected to the second gate of the first transistor.

The first electrode of the first capacitor may include an upper electrode and a lower electrode, the upper electrode and the first gate of the first transistor are disposed on a same layer, the lower electrode and the first electrode of the second capacitor are disposed on a same layer, and the lower electrode is connected to the upper electrode.

During one frame, a gate signal may be supplied to a gate of the third transistor once, and a gate signal may be supplied to a gate of the fourth transistor two or more times.

Each of the plurality of pixels may further include a sixth transistor connected to the second terminal of the first transistor and a third voltage line, and a seventh transistor connected to the first electrode of the light-emitting diode and a fourth voltage line. A same gate signal may be supplied to a gate of the sixth transistor and a gate of the seventh transistor.

A timing at which a gate signal is applied to a gate of the fourth transistor may precede a timing at which a gate signal is applied to a gate of the fifth transistor.

Each of the plurality of pixels may further include a sixth transistor connected to the second terminal of the first transistor and a third voltage line, and a seventh transistor connected to the first electrode of the light-emitting diode and a fourth voltage line, and a gate signal supplied to a gate of the sixth transistor and a gate signal supplied to a gate of the seventh transistor may be different.

During one frame, a gate signal is supplied to a gate of the sixth transistor once, and a gate signal may be supplied to a gate of the seventh transistor two or more times.

One frame may include a first scan period including a first non-emission period and a first emission period and a second scan period including a second non-emission period and a second emission period. Each of the plurality of pixels further comprises a sixth transistor connected to the second terminal of the first transistor and a third voltage line. The first non-emission period may include a writing period in which a first gate signal is applied to a gate of the second transistor, a first period in which a second gate signal is applied to a gate of the sixth transistor and a third gate signal is applied to a gate of the third transistor, before the writing period, and a second period in which the third gate signal is applied to a gate of the third transistor and a fourth gate signal is applied to a gate of the fourth transistor, between the writing period and the first period.

The second non-emission period may include a third period in which the second gate signal is applied to the gate of the sixth transistor.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 3A and 3B are conceptual diagrams for explaining a method of driving a display apparatus according to a driving frequency;

FIGS. 11 through 19 are schematic plan views (or layout views) illustrating an arrangement of elements of the pixel of FIG. 4 on a layer-by-layer basis;

DETAILED DESCRIPTION OF THE EMBODIMENTS

Figure 1A:
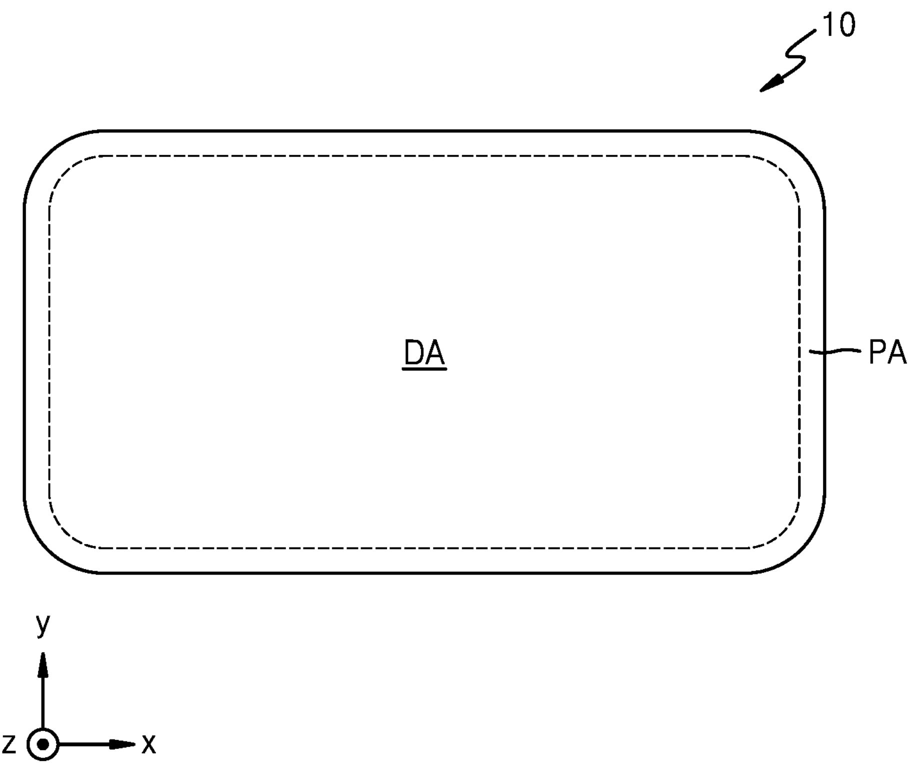
FIGS. 1A and 1B are schematic plan views of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

The term "and/or" includes all combinations of one or more of which associated configurations may define. For example, "A and/or B" may be understood to mean "A, B, or A and B." For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the disclosure are shown. The disclosure may, however, be embodied in many different forms and should not be construed as limited to the embodiments set forth herein.

It will be understood that although the terms "first," "second," etc. may be used herein to describe various elements, these elements should not be limited by these terms. These terms are only used to distinguish one element from another.

As used herein, the singular forms, such as "a" and "an," are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

When it is referred that X and Y are connected, it may include the case where X and Y are electrically connected, the case where X and Y are functionally connected, and the case where X and Y are physically connected. And when X and Y are referred to as being connected to each other, it may indicate cases where X and Y are directly connected to each other, or X and Y are indirectly connected to each other. Here, X and Y may be objects (e.g., apparatuses, devices, circuits, wirings, electrodes, terminals, conductive layers, and layers). Therefore, connection is not limited to preset connection relationship, for example, connection relationship shown in the drawings or detailed descriptions, and may include other connections relationships not shown in the drawings or detailed descriptions.

A case where X and Y are electrically connected to each other may include, for example, a case where X and Y are electrically and directly connected to each other, or a case where at least one device (e.g., a switch, a transistor, a capacitance element, an inductor, a resistance element, a diode, etc.) that enables electrical connection of X and Y is connected between X and Y.

The term "ON" or "on" used in association with an element state may be referred to as an activated state of an element, and "OFF" or "off" may be referred to as an inactivated state of an element. "ON" or "on" used in association with a signal received by an element may be referred to as a signal for activating the element, and "OFF" or "off" used in association with a signal received by an element may be referred to as a signal for inactivating the element. An element may be activated by a high-level voltage or a low-level voltage. For example, a P-channel transistor (P-type transistor) is activated by a low-level voltage, and an N-channel transistor (N-type transistor) is activated by a high-level voltage. Therefore, it should be understood that an "ON" voltage for a P-type transistor and an "ON" voltage for an N-type transistor have opposite (high versus low) voltage levels.

In this specification, an arbitrary signal being supplied may refer to an on-voltage or on voltage (e.g., a high-level voltage) being supplied, and an arbitrary signal not being supplied may refer to an off-voltage (e.g., a low-level voltage) being supplied.

In the following embodiments, an x direction, a y direction, and a z direction are not limited to directions along three axes of a rectangular coordinate system, and may be interpreted in a broader sense. For example, the x direction, the y direction, and the z direction may be perpendicular to one another, or may represent different directions that are not perpendicular to one another.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

A display apparatus according to embodiments may be implemented as an electronic apparatus such as a smartphone, a mobile phone, a smart watch, a navigation device, a game console, a TV, a vehicle head part, a notebook computer, a laptop computer, a tablet computer, a personal media player (PMP), or a personal digital assistant (PDA). The electronic apparatus may be flexible.

Figure 1B:
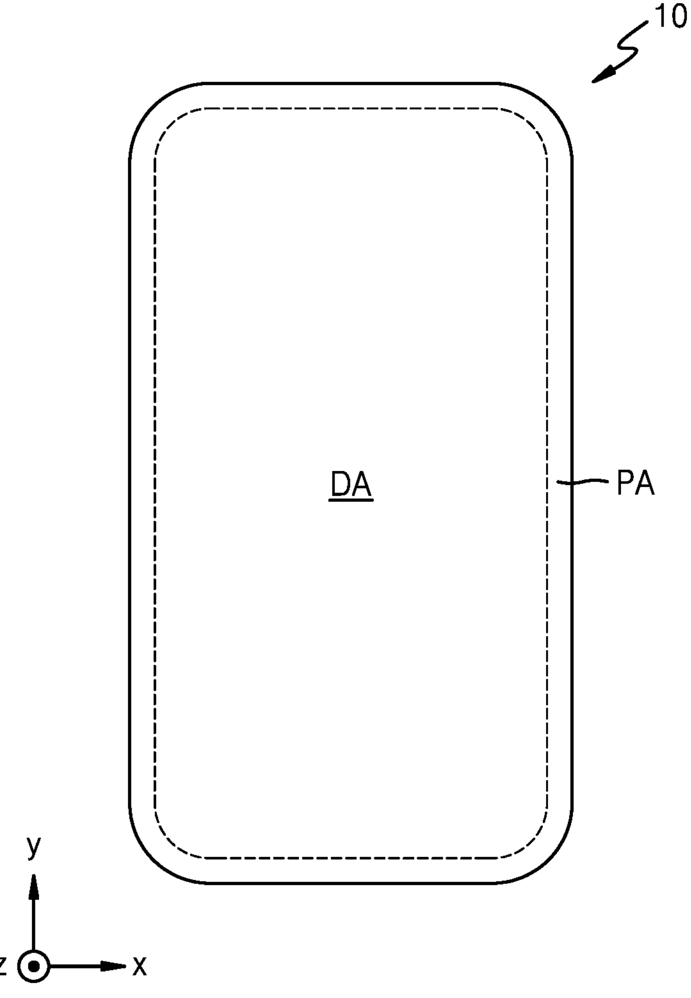
Figure 2:
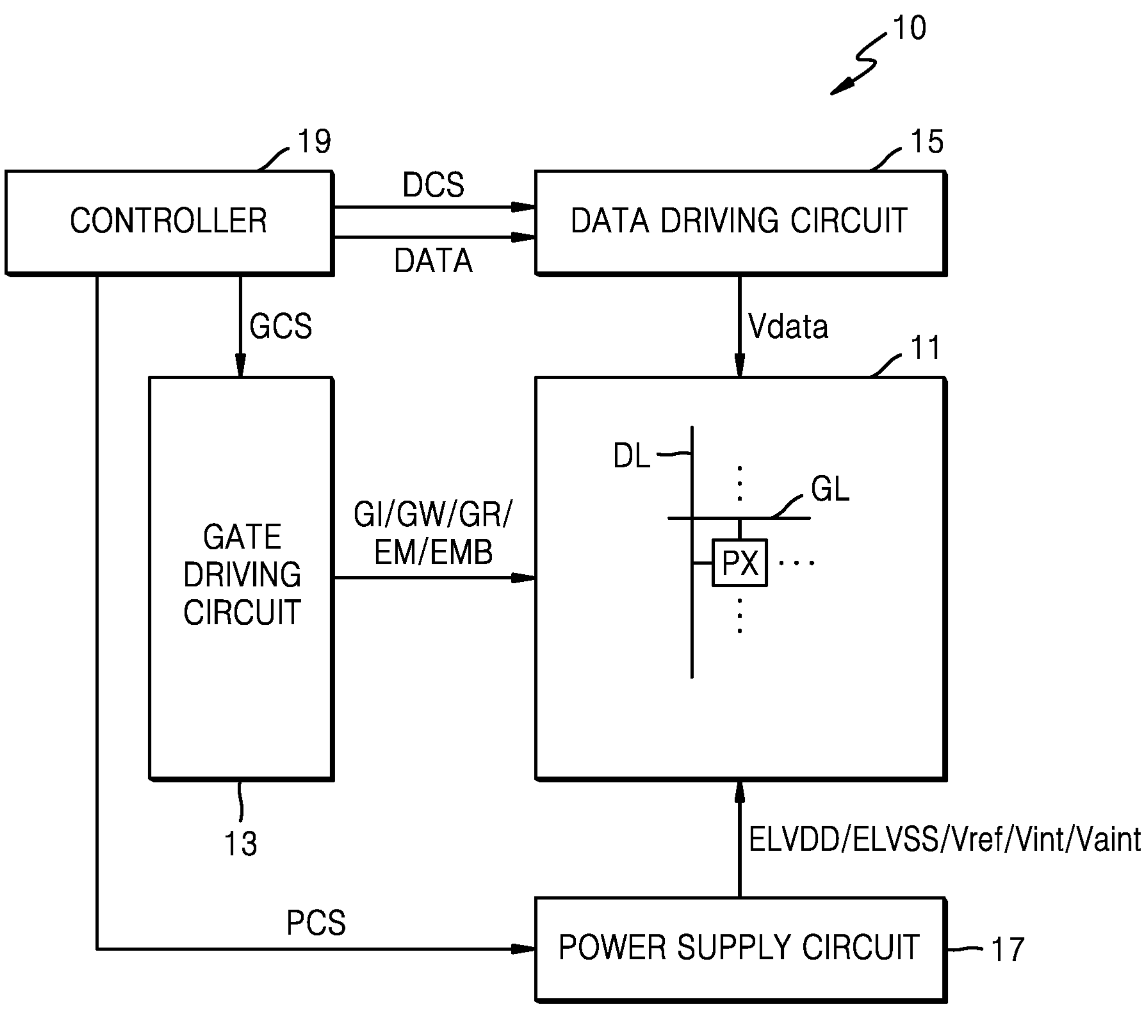
FIG. 2 is a schematic block diagram of the display apparatus according to an embodiment.
Figure 3A:
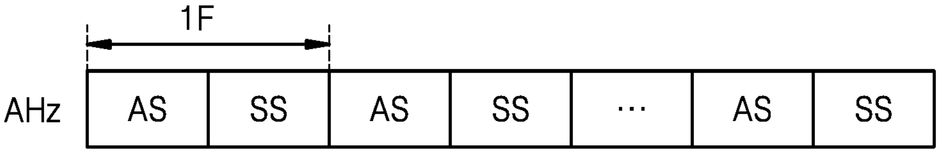
Figure 3B:
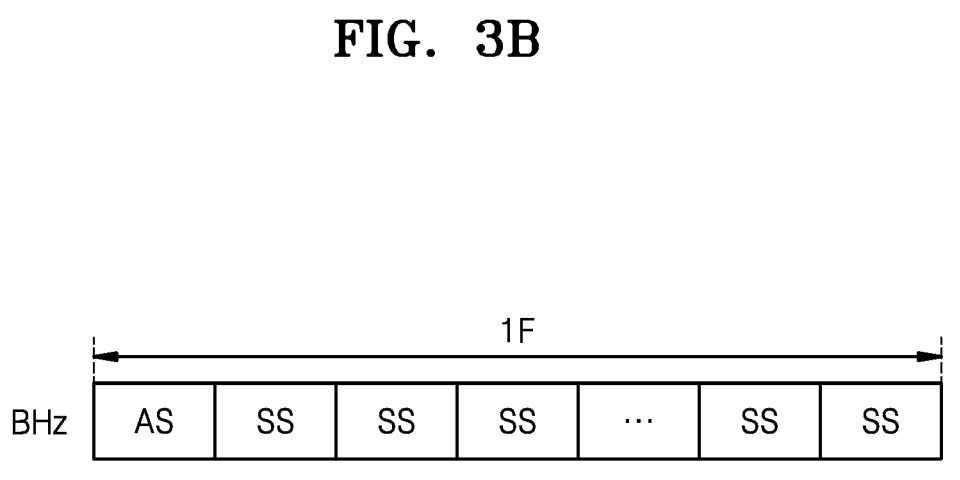

FIGS. 1A and 1B are schematic views of a display apparatus 10 according to an embodiment. FIG. 2 is a schematic block diagram of the display apparatus 10 according to an embodiment. FIGS. 3A and 3B are schematic conceptual diagrams for explaining a method of driving a display apparatus according to a driving frequency.

Referring to FIGS. 1A and 1B, the display apparatus 10 may include a display area DA displaying an image, and a peripheral area PA around the display area DA. The display area DA may be entirely surrounded by the peripheral area PA.

When viewing the display area DA in a plan view, the display area DA may have a rectangular shape. According to another embodiment, the display area DA may have a polygonal shape (e.g., a triangular shape, a pentagonal shape, or a hexagonal shape), a circular shape, an elliptical shape, an irregular shape, or the like. The display area DA may have a shape with round edge corners. According to an embodiment, the display apparatus 10 may have a display area DA having a shape in which a length in the x direction is greater than a length in the y direction, as shown in FIG. 1A. According to another embodiment, the display apparatus 10 may have a display area DA having a shape in which a length in the y direction is greater than a length in the x direction, as shown in FIG. 1B.

Referring to FIG. 2, the display apparatus 10 according to an embodiment may include a pixel portion 11, a gate driving circuit 13, a data driving circuit 15, a power supply circuit 17, and/or a controller 19.

The pixel portion 11 may be included in the display area DA. Various conductive lines for transmitting electric signals to be applied to the display area DA, external circuits electrically connected to pixel circuits, and pads to which a printed circuit board (PCB) or a driver integrated circuit (IC) chip is attached, may be located in the peripheral area PA. For example, the gate driving circuit 13, the data driving circuit 15, the power supply circuit 17, and the controller 19 may be included in the peripheral area PA.

As shown in FIG. 2, gate lines GL, data lines DL, and pixels PX connected thereto may be disposed in the display area DA. The pixels PX may be arranged in any of various configurations, such as a stripe configuration, a PenTile™ configuration, Diamond Pixel™ configuration, and a mosaic configuration, to display an image. Each of the pixels PX may include an organic light-emitting diode OLED as a display element (light-emitting device), and the organic light-emitting diode OLED may be connected to a pixel circuit. The pixel circuit may include transistors and at least one capacitor. Each of the pixels PX may emit, for example, red light, green light, blue light, or white light, via the organic light-emitting diode OLED. Each of the pixels PX may be connected to at least one corresponding gate line among the gate lines GL and a corresponding data line among the data lines DL.

Each of the gate lines GL may extend in the x direction (row direction) and may be connected to pixels PX located in the same row. Each of the gate lines GL may transfer a gate signal to the pixels PX in the same row. Each of the data lines DL may extend in the y direction (column direction) and may be connected to pixels PX located in the same column. Each of the data lines DL may transfer data signals to the pixels PX in the same column in synchronization with the gate signals.

According to an embodiment, the peripheral area PA may be a non-display area in which no pixels PX are disposed. According to another embodiment, a portion of the peripheral area PA may be implemented as the display area DA. For example, pixels PX may be disposed at at least one corner of the peripheral area PA and may overlap the gate driving circuit 13. Accordingly, a dead space may be reduced, and the display area DA may expand.

The gate driving circuit 13 may be connected to the gate lines GL, may generate gate signals according to a control signal GCS from the controller 19, and may sequentially supply the gate signals to the gate lines GL. The gate line GL may be electrically connected to a gate of a transistor included in a pixel PX. The gate signal may be a gate control signal for controlling turn-on and turn-off operations of a transistor with a gate connected to a gate line GL. The gate signal may be a square wave signal including an on-voltage for turning on a transistor and an off-voltage for turning off the transistor. According to an embodiment, the on voltage may be a high-level voltage (first-level voltage) or a low-level voltage (second-level voltage).

Although a pixel PX is illustrated as being connected to a gate line GL in FIG. 2, this is an example, and the pixel PX may be connected to two or more gate lines, and the gate driving circuit 13 may supply two or more gate signals of which on-voltages are applied at different timings, to gate lines corresponding to the two or more gate signals. For example, the pixel PX may be connected to first, second, third, fourth, fifth, and sixth gate lines, and the gate driving circuit 13 may apply a first gate signal GW, a second gate signal GI, a third gate signal GR, a fourth gate signal EM, and a fifth gate signal EMB to the first gate lines, the second gate lines, the third gate lines, the fourth gate lines, and the fifth gate lines, respectively.

The data driving circuit 15 may be connected to the data lines DL and may supply data signals to the data lines DL according to a control signal DCS from the controller 19. The data signal supplied to the data line DL may be supplied to the pixel PX to which the gate signal has been supplied. The data driving circuit 15 may convert input image data DATA input from the controller 19 and having a gray level into a data signal in the form of voltage or current. FIG. 2 illustrates an example in which the data driving circuit 15 outputs a data signal Vdata in the form of a voltage.

The power supply circuit 17 may generate voltages necessary for driving the pixels PX in response to a control signal PCS from the controller 19. The power supply circuit 17 may generate a first driving voltage ELVDD and a second driving voltage ELVSS and supply them to the pixels PX. The first driving voltage ELVDD may be a high-level voltage that is provided to a first electrode (e.g., a pixel electrode or an anode) of a display element included in the pixel PX. The second driving voltage ELVSS may be a low-level voltage that is provided to a second electrode (e.g., an opposite electrode or a cathode) of the display element included in the pixel PX. The power supply circuit 17 may generate a reference voltage Vref, a first initializing voltage Vint, and a second initializing voltage Vaint and supply them to the pixels PX.

A voltage level of the first driving voltage ELVDD may be higher than that of the second driving voltage ELVSS. A voltage level of a reference voltage Vref may be lower than that of the first driving voltage ELVDD. A voltage level of the first initializing voltage Vint may be lower than that of the second driving voltage ELVSS. A voltage level of the second initializing voltage Vaint may be higher than that of the first initializing voltage Vint. The voltage level of the second initializing voltage Vaint may be substantially equal to or higher than the voltage level of the second driving voltage ELVSS.

The controller 19 may generate control signals GCS, DCS, and PCS, based on signals input from the outside, and may supply them to the gate driving circuit 13, the data driving circuit 15, and/or the power supply circuit 17. The control signal GCS output to the gate driving circuit 13 may include clock signals and a gate start signal. The control signal DCS output to the data driving circuit 15 may include a source start signal and clock signals.

The display apparatus 10 may include a display panel, and the display panel may include a substrate. The pixels PX may be disposed in the display area DA of the substrate. A portion or the entirety of the gate driving circuit 13 may be directly formed in the peripheral area PA of the substrate during a process of forming transistors constituting the pixel circuit in the display area DA of the substrate. The data driving circuit 15, the power supply circuit 17, and the controller 19 may be formed as separate IC chips, respectively, or may be formed as a single IC chip, and may be disposed on a flexible printed circuit board (FPCB) electrically connected to a pad disposed on a side of the substrate. According to another embodiment, the data driving circuit 15, the power supply circuit 17, and the controller 17 may be directly disposed on the substrate by using a chip-on-glass (COG) or chip-on-plastic (COP) method.

According to an embodiment, the transistors included in the pixel circuit may be N-type oxide thin-film transistors. According to another embodiment, the transistors included in the pixel circuit may be P-type silicon thin-film transistors. According to another embodiment, some of the transistors included in the pixel circuit may be N-type oxide thin-film transistors, and others thereof may be P-type silicon thin-film transistors.

The N-type oxide thin-film transistor may be low temperature polycrystalline oxide (LTPO) thin-film transistor in which an active pattern (semiconductor layer) includes oxide. However, this is merely an example, and the N-type transistors are not limited thereto. For example, an active pattern (semiconductor layer) included in an N-type transistor may include an inorganic semiconductor (e.g., amorphous silicon or polysilicon) or an organic semiconductor. The P-type silicon thin-film transistor may be a low temperature poly-silicon (LTPS) thin-film transistor in which an active pattern (semiconductor layer) includes amorphous silicon, polysilicon, or the like.

The display apparatus 10 may support a variable refresh rate (VRR). A refresh rate may be a frequency at which a data signal is actually written to the driving transistor of the pixel PX, may also be referred to as a screen refresh rate or a screen reproduction rate, and may represent the number of image frames reproduced for a second. According to an embodiment, the refresh rate may be the output frequency of the gate driving circuit 13 and/or the data driving circuit 15. A frequency corresponding to the refresh rate may be a driving frequency. The display apparatus 10 may adjust the output frequency of the gate driving circuit 13 and the output frequency of the data driving circuit 15 corresponding thereto, according to the driving frequency. The display apparatus 10 supporting a VRR may operate while changing the driving frequency within the range of a maximum driving frequency to a minimum driving frequency. For example, in case that the refresh rate is about 60 Hz, a gate signal for writing a data signal from the gate driving circuit 13 may be supplied to each horizontal line (row) 60 times per second. The display apparatus 10 may display an image while changing the driving frequency according to the refresh rate.

According to the driving frequency, one frame 1F may include a first scan period AS and one or more second scan periods SS. For example, as shown in FIG. 3A, in the display apparatus 10 operating at a driving frequency of AHz, one frame 1F may include one first scan period AS and one second scan period SS. As shown in FIG. 3B, in the display apparatus 10 operating at a driving frequency of BHz lower than the driving frequency of AHz, one frame 1F may include one first scan period AS and two or more second scan periods SS. As the driving frequency decreases, the one frame 1F may become longer. According to another embodiment, the one frame 1F may include only one first scan period AS.

The first scan period AS may be defined as an address scan period during which a data signal is written to the pixel PX in response to the first gate signal GW, and the pixel PX may emit light according to the data signal. An operation of writing a data signal from the data line DL to the pixel PX may also be referred to as a data programming operation. The second scan period SS may be defined as a self-scan period during which the first gate signal GW is not applied to the pixel PX and a data signal is not written. During the second scan period SS, the data signal written to the first scan period AS may be maintained, and the pixel PX may emit light according to the maintained data signal. A length of the second scan period SS may be substantially equal to that of the first scan period AS.

Figure 4:
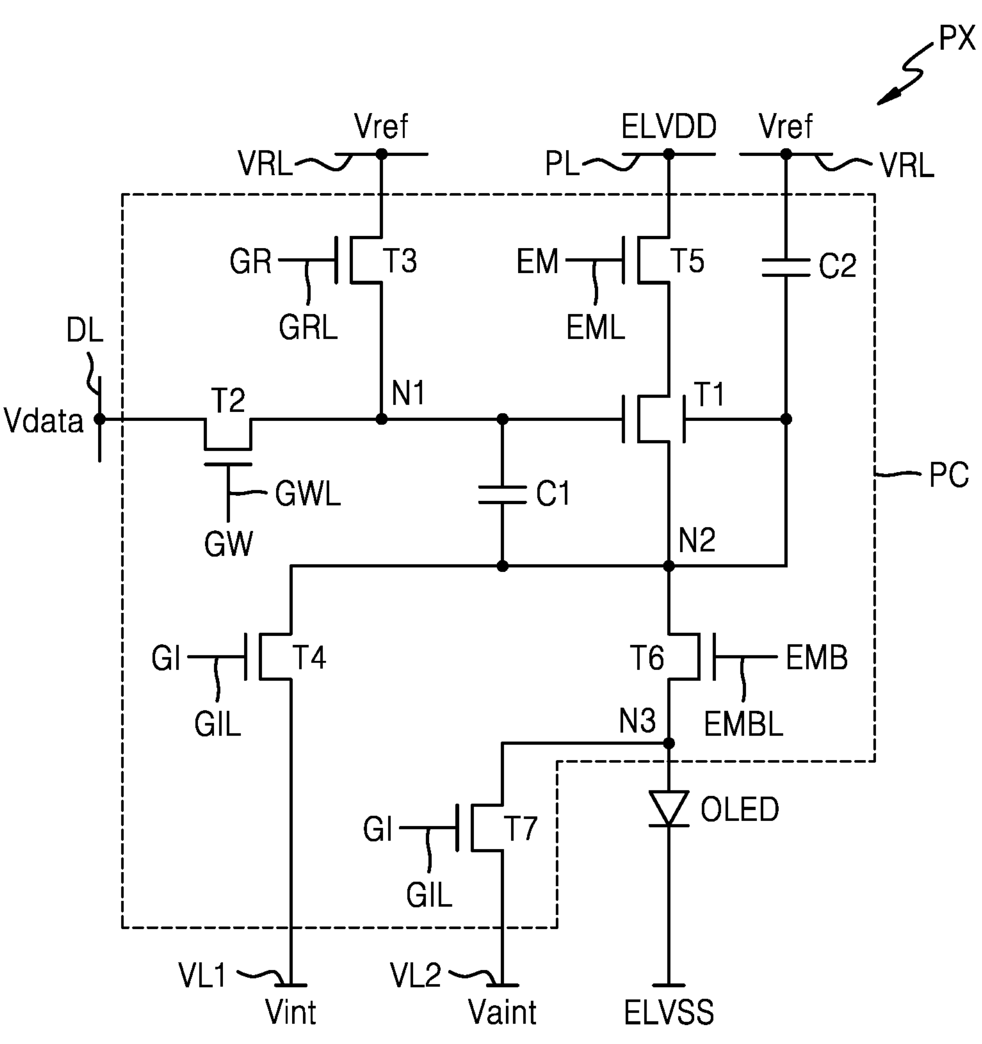
FIG. 4 is a schematic diagram of an equivalent circuit of a pixel according to an embodiment.
Figure 5:
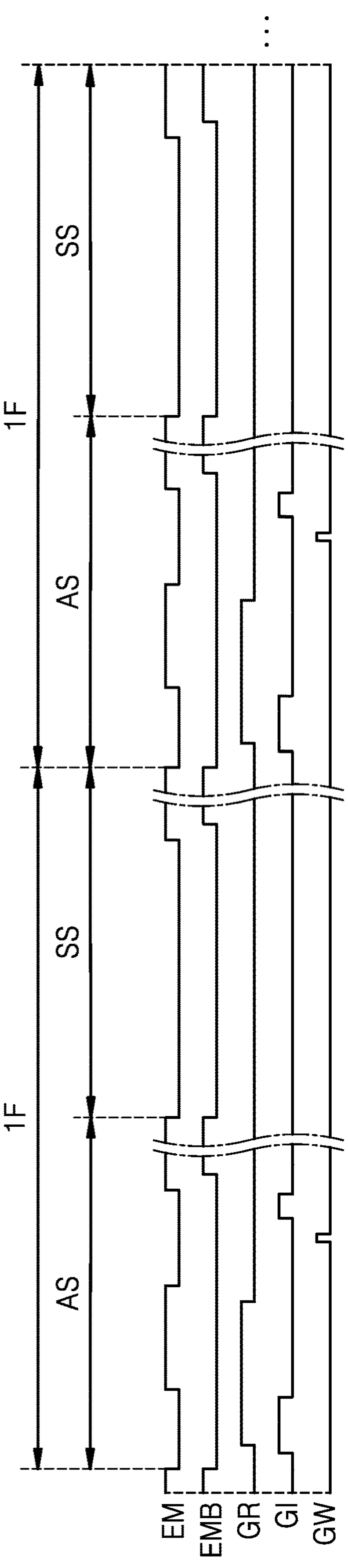
FIGS. 5 through 7 are schematic views illustrating signals for explaining an operation of the pixel of FIG. 4.
Figure 6:
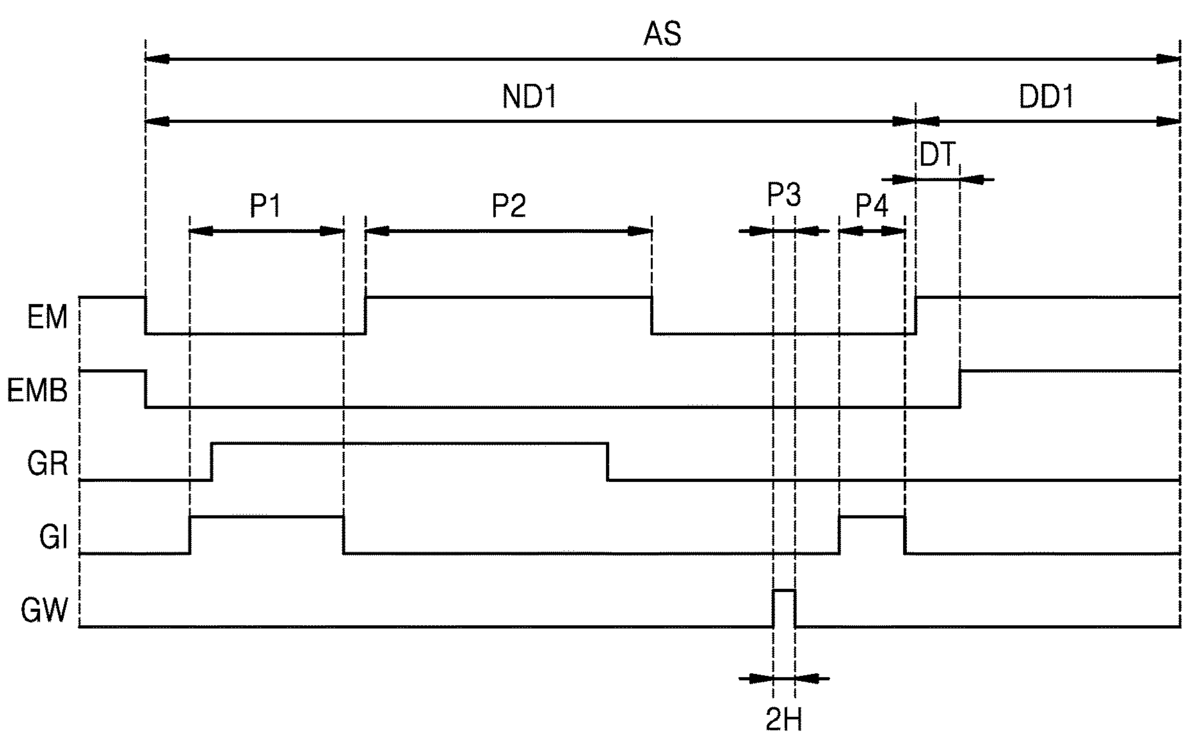
Figure 7:
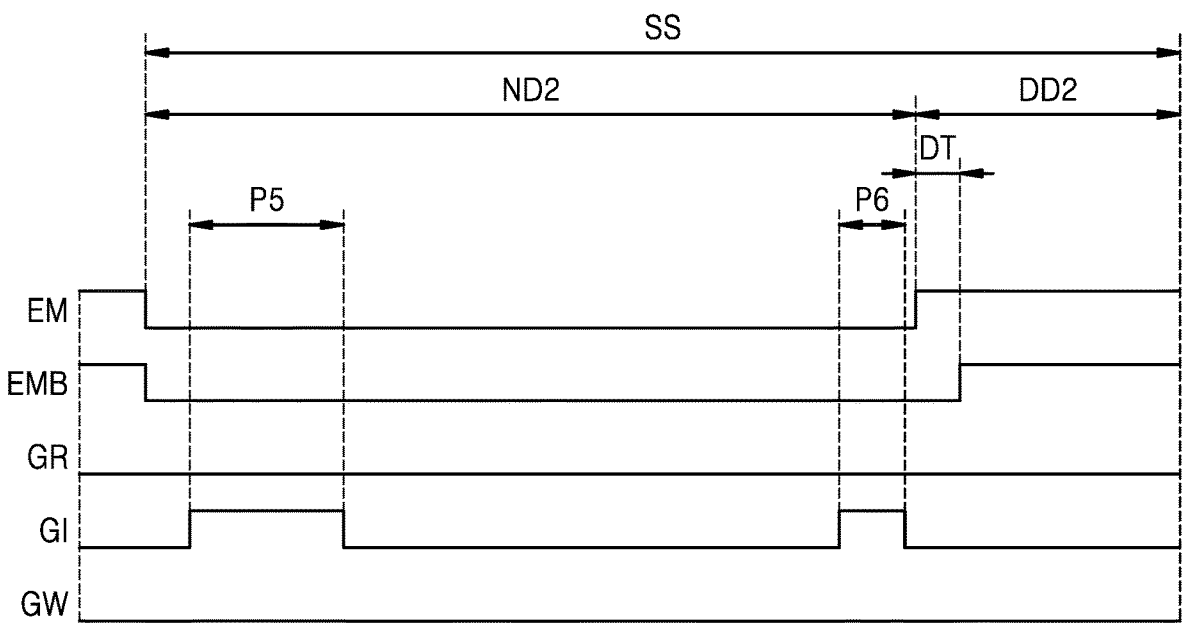

FIG. 4 is a schematic diagram of an equivalent circuit of a pixel PX according to an embodiment. FIGS. 5 to 7 are schematic views illustrating signals for explaining an operation of the pixel PX of FIG. 4.

Referring to FIG. 4, the pixel PX may include an organic light-emitting diode OLED as a display element, and a pixel circuit PC connected to the organic light-emitting diode OLED. The pixel circuit PC may include first, second, third, fourth, fifth, sixth, and seventh transistors T1, T2, T3, T4, T5, T6, and T7 and first and second capacitors C1 and C2. The first transistor T1 may be a driving transistor that outputs a driving current corresponding to a data signal, and the second to seventh transistors T2 to T7 may be switching transistors that transmit signals. A first terminal (first electrode) and a second terminal (second electrode) of each of the first to seventh transistors T1 to T7 may be a source or a drain according to respective voltages of the first terminal and the second terminal. For example, depending on the respective voltages of the first terminal and the second terminal, the first terminal may be a drain and the second terminal may be a source, or the first terminal may be a source and the second terminal may be a drain. A node to which a first gate of the first transistor T1 is connected may be defined as a first node N1, and a node to which a second terminal of the first transistor T1 may be defined as a second node N2.

The pixel PX may be connected to a first gate line GWL that transmits a first gate signal GW, a second gate line GIL that transmits a second gate signal GI, a third gate line GRL that transmits a third gate signal GR, a fourth gate line EML that transmits a fourth gate signal EM, a fifth gate line EMBL that transmits a fifth gate signal EMB, and a data line DL that transmits a data signal Vdata. Because light emission of the pixel PX is controlled by the fourth gate signal EM and the fifth gate signal EMB, the fourth gate signal EM and the fifth gate signal EMB may be referred to as emission control signals, and the fourth gate line EML and the fifth gate line EMBL may be referred to as emission control lines.

The pixel PX may also be connected to a driving voltage line PL that transmits a first driving voltage ELVDD, a reference voltage line VRL that transmits a reference voltage Vref, a first initializing voltage line VL1 that transmits a first initializing voltage Vint, and a second initializing voltage line VL2 that transmits a second initializing voltage Vaint.

The first transistor T1 may be connected between the driving voltage line PL and the second node N2. The first transistor T1 may include a gate, a first terminal, and a second terminal connected to the second node N2. The gate of the first transistor T1 may include a first gate connected to the first node N1 and a second gate connected to the second node. The first gate and the second gate may be disposed to face each other on different layers. For example, the first gate and the second gate of the first transistor T1 may be positioned to face each other with a semiconductor layer interposed therebetween.

The first gate of the first transistor T1 may be connected to the second terminal of the second transistor T2, the first terminal of the third transistor T3, and the first capacitor C1. The second gate of the first transistor T1 may be connected to the first terminal of the sixth transistor T6, the first capacitor C1, and the second capacitor C2. The first terminal of the first transistor T1 may be connected to the driving voltage line PL via the fifth transistor T5, and the second terminal may be connected to a pixel electrode of the organic light-emitting diode OLED via the sixth transistor T6. The second terminal of the first transistor T1 may be connected to the first terminal of the fourth transistor T4, the first terminal of the sixth transistor T6, the first capacitor C1, and the second capacitor C2. The first transistor T1 may receive the data signal Vdata according to a switching operation of the second transistor T2 and may control the amount of a driving current flowing to the organic light-emitting diode OLED.

The second transistor T2 (data write transistor) may be connected between the data line DL and the first gate of the first transistor T1. The second transistor T2 may include a gate connected to the first gate line GWL, a first terminal connected to the data line DL, and a second terminal connected to the first node N1. The second terminal of the second transistor T2 may be connected to the first gate of the first transistor T1, the first terminal of the third transistor T3, and the first capacitor C1. The second transistor T2 may be turned on by the first gate signal GW transmitted to the first gate line GWL to electrically connect the data line DL to the first node N1, and may transmit the data signal Vdata received via the data line DL to the first node N1.

The third transistor T3 (first initialization transistor) may be connected between the first gate of the first transistor T1 and the reference voltage line VRL. The third transistor T3 may include a gate connected to the third gate line GRL, a first terminal connected to the first node N1, and a second terminal connected to the reference voltage line VRL. The first terminal of the third transistor T3 may be connected to the first gate of the first transistor T1, the second terminal of the second transistor T2, and the first capacitor C1. The third transistor T3 may be turned on by the third gate signal GR received via the third gate line GRL to transmit the reference voltage Vref received via the reference voltage line VRL to the first node N1.

The fourth transistor T4 (second initialization transistor) may be connected between the first transistor T1 and the first initializing voltage line VL1. The fourth transistor T4 may include a gate connected to the second gate line GIL, a first terminal connected to the second node N2, and a second terminal connected to the first initializing voltage line VL1. The first terminal of the fourth transistor T4 may be connected to the second terminal of the first transistor T1, the first terminal of the sixth transistor T6, the first capacitor C1, and the second capacitor C2. The fourth transistor T4 may be turned on by the second gate signal GI received via the second gate line GIL to transmit the first initializing voltage Vint received via the first initializing voltage line VL1 to the second node N2.

The fifth transistor T5 (first emission control transistor) may be connected between the driving voltage line PL and the first transistor T1. The fifth transistor T5 may include a gate connected to the fourth gate line EML, a first terminal connected to the driving voltage line PL, and a second terminal connected to the first terminal of the first transistor T1. The fifth transistor T5 may be turned on or off according to the fourth gate signal EM received via the fourth gate line EML.

The sixth transistor T6 (second emission control transistor) may be connected between the first transistor T1 and the organic light-emitting diode OLED. The sixth transistor T6 may be connected between the second node N2 and the third node N3. The sixth transistor T6 may include a gate connected to the fifth gate line EMBL, a first terminal connected to the second node N2, and a second terminal connected to the third node N3. The first terminal of the sixth transistor T6 may be connected to the second terminal of the first transistor T1, the first terminal of the fourth transistor T4, the first capacitor C1, and the second capacitor C2. The second terminal of the sixth transistor T6 may be connected to the first terminal of the seventh transistor T7 and the pixel electrode of the organic light-emitting diode OLED. The sixth transistor T6 may be turned on or off according to the fifth gate signal EMB received via the fifth gate line EMBL.

The seventh transistor T7 (third initialization transistor) may be connected between the organic light-emitting diode OLED and the second initializing voltage line VL2. The seventh transistor T7 may be connected between the sixth transistor T6 and the second initializing voltage line VL2. The seventh transistor T7 may include a gate connected to the second gate line GIL, a first terminal connected to the third node N3, and a second terminal connected to the second initializing voltage line VL2. The first terminal of the seventh transistor T7 may be connected to the second terminal of the sixth transistor T6 and the pixel electrode of the organic light-emitting diode OLED. The seventh transistor T7 may be turned on by the second gate signal GI received via the second gate line GIL to transmit the second initializing voltage Vaint received via the second initializing voltage line VL2 to the third node N3.

The first capacitor C1 may be connected between the first gate of the first transistor T1 and the second terminal of the first transistor T1. A first electrode of the first capacitor C1 may be connected to the first node N1, and a second electrode thereof may be connected to the second node N2. The first electrode of the first capacitor C1 may be connected to the first gate of the first transistor T1, the second terminal of the second transistor T2, and the first terminal of the third transistor T3. The second electrode of the first capacitor C1 may be connected to the second terminal and the second gate of the first transistor T1, a second electrode of the second capacitor C2, the first terminal of the fourth transistor T4, and the first terminal of the sixth transistor T6. The first capacitor C1, which is a storage capacitor, may store a voltage corresponding to a threshold voltage of the first transistor T1 and the data signal Vdata.

The second capacitor C2 may be connected between the reference voltage line VRL and the second node N2. A first electrode of the second capacitor C2 may be connected to the reference voltage line VRL. The second electrode of the second capacitor C2 may be connected to the second terminal and the second gate of the first transistor T1, the second electrode of the first capacitor C1, the first terminal of the fourth transistor T4, and the first terminal of the sixth transistor T6. A capacitance of the first capacitor C1 may be greater than that of the second capacitor C2.

The organic light-emitting diode OLED may be connected to the first transistor T1 through the sixth transistor T6. The organic light-emitting diode OLED may include the pixel electrode (anode) connected to the third node N3 and an opposite electrode (cathode) facing the pixel electrode, and the opposite electrode may receive a second driving voltage ELVSS. The opposite electrode may be a common electrode that is common to pixels PX.

According to an embodiment, as shown in FIG. 5, a pixel PX may operate in one first scan period AS and one second scan period SS during one frame 1F. Most of the first scan period AS and the second scan period SS may be an emission period. Voltage levels of the first gate signal GW, the second gate signal GI, the third gate signal GR, the fourth gate signal EM, and the fifth gate signal EMB applied to the pixel PX in the first scan period AS and the second scan period SS may be different.

As shown in FIG. 6, the first scan period AS may include a first non-emission period ND1 in which the pixel PX does not emit light and a first emission period DD1 in which the pixel PX emits light. The first non-emission period ND1 may include a first period P1, a second period P2, a third period P3, and a fourth period P4.

Each of the first gate signal GW, the second gate signal GI, the third gate signal GR, the fourth gate signal EM, and the fifth gate signal EMB may have a high-level voltage (first-level voltage) in some periods, and may have a low-level voltage (second-level voltage) in some periods. The high-level voltage may be an on voltage for turning on a transistor, and the low-level voltage may be an off voltage for turning off a transistor.

The first period P1 may be a first initialization period for initializing the first node N1 and the second node N2 to which the first transistor T1 is connected, and the third node N3 to which the pixel electrode of the organic light-emitting diode OLED is connected. During the first period P1, the second gate signal GI of an on voltage may be supplied (applied) to the second gate line GIL. The third gate signal GR of an on voltage may be supplied to the third gate line GRL. The first gate signal GW, the fourth gate signal EM, and the fifth gate signal EMB may be supplied as off voltages. An on-voltage application timing of the third gate signal GR may be delayed a time period (e.g., a predetermined or selectable time period) from an on-voltage application timing of the second gate signal GI.

The fourth transistor T4 and the seventh transistor T7 may be turned on by the second gate signal GI, and the third transistor T3 may be turned on by the third gate signal GR. The second node N2, e.g., the second terminal of the first transistor T1, may be initialized to the first initializing voltage Vint by the turned-on fourth transistor T4. The first node N1, e.g., the first gate of the first transistor T1, may be initialized to the reference voltage Vref by the turned-on third transistor T3. The third node N3, e.g., the pixel electrode of the organic light-emitting diode OLED, may be initialized to the second initializing voltage Vaint by the turned-on seventh transistor T7. The first capacitor C1 and the second capacitor C2 may be initialized by the turned-on third transistor T3 and the turned-on fourth transistor T4.

The second period P2 may be a compensation period for compensating for the threshold voltage of the first transistor T1. In the second period P2, the third gate signal GR of an on voltage may be supplied to the third gate line GRL, and the fourth gate signal EM may be supplied to the fourth gate line EML. The first gate signal GW, the second gate signal GI, and the fifth gate signal EMB may be supplied as off voltages.

The third transistor T3 may be turned on by the third gate signal GR, and the fifth transistor T5 may be turned on by the fourth gate signal EM. Accordingly, the first transistor TI may be turned on by supplying the reference voltage Vref to the first node N1 and supplying the first driving voltage ELVDD to the first terminal of the first transistor T1. In case that a voltage of the second terminal of the first transistor T1 reaches to substantially a difference (Vref−Vth) between the reference voltage Vref and a threshold voltage Vth of the first transistor T1, the first transistor T1 may be turned off. The threshold voltage Vth of the first transistor T1 may be compensated for by storing a voltage corresponding to the threshold voltage Vth of the first transistor T1 in the first capacitor C1.

The third period P3 may be a writing period in which a data signal is supplied to a pixel. In the third period P3, the first gate signal GW of an on voltage may be supplied to the first gate line GWL. According to an embodiment, the on voltage of the first scan signal GW may have a width of about 2 horizontal periods 2H. The second gate signal GI, the third gate signal GR, the fourth gate signal EM, and the fifth gate signal EMB may be supplied as off voltages.

The second transistor T2 may be turned on by the first gate signal GW, and the turned-on second transistor T2 may transmit the data signal Vdata from the data line DL to the first node N1, e.g., to the first gate of the first transistor T1. Accordingly, the voltage of the first node N1 may be changed from the reference voltage Vref to a voltage corresponding to the data signal Vdata. In this case, the voltage of the second node N2 may also be changed in correspondence with a variation in the voltage of the first node N1. The voltage of the second node N2 may be a voltage $Vref-Vth+\alpha\times(Vdata-Vref)$ changed according to a capacitance ratio $\alpha=C1/(C1+C2)$ between the first and second capacitors C1 and C2. Thus, the first capacitor C1 may be charged with a voltage corresponding to the threshold voltage Vth of the first transistor T1 and the data signal Vdata.

The fourth period P4 may be a second initialization period for initializing the second node N2 to which the second terminal of the first transistor T1 is connected, and the third node N3 to which the pixel electrode of the organic light-emitting diode OLED is connected, prior to the first emission period DD1 after the data writing. During the fourth period P4, the second gate signal GI of an on voltage may be supplied (applied) to the second gate line GIL. The first gate signal GW, the third gate signal GR, the fourth gate signal EM, and the fifth gate signal EMB may be supplied as off voltages.

The fourth transistor T4 and the seventh transistor T7 may be turned on by the second gate signal GI. The first initializing voltage Vint may be transmitted to the second terminal of the first transistor T1 by the turned-on fourth transistor T4. The second initializing voltage Vaint may be transmitted to the pixel electrode of the organic light-emitting diode OLED by the turned-on seventh transistor T7.

When displaying a low grayscale (for example, grayscale values of 11 to 31), a change in luminance may occur or may be generated due to a voltage remaining in the organic light-emitting diode OLED. By initializing the third node N3 during the fourth period P4 after data writing and before pixel emission, a change in the luminance of the organic light-emitting diode OLED may be minimized when displaying a low grayscale, thereby further improving an image quality. A voltage change time period of the pixel electrode may be minimized using a different voltage from the first initializing voltage Vint, for example, a higher voltage than the first initializing voltage Vint, as the second initializing voltage Vint, leading to a minimization of a screen flicker phenomenon.

The first emission period DD1 may be a period in which the organic light-emitting diode OLED emits light. In the first emission period DD1, the fourth gate signal EM of an on voltage may be supplied to the fourth gate line EML, and the fifth gate signal EMB of an on voltage may be supplied to the fifth gate line EMBL. The first gate signal GW, the second gate signal GI, and the third gate signal GR may be off voltages.

During the first emission period DD1, the fifth transistor T5 may be turned on by the fourth gate signal EM, and the first driving voltage ELVDD may be supplied to the first terminal of the first transistor T1 by the turned-on fifth transistor T5. The first transistor T1 may output a driving current $Id \propto (Vgs-Vth)^2$ having a magnitude corresponding to a voltage corresponding to the data signal Vdata stored in the first capacitor C1, e.g., a voltage Vgs−Vth obtained by subtracting the threshold voltage Vth of the first transistor T1 from a gate-source voltage Vgs. The driving current $Id \propto (Vgs-Vth)^2$ may flow in the organic light-emitting diode OLED through the sixth transistor T6 turned on by the fifth gate signal EMB, and the organic light-emitting diode OLED may emit light with a luminance corresponding to the magnitude of the driving current.

As shown in FIG. 7, the second scan period SS may include a second non-emission period ND2 in which the pixel PX does not emit light and a second emission period DD2 in which the pixel PX emits light. The second non-emission period ND2 may include a fifth period P5 and a sixth period P6. The second scan period SS may not include a compensation period corresponding to the second period P2 of the first scan period AS and a writing period corresponding to the third period P3 of the first scan period AS.

Each of the first gate signal GW, the second gate signal GI, the third gate signal GR, the fourth gate signal EM, and the fifth gate signal EMB may have a high-level voltage (first-level voltage) in some periods, and may have a low-level voltage (second-level voltage) in some periods.

The fifth period P5 may be a third initialization period for initializing the third node N3 to which the pixel electrode of the organic light-emitting diode OLED is connected. The fifth period P5 may correspond to the first period P1 of the first scan period AS. During the fifth period P5, the second gate signal GI of an on voltage may be supplied to the second gate line GIL. The first gate signal GW, the third gate signal GR, the fourth gate signal EM, and the fifth gate signal EMB may be supplied as off voltages. The fourth transistor T4 and the seventh transistor T7 may be turned on by the second gate signal GI. The second node N2, e.g., the second terminal of the first transistor T1, may be initialized to the first initializing voltage Vint by the turned-on fourth transistor T4. The third node N3, e.g., the pixel electrode of the organic light-emitting diode OLED, may be initialized to the second initializing voltage Vaint by the turned-on seventh transistor T7.

The sixth period P6 may be a fourth initialization period for initializing the third node N3 to which the pixel electrode of the organic light-emitting diode OLED is connected, prior to the second emission period DD2. The sixth period P6 may correspond to the fourth period P4 of the first scan period AS. During the sixth period P6, the second gate signal GI of an on voltage may be supplied to the second gate line GIL. The first gate signal GW, the third gate signal GR, the fourth gate signal EM, and the fifth gate signal EMB may be supplied as off voltages. The fourth transistor T4 and the seventh transistor T7 may be turned on by the second gate signal GI. The second node N2, e.g., the second terminal of the first transistor T1, may be initialized to the first initializing voltage Vint by the turned-on fourth transistor T4. The third node N3, e.g., the pixel electrode of the organic light-emitting diode OLED, may be initialized to the second initializing voltage Vaint by the turned-on seventh transistor T7.

The second emission period DD2 may be a period in which the organic light-emitting diode OLED emits light. The second emission period DD2 may correspond to the first emission period DD1 of the first scan period AS. In the second emission period DD2, the fourth gate signal EM of an on voltage may be supplied to the fourth gate line EML, and the fifth gate signal EMB of an on voltage may be supplied to the fifth gate line EMBL. The first gate signal GW, the second gate signal GI, and the third gate signal GR may be off voltages.

During the second emission period DD2, the fifth transistor T5 may be turned on by the fourth gate signal EM, and the first driving voltage ELVDD may be supplied to the first terminal of the first transistor T1 by the turned-on fifth transistor T5. The first transistor T1 may output a driving current having a magnitude corresponding to a voltage stored in the first capacitor (C1), e.g., the data signal Vdata, the driving current may flow in the organic light-emitting diode OLED through the sixth transistor T6 turned on by the fifth gate signal EMB, and the organic light-emitting diode OLED may emit light with a luminance corresponding to the magnitude of the driving current. The data signal Vdata stored in the first capacitor C1 in the second emission period DD2 may be a data signal supplied to the pixel and maintained in the third period P3 of the first scan period AS.

In case that the first initializing voltage Vint and the second initializing voltage Vaint are applied to the second node N2 and the third node N3, e.g., the first terminal and the second terminal of the sixth transistor T6, in the fourth period P4 and the sixth period P6, and, in this state, the on voltages of the fourth gate signal EM and the fifth gate signal EMB are applied at the same timing, the voltage of the third node N3 may be changed to a voltage lower than the second initializing voltage Vaint due to a voltage difference between the first terminal and the second terminal of the sixth transistor T6. Accordingly, by initializing the third node N3 with the second initializing voltage Vaint higher than the first initializing voltage Vint, minimization of the flickering phenomenon may be reduced. According to an embodiment, in each of the first emission period DD1 and the second emission period DD2, the on voltage application timing of the fifth gate signal EMB may be delayed a time period DT (e.g., a predetermined or selectable time period) from the on voltage application timing of the fourth gate signal EM. After the on voltage of the fourth gate signal EM is first applied to increase the voltage level of the voltage applied to the first terminal of the sixth transistor T6, a voltage difference between the first terminal and the second terminal of the six-transistor T6 may be reduced by applying the on voltage of the fifth gate signal EMB, thereby minimizing voltage fluctuations of the third node N3 and also minimizing the flickering phenomenon.

According to an embodiment, by initializing the pixel electrode twice in the second scan period SS similar to the first scan period AS, even in case that one or more second scan periods SS are included in one frame, a luminance deviation according to a driving speed may be minimized.

In the above-described embodiment, by performing threshold voltage compensation of and data writing to a driving transistor once for each operation during one frame, the first gate signal GW and the third gate signal GR may be supplied only during the first scan period AS. The second gate signal GI, the fifth gate signal EM, and the sixth gate signal EMB may be supplied in each of the first scan period AS and the second scan period SS. In other words, during one frame, the period of each of the first gate signal GW and the third gate signal GR may be one cycle, and the period of each of the second gate signal GI, the fourth gate signal EM, and the fifth gate signal EMB may be two cycles. The fourth gate signal EM may be supplied in the compensation period P2 of the first scan period AS, and may not be supplied in a period corresponding to the compensation period P2 in the second scan period SS. However, considering the fourth gate signal EM as an emission control signal, the fourth gate signal EM may be supplied in the first emission period DD1 of the first scan period AS and the second emission period DD2 of the second scan period SS, and thus may be interpreted as having a period of two cycles during one frame.

The first gate signal GW may be supplied to a pixel at intervals of one cycle during one frame by being supplied to the pixel only once in the third period P3 of the first scan period AS. The second gate signal GI may be supplied to a pixel at intervals of two cycles in one frame by being supplied to the pixel twice in the first period P1 and the fourth period P4 of the first scan period AS and twice in the fifth period P5 and the sixth period P6 of the second scan period SS. The third gate signal GR may be supplied to a pixel at intervals of one cycle in one frame by being consecutively supplied to the pixel only once in the first period P1 and the second period P2 of the first scan period AS. The fourth gate signal EM may be supplied to a pixel at intervals of two cycles in one frame by being supplied to the pixel once in the first emission period DD1 of the first scan period AS and once in the second emission period DD2 of the second scan period SS. A case where the fourth gate signal EM is supplied in the second period P2 of the first scan period AS will be omitted herein. The fifth gate signal EMB may be supplied to a pixel at intervals of two cycles in one frame by being supplied to the pixel once in the first emission period DD1 of the first scan period AS and once in the second emission period DD2 of the second scan period SS.

According to another embodiment, the fourth period P4 of the first scan period AS and the sixth period P6 of the second scan period SS may be omitted. In this case, the second gate signal GI may be supplied to a pixel at intervals of two cycles in one frame by being supplied to the pixel once in the first period P1 of the first scan period AS and once in the fifth period P5 of the second scan period SS.

FIGS. 5 to 7 illustrate the fourth gate signal EM being applied to a pixel at intervals of two cycles in one frame in an embodiment where one frame includes one first scan period AS and one second scan period SS. According to another embodiment, as shown in FIG. 3B, in an embodiment where one frame includes one first scan period AS and two or more second scan periods SS, the third gate signal GR may be understood as being supplied to a pixel at intervals of one cycle in one frame, and the fourth gate signal EM may be understood as being supplied to the pixel at intervals of three cycles or more in one frame.

Figure 8:
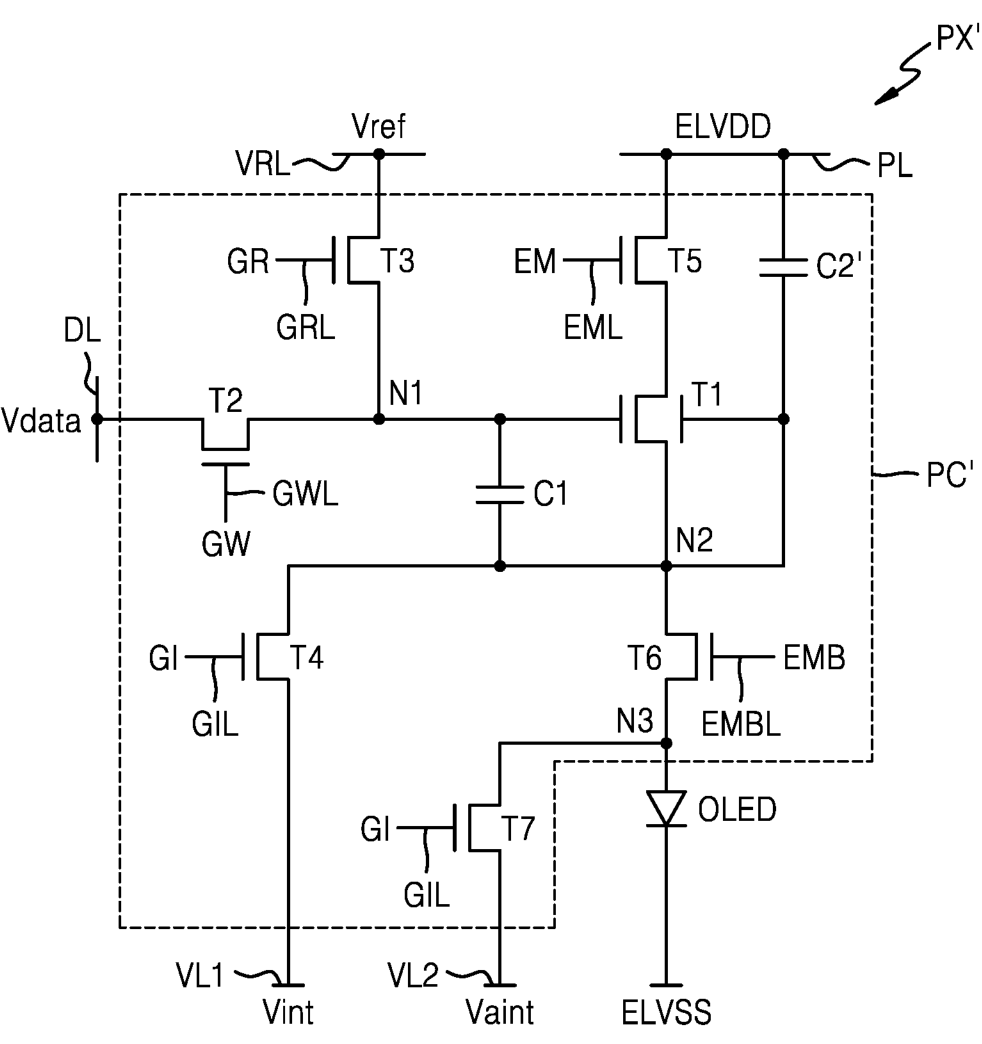
FIG. 8 is a schematic diagram of an equivalent circuit of a pixel according to a comparative example.
Figure 9:
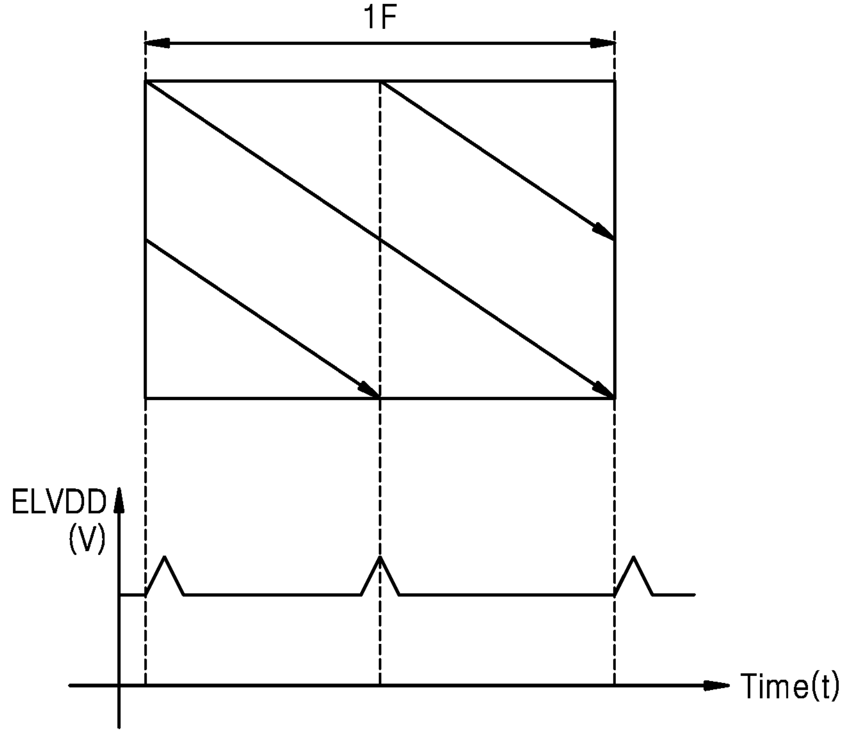
FIG. 9 is a diagram schematically illustrating a change in a first driving voltage as a fourth gate signal is applied to the pixel shown in FIG. 8 during one frame.

FIG. 8 is a schematic diagram of an equivalent circuit of a pixel PX' according to a comparative example. FIG. 9 is a diagram schematically illustrating a change in the first driving voltage ELVDD as the fourth gate signal EM is applied to the pixel PX' shown in FIG. 8 during one frame.

In a pixel circuit PC' of the pixel PX' shown in FIG. 8, a second capacitor C2' may be connected between the driving voltage line PL and the second node N2. As shown in FIGS. 6 and 7, the fourth gate signal EM may be sequentially applied to the display area DA from a first line to a last line during one frame. In case that the fourth gate signal EM is applied as an on voltage, the first driving voltage ELVDD may fall, and, in case that the fourth gate signal EM is applied as an off voltage, the first driving voltage ELVDD may rise. In case that the fourth gate signal EM is applied as an on-voltage to a pixel PX' displaying a white color, the drop of the first driving voltage ELVDD may be large, and, in case that the fourth gate signal EM is applied as an on-voltage to a pixel PX' displaying a black color, the drop of the first driving voltage ELVDD may be small.

FIG. 9 illustrates a variation of the first driving voltage ELVDD over time t measured for the entire display area DA as the fourth gate signal EM is applied at intervals of two cycles during one frame. As shown in FIG. 9, as the fourth gate signal EM is applied at intervals of two cycles during one frame, a voltage variation of the first driving voltage ELVDD may appear in the middle of one frame. Accordingly, each pixel PX' of the display area DA may be affected by the fall and rise of the first driving voltage ELVDD according to an operating state, and mura may occur in an image. For example, in case that the first driving voltage ELVDD has a falling slope, a pixel PX' in the second half of the second period P2, e.g., before a transition of the third gate signal GR from the on voltage to the off voltage, may be displayed as a dark portion due to a fall in the voltage of the second terminal of the first transistor T1 due to a voltage change of the second capacitor C2'. In case that the first driving voltage ELVDD has a rising slope, a pixel PX' before the third period P3, e.g., before the fourth gate signal EM is an off voltage and before the first gate signal GW is applied as an on voltage, may be displayed as a bright portion due to a rise in the voltage of the second terminal of the first transistor T1 due to a voltage change of the second capacitor C2'.

In the pixel PX according to an embodiment, the second capacitor C2 may be connected to the reference voltage line VRL instead of the driving voltage line PL, and the third gate signal GR may be provided at intervals of one cycle during one frame, and thus the voltage of the reference voltage line VRL to which the third transistor T3 is connected may not change in the middle of one frame, leading to miniaturization of mura occurrence.

Figure 10:
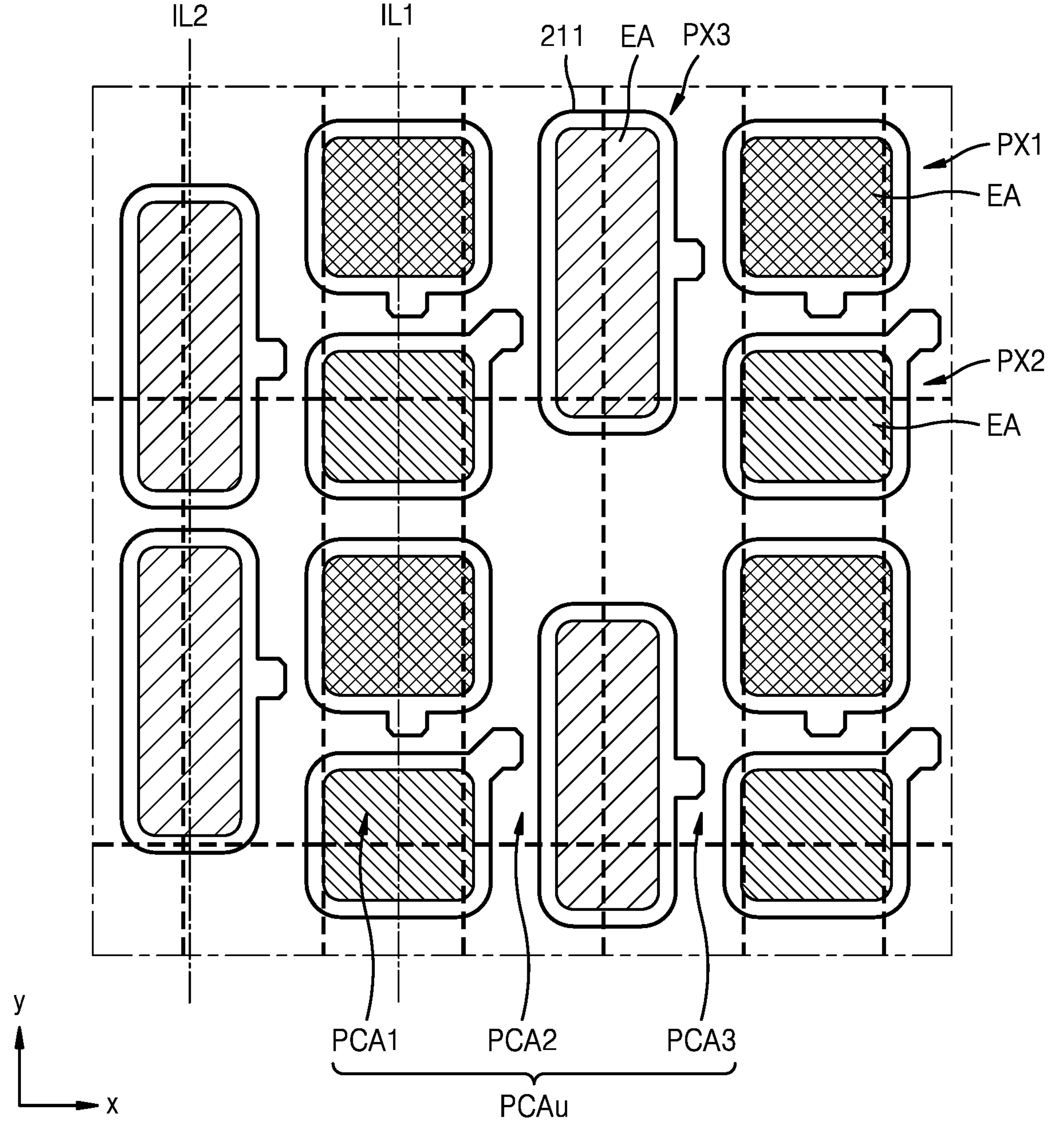
FIG. 10 is a schematic view of a layout of emission areas of pixels according to an embodiment.

FIG. 10 is a schematic view of a layout of emission areas of pixels according to an embodiment.

Referring to FIG. 10, the display area DA defined on a substrate 100 may include pixel areas where rows and columns intersect each other and pixel circuits are disposed. According to an embodiment, a unit pixel area including two or more pixel areas adjacent to each other in an x direction may be defined. For example, a unit pixel area PCAu may include a first pixel area PCA1, a second pixel area PCA2, and/or a third pixel area PCA3 adjacent to one another in the x direction.

Pixels PX disposed in the display area DA may include a first pixel PX1 emitting light in a first color, a second pixel PX2 emitting light in a second color, and a third pixel PX3 emitting light in a third color. For example, the first pixel PX1 may be a red pixel, the second pixel PX2 may be a green pixel, and the third pixel PX3 may be a blue pixel. The first pixel PX1, the second pixel PX2, and the third pixel PX3 may be repeated according to a certain pattern in the x direction and the y direction. Each of the first pixel PX1, the second pixel PX2, and the third pixel PX3 may include a pixel circuit and an organic light-emitting diode OLED electrically connected to the pixel circuit.

The first pixel area PCA1 may be an area where the pixel circuit of the first pixel PX1 is disposed. The second pixel area PCA2 may be an area where the pixel circuit of the second pixel PX2 is disposed. The third pixel area PCA3 may be an area where the pixel circuit of the third pixel PX3 is disposed. The organic light-emitting diode OLED may be disposed over the pixel circuit. The organic light-emitting diode OLED may be disposed directly over the pixel circuit connected to the organic light-emitting diode OLED to overlap the connected pixel circuit, or may be disposed to overlap a portion of a pixel circuit of another pixel disposed in a column or row offset from and adjacent to the connected pixel circuit.

FIG. 10 illustrates a pixel electrode 211 and an emission area EA of each of the first pixel PX1, the second pixel PX2, and the third pixel PX3. In the emission area EA, an emission layer of the organic light-emitting diode OLED may be disposed. The emission area EA may be defined by an opening of a pixel defining layer which will be described below. Because the emission layer is disposed on the pixel electrode 211, an arrangement of the emission areas shown in FIG. 10 may represent an arrangement of pixel electrodes or an arrangement of pixels.

The emission area EA may have a shape such as a polygon (such as a rectangle or an octagon), a circle, or an oval. Examples of the polygon may include a shape of which corners (vertexes) are rounded.

As shown in FIG. 10, the emission area EA of the first pixel PX1 and the emission area EA of the second pixel PX2 may be disposed adjacent to each other in the y direction, and the emission area EA of the third pixel PX3 may be disposed adjacent to the emission area EA of the first pixel PX1 and the emission area EA of the second pixel PX2 in the x direction. Accordingly, the emission area EA of the first pixel PX1 and the emission area EA of the second pixel PX2 may be alternately arranged in the y direction along an imaginary straight line IL1, and the emission area EA of the third pixel PX3 may be repeatedly arranged in the y direction along an imaginary straight line IL2.

Respective lengths of the emission area EA of the first pixel PX1, the emission area EA of the second pixel PX2, and the emission area EA of the third pixel PX3 in the x direction may be the same as or different from those in the y direction. For example, the emission area EA of the first pixel PX1 and the emission area EA of the second pixel PX2 may have square shapes, and the emission area EA of the third pixel PX3 may have rectangular shapes having longer sides in the y direction. A length of the emission area EA of the third pixel PX3 may be substantially equal to or greater than a sum of the emission area EA of the first pixel PX1 in the y direction and the emission area EA of the second pixel PX2 in the y direction.

The emission area EA of the first pixel PX1, the emission area EA of the second pixel PX2, and the emission area EA of the third pixel PX3 may have the same areas (sizes) or different areas (sizes). According to an embodiment, the emission area EA of the third pixel PX3 may have a larger area than the emission area EA of the first pixel PX1. The emission area EA of the third pixel PX3 may have a larger area than the emission area EA of the second pixel PX2. The emission area EA of the first pixel PX1 may have an area that is substantially equal to that of the emission area EA of the second pixel PX2.

Figure 12:
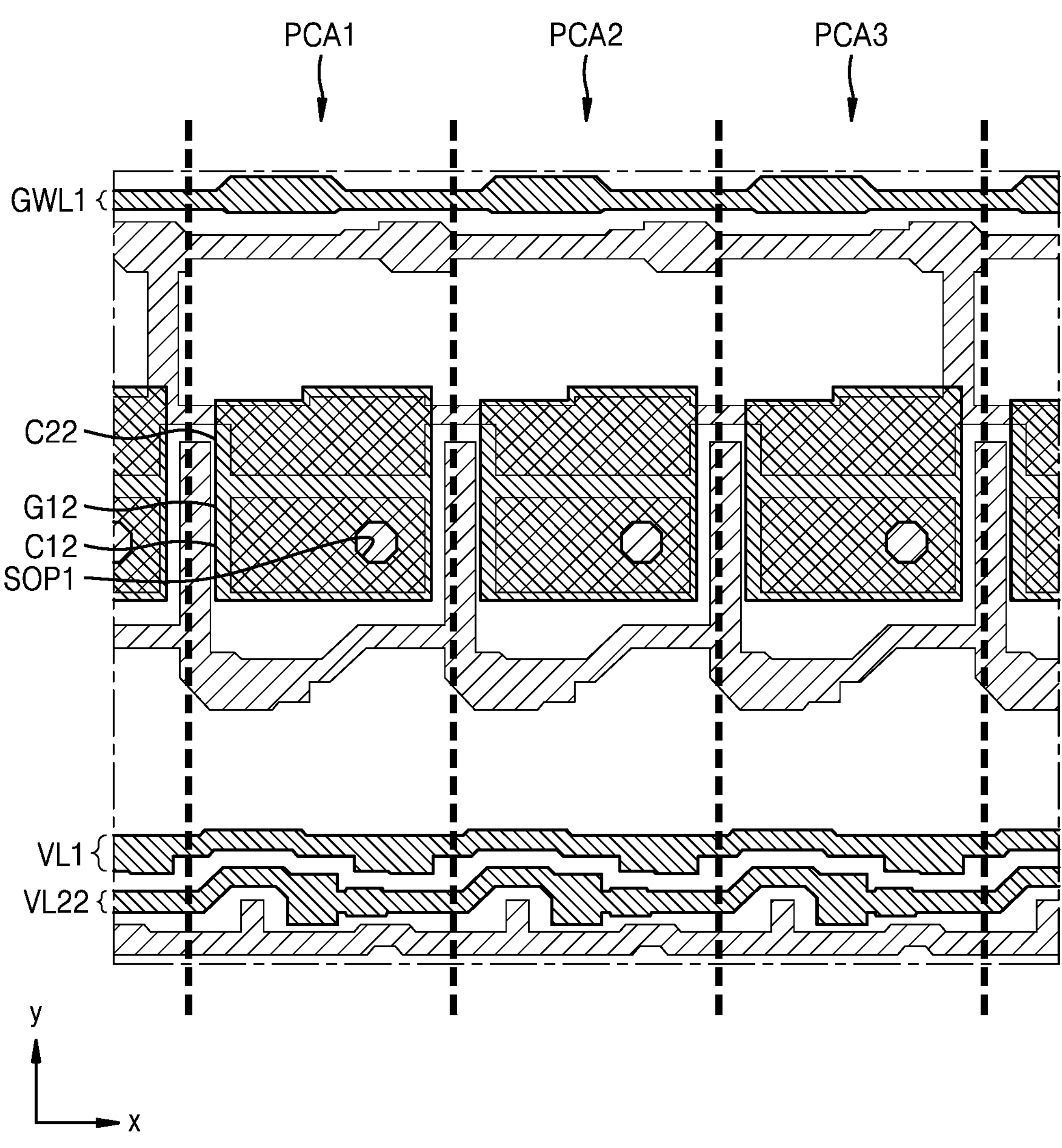
Figure 13:
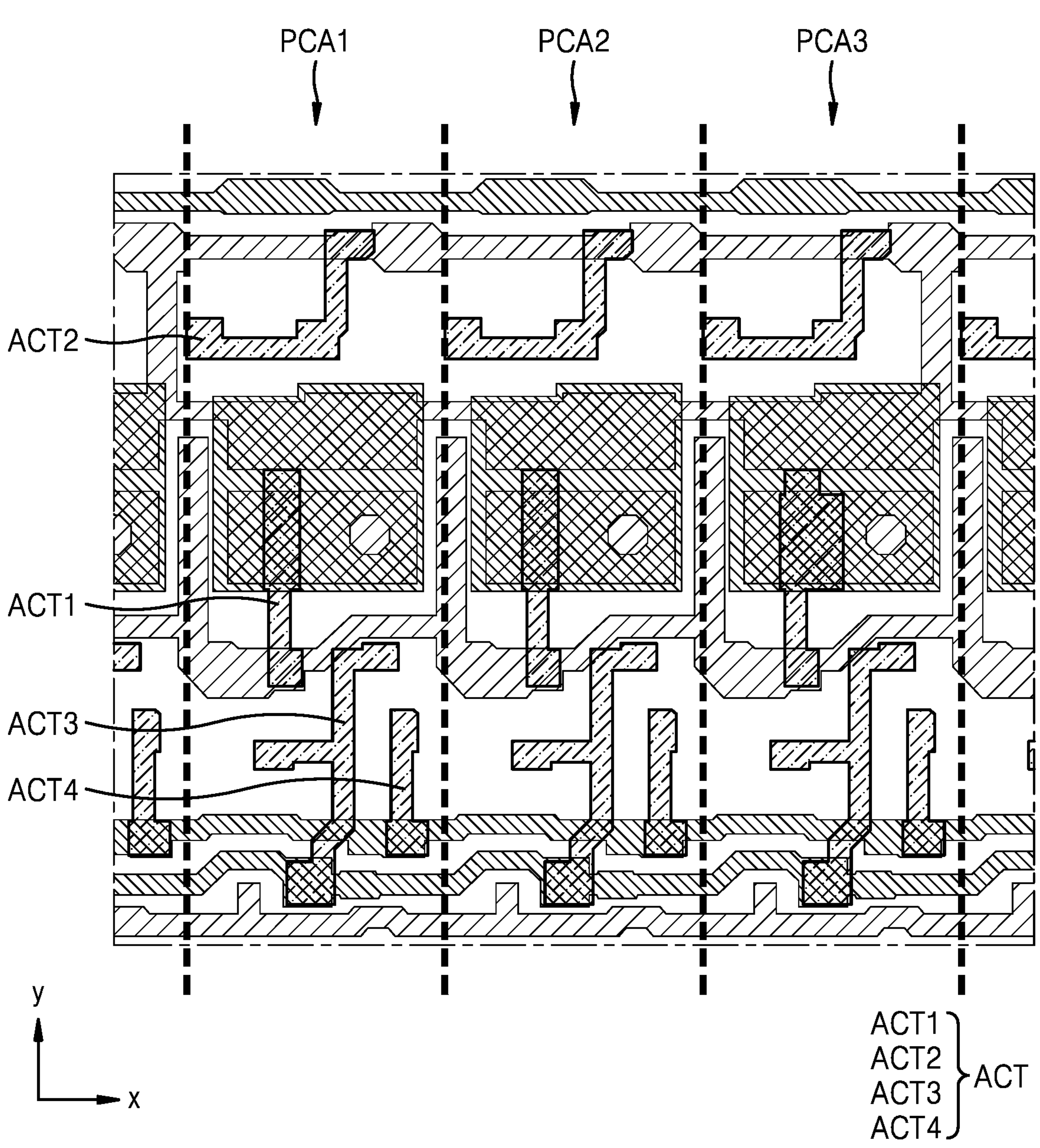
Figure 14:
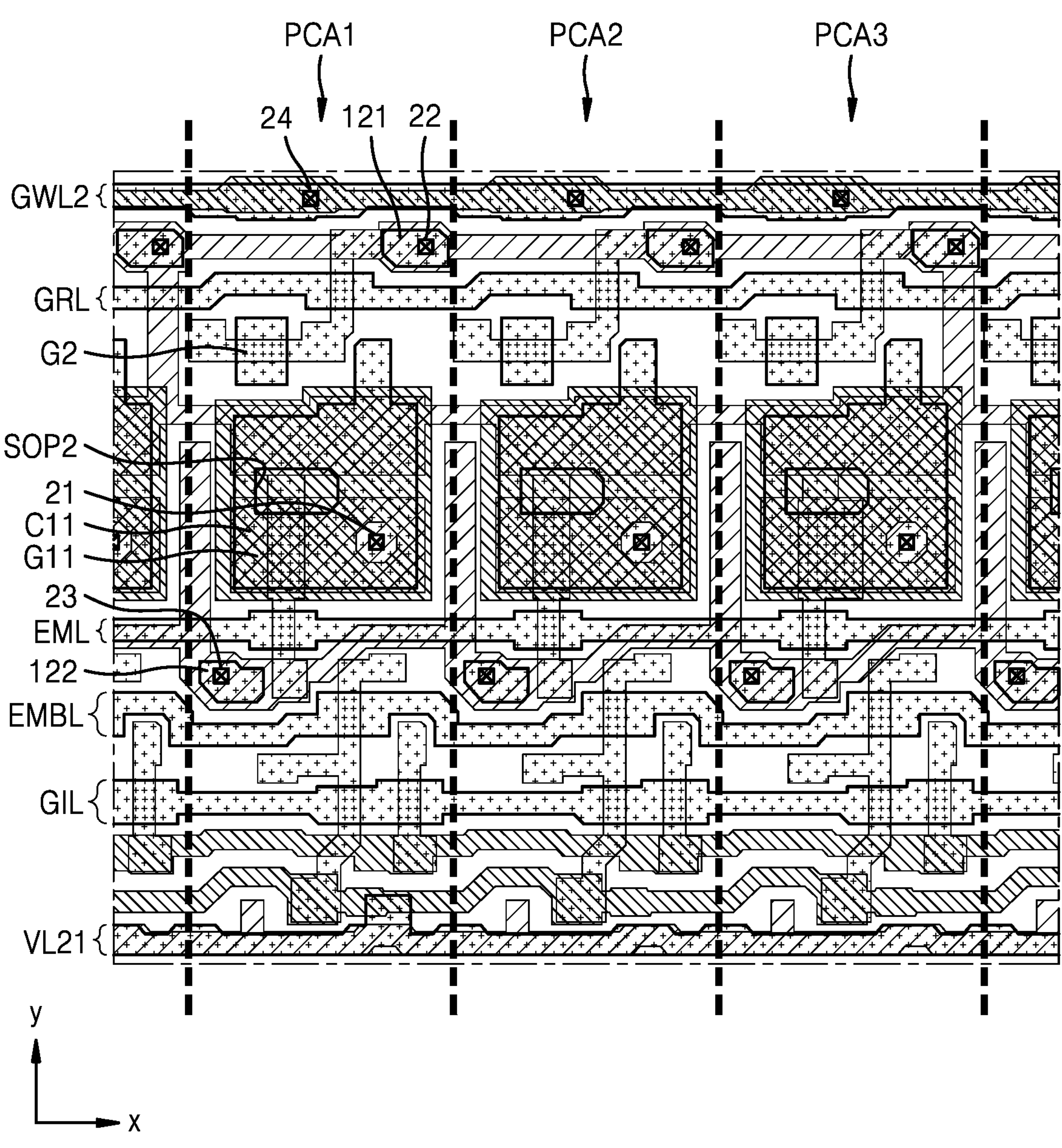
Figure 15:
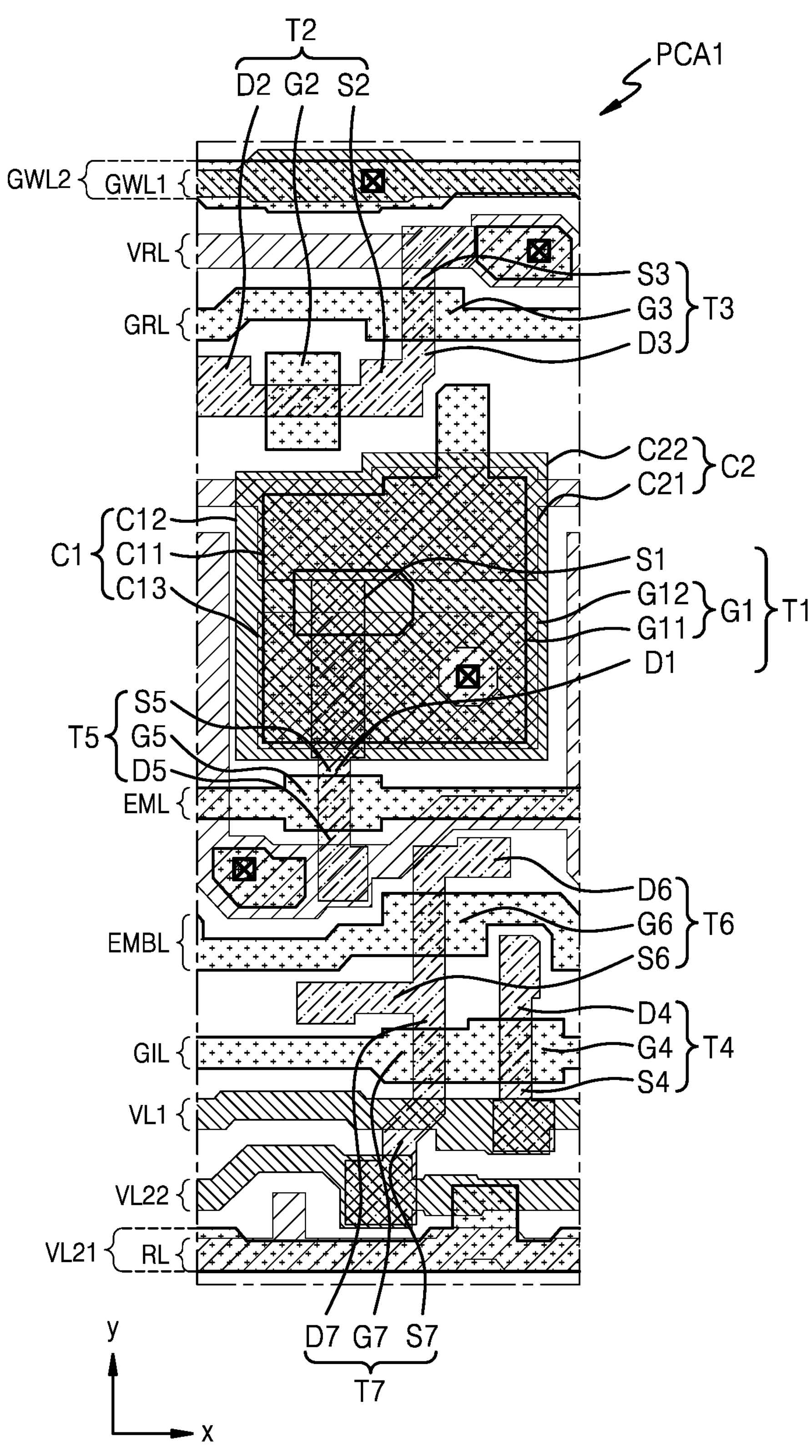
Figure 20:
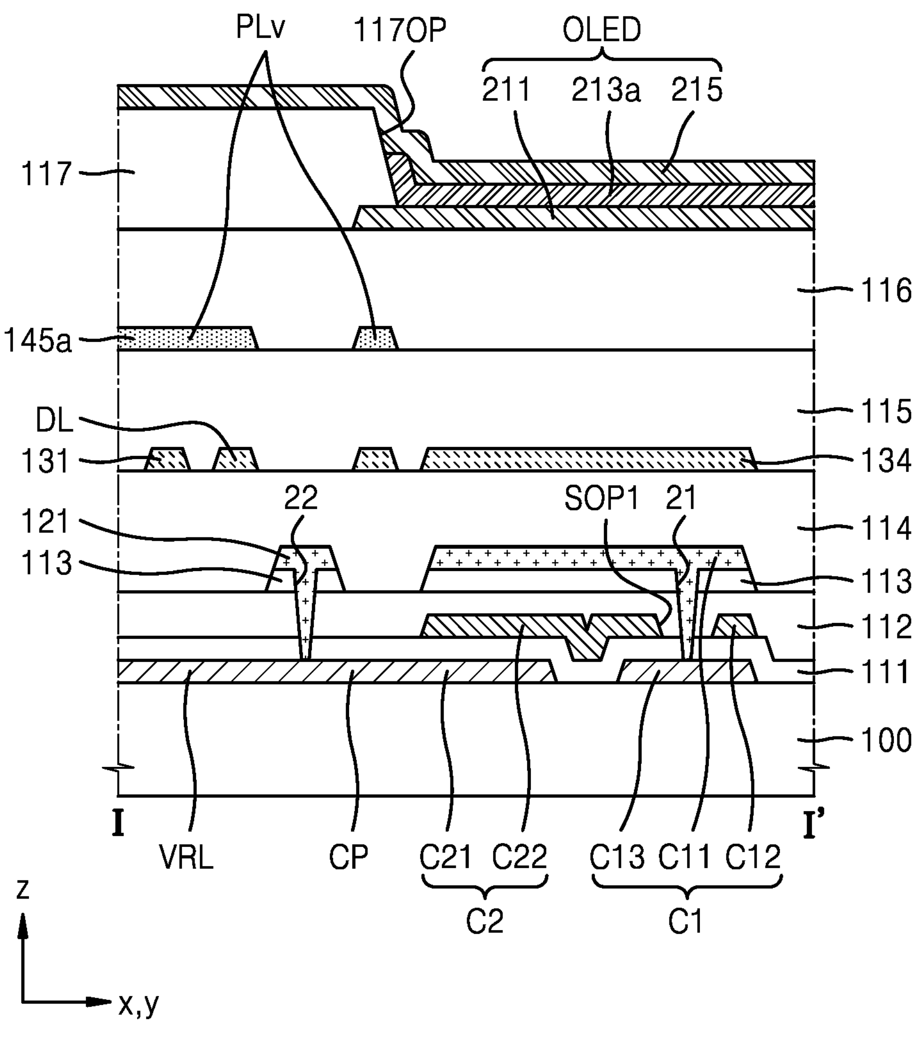
FIG. 20 is a schematic cross-sectional view of FIG. 19 taken along line I-I'.
Figure 21:
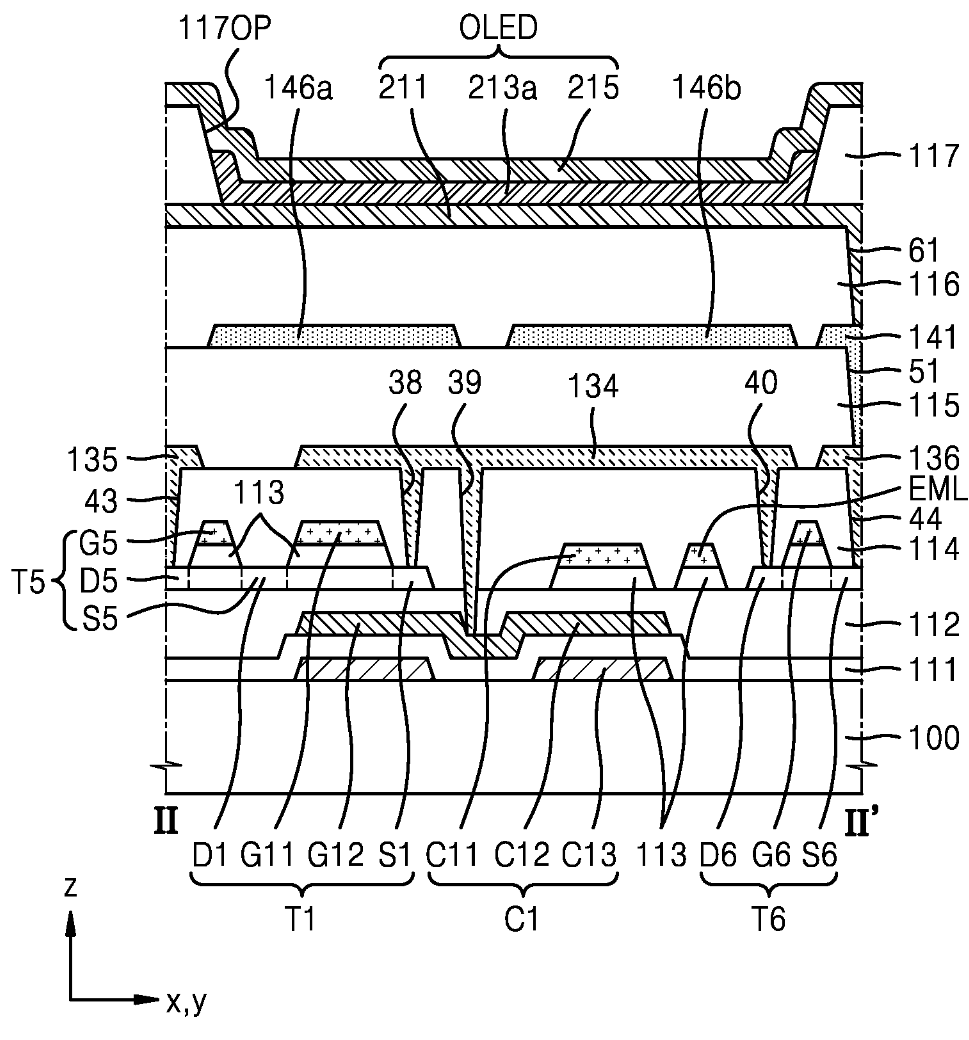
FIG. 21 is a schematic cross-sectional view of FIG. 19 taken along line II-II'.

FIGS. 11 to 19 are schematic plan views illustrating an arrangement of elements of the pixel of FIG. 4 on a layer-by-layer basis. FIG. 15, which is a portion of FIG. 14, is a schematic plan view of elements of the first pixel area PCA1. FIG. 20 is a schematic cross-sectional view of FIG. 19 taken along line I-I'. FIG. 21 is a schematic cross-sectional view of FIG. 19 taken along line II-II'.

According to an embodiment, different second initializing voltages Vaint may be supplied to a first pixel, a second pixel, and a third pixel in consideration of emission characteristics of the first pixel, the second pixel, and the third pixel. For example, a pixel circuit of the first pixel may be connected to a 2-1-th initializing voltage line VL21, and a pixel circuit of the second pixel and a pixel circuit of the third pixel may be connected to a 2-2-th initializing voltage line VL22. A second initializing voltage supplied to the 2-1-th initializing voltage line VL21 may be different from a second initializing voltage supplied to the 2-2-th initializing voltage line VL22.

The same elements may be disposed on respective layers of the first pixel area PCA1, the second pixel area PCA2, and the third pixel area PCA3. Hereinafter, for convenience of illustration and description, identification numerals may be assigned to the elements of a pixel circuit disposed in the first pixel area PCA1, the first pixel area PCA1 will be focused on and described, and descriptions of the same elements are substantially equally applicable to the elements of the second pixel area PCA2 and the third pixel area PCA3. The cross-sectional views of FIGS. 20 and 21 may be cross-sectional views of the first pixel area PCA1. FIGS. 20 and 21 will now be described with reference to FIGS. 11 to 21.

The substrate 100 may include a glass material, a ceramic material, a metal material, or a material having flexible or bendable characteristics. The substrate 100 may have a single-layer structure of an organic layer or a multi-layer structure of an organic layer and an inorganic layer. For example, the substrate 100 may have a stack structure of a first base layer/barrier layer/second base layer. Each of the first and second base layers may be an organic layer including polymer resin. The first and second base layers may include transparent polymer resin. The barrier layer may be a barrier layer that prevents infiltration of external foreign materials, and may be a single layer or multiple layers including an inorganic material, such as silicon nitride ($SiN_x$) or silicon oxide ($SiO_x$).

Figure 11:
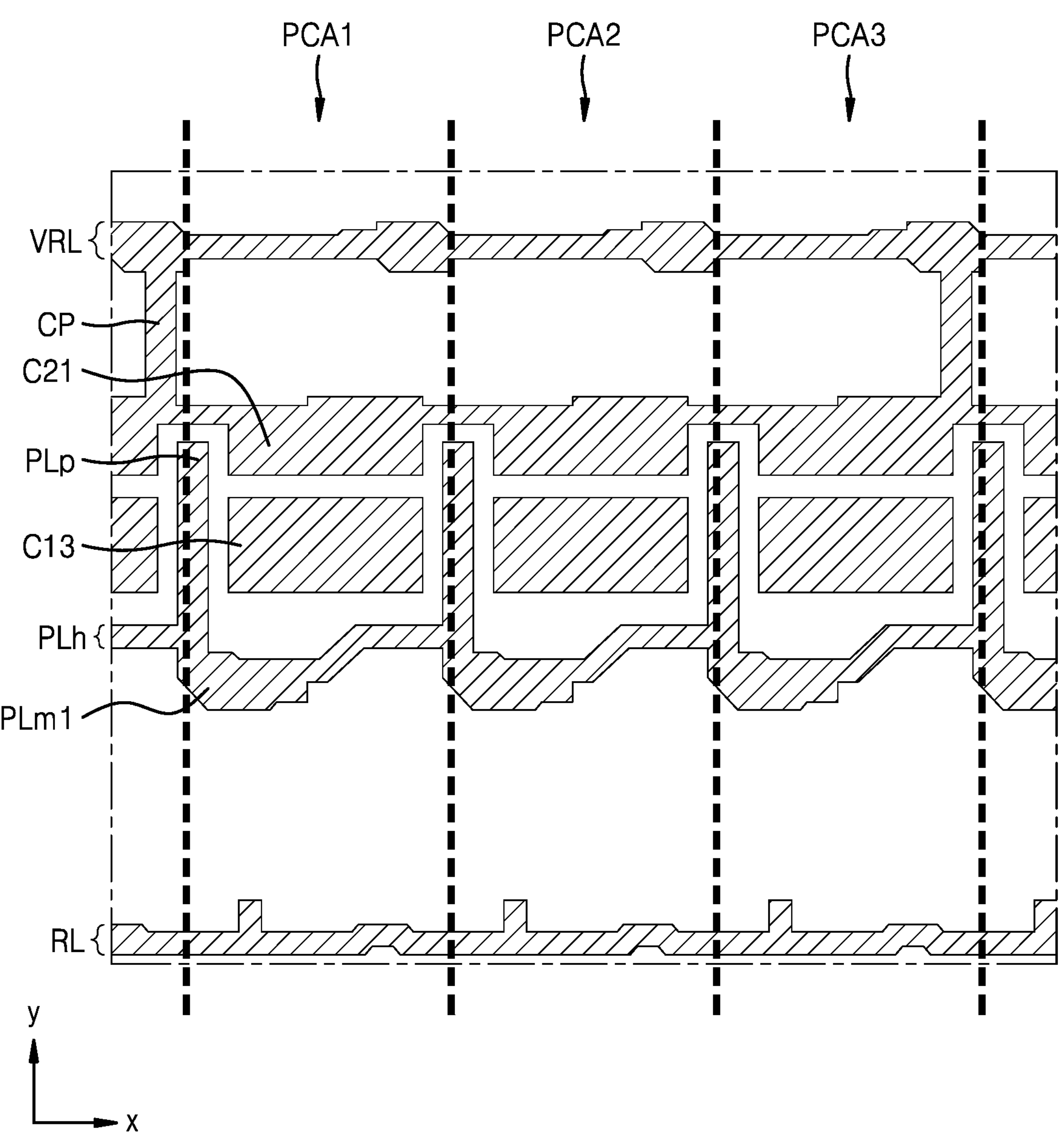

Referring to FIG. 11, a first conductive layer may be disposed on the substrate 100. The first conductive layer may include a reference voltage line VRL, a first electrode layer, and/or a first driving voltage line PLh. According to another embodiment, a barrier layer may be further disposed between the substrate 100 and the first conductive layer.

The reference voltage line VRL may extend in the x direction and may be arranged over the first pixel area PCA1, the second pixel area PCA2, and the third pixel area PCA3.

The first driving voltage line PLh may include a main line PLm1 extending in the x direction and a protrusion line PLp protruding and extending from the main line PLm1 in the y direction. The main line PLm1 of the first driving voltage line PLh may extend over the first pixel area PCA1, the second pixel area PCA2, and the third pixel area PCA3. The protrusion line PLp may be disposed in each pixel area to be adjacent to a boundary with an adjacent pixel area.

The first electrode layer may include a third electrode C13 of the first capacitor C1 and a first electrode C21 of the second capacitor C2 that are spaced apart from each other. The third electrode C13 of the first capacitor C1 may be provided in an island type. The first electrode C21 of the second capacitor C2 may be connected to the reference voltage line VRL. The second electrode C21 of the second capacitor C2 may be connected to the reference voltage line VRL via a connection portion CP. The second electrodes C21 of the second capacitor C2 of the first pixel area PCA1, the second pixel area PCA2, and the third pixel area PCA3 may be connected to one another. According to an embodiment, the first electrode C21 of the second capacitor C2, the connection portion CP, and the reference voltage line VRL may be integral with each other and may be provided on the same layer. The connection portion CP may be disposed in one of the first pixel area PCA1, the second pixel area PCA2, and the third pixel area PCA3, for example, in the third pixel area PCA3.

According to an embodiment, the first conductive layer may further include a repair line RL. The repair line RL may extend in the x direction and may be arranged over the first pixel areas PCA1, the second pixel area PCA2, and the third pixel area PCA3.

A first insulating layer 111 may be disposed on the substrate 100 while covering the first conductive layer, and a second conductive layer may be disposed on the first insulating layer 111. As shown in FIG. 12, the second conductive layer may include a second electrode layer, a lower first gate line GWL1, a first initializing voltage line VL1, and a 2-2-th initializing voltage line VL22.

The second electrode layer may be provided in an island type. A portion of the second electrode layer may be a second gate electrode G12 as a lower gate electrode (bottom gate electrode) of the first transistor T1. Another portion of the second electrode layer may be a second electrode C12 of the first capacitor C1, and another portion of the second electrode layer may be a second electrode C22 of the second capacitor C2. The second electrode C12 of the first capacitor C1 may overlap the third electrode C13 of the first capacitor C1. The second electrode C22 of the second capacitor C2 may overlap the first electrode C21 of the second capacitor C2. An opening SOP1 may be defined in the second electrode layer.

The first initializing voltage line VL1 and the 2-2-th initializing voltage line VL22 may each extend in the x direction and may be disposed in the first pixel area PCA1, the second pixel area PCA2, and the third pixel area PCA3.

A second insulating layer 112 may be disposed on the first insulating layer 111 while covering the second conductive layer, and a semiconductor layer ACT may be disposed on the second insulating layer 112. The semiconductor layer ACT may include amorphous silicon, polycrystalline silicon, or an organic semiconductor material (such as an oxide semiconductor). As shown in FIG. 13, the semiconductor layer ACT may include a first semiconductor layer ACT1, a second semiconductor layer ACT2, a third semiconductor layer ACT3, and a fourth semiconductor layer ACT4. The semiconductor layer ACT may include a channel region of each of the first to seventh transistors T1 to T7 and a source region and a drain region on sides (e.g., both sides) of the channel region. In some embodiments, a source region or a drain region may be interpreted as a source electrode or drain electrode of a transistor.

Referring to FIG. 15, the first semiconductor layer ACT1 may include a source region S1 and a drain region D1 of the first transistor T1 and a source region S5 and a drain region D5 of the fifth transistor T5. The second semiconductor layer ACT2 may include a source region S2 and a drain region D2 of the second transistor T2 and a source region S3 and a drain region D3 of the third transistor T3. The third semiconductor layer ACT3 may include a source region S6 and a drain region D6 of the sixth transistor T6 and a source region S7 and a drain region D7 of the seventh transistor T7. The fourth semiconductor layer ACT4 may include a source region S4 and a drain region D4 of the fourth transistor T4.

A width (length in the x direction) of the channel region of the first transistor T1 in the third pixel area PCA3 may be greater than that of the channel region of the first transistor T1 in each of the first and second pixel areas PCA1 and PCA2.

In a comparative example in which the second capacitor C2 and the reference voltage line VRL are disposed on different layers, a connection electrode acting as a bridge for connecting the first electrode C21 of the second capacitor C2 to the reference voltage line VRL may be needed, and a space for forming a contact hole for connecting the connection electrode to the reference voltage line VRL may be needed.

According to an embodiment, as shown in FIGS. 15 and 20, as the first electrode C21 of the second capacitor C2 and the reference voltage line VRL are disposed on the same layer, a wiring arrangement space may be reduced, and thus the resolution may be increased, and the capacitance capacity of the second capacitor C2 may be increased.

A third insulating layer 113 may be disposed on the second insulating layer 112 while covering the semiconductor layer ACT, and a third conductive layer may be disposed on the third insulating layer 113. As shown in FIG. 14, the third conductive layer may include a third electrode layer and gate electrodes G2 to G7 of the second to seventh transistors T2 to T7. The third conductive layer may further include an upper first gate line GWL2, the second gate line GIL, the third gate line GRL, the fourth gate line EML, the fifth gate line EMBL, and the 2-1-th initializing voltage line VL21. The third conductive layer may further include connection electrodes 121 and 122. In the third insulating layer 113, only a region overlapping the third conductive layer may remain, and the other region may be removed.

The third electrode layer may be provided in an island type, and an opening SOP2 may be defined in the third electrode layer. A portion of the third electrode layer may be a first gate electrode G11 as an upper gate electrode (top gate electrode) of the first transistor T1. Another portion of the third electrode layer may be a first electrode C11 of the first capacitor C1. The first electrode C11 of the first capacitor C1 may overlap the second electrode C12 and the third electrode C13 of the first capacitor C1. The first electrode C11 of the first capacitor C1 may contact the third electrode C13 of the first capacitor C1 through a contact hole 21 passing through the first insulating layer 111, the second insulating layer 112, and the third insulating layer 113 and may be electrically connected to the third electrode C13 of the first capacitor C1. The contact hole 21 may be located in the opening SOP1 of the second electrode C12 of the first capacitor C1. The first capacitor C1 may include the third electrode C13, the second electrode C12, and the first electrode C11 sequentially arranged in the z direction on the substrate 100, and the first electrode C11 and the third electrode C13 may be electrically connected to each other.

The upper first gate line GWL2, the second gate line GIL, the third gate line GRL, the fourth gate line EML, the fifth gate line EMBL, and the 2-1-th initializing voltage line VL21 may each extend in the x direction, and may be arranged over the first pixel area PCA1, the second pixel area PCA2, and the third pixel area PCA3.

The upper first gate line GWL2 may overlap the lower first gate line GWL1, and may be electrically connected to the lower first gate line GWL1 through a contact hole 24 passing through the second insulating layer 112 and the third insulating layer 113. The first gate line GWL may have a two-layer structure including the lower first gate line GWL1 and the upper first gate line GWL2 disposed on different layers.

The gate electrodes G1 to G7 of the first to seventh transistors T1 to T7 may overlap the channel regions of the semiconductor layer ACT.

Referring to FIG. 15, the first gate electrode G11 of the first transistor T1 may be provided in an island type. The first gate electrode G11 of the first transistor T1 may overlap the first semiconductor layer ACT1. The first gate electrode G11 of the first transistor T1 may overlap the second semiconductor layer G12. The gate electrode G2 of the second transistor T2 may be provided in an island type. The gate electrode G2 of the second transistor T2 may overlap the second semiconductor layer ACT2. The gate electrode G3 of the third transistor T3 may be a portion of the third gate line GRL crossing (overlapping) the second semiconductor layer ACT2. The gate electrode G4 of the fourth transistor T4 may be a portion of the second gate line GIL crossing (overlapping) the fourth semiconductor layer ACT4. The gate electrode G5 of the fifth transistor T5 may be a portion of the fourth gate line EML crossing (overlapping) the first semiconductor layer ACT1. The gate electrode G6 of the sixth transistor T6 may be a portion of the fifth gate line EMBL crossing (overlapping) the third semiconductor layer ACT3. The gate electrode G7 of the seventh transistor T7 may be a portion of the second gate line GIL crossing (overlapping) the third semiconductor layer ACT3.

The connection electrode 121 may be electrically connected to the reference voltage line VRL through a contact hole 22 passing through the first insulating layer 111, the second insulating layer 112, and the third insulating layer 113. The connection electrode 122 may be electrically connected to the first driving voltage line PLh through a contact hole 23 passing through the first insulating layer 111, the second insulating layer 112, and the third insulating layer 113.

Figure 16:
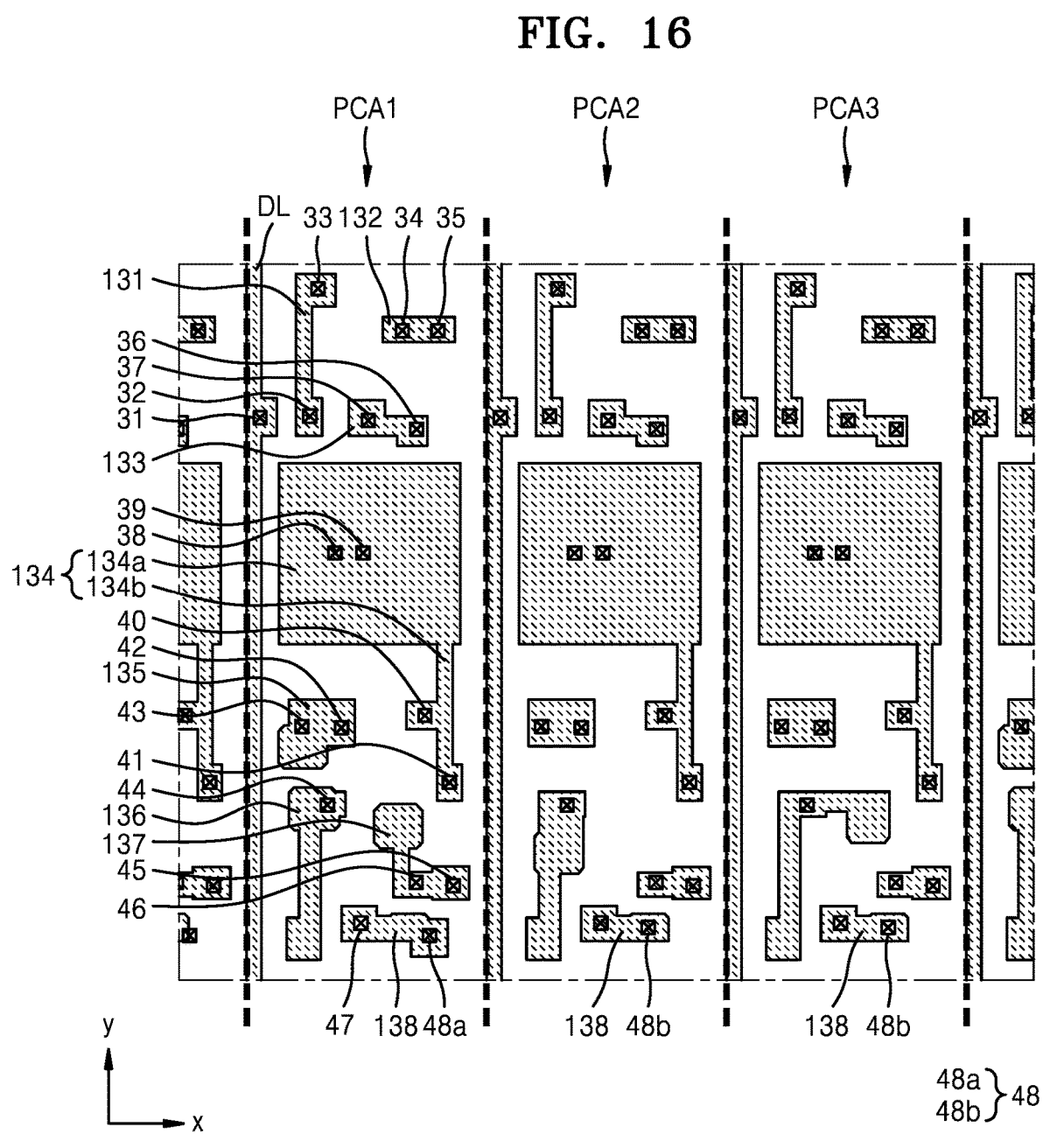

A fourth insulating layer 114 may be disposed on the third conductive layer while covering the third conductive layer, and a fourth conductive layer may be disposed on the fourth insulating layer 114. The fourth insulating layer 114 may be disposed on the second insulating layer 112 to contact an upper surface of the second insulating layer 112, in a region from which the third insulating layer 113 has been removed. As shown in FIG. 16, the fourth conductive layer may include a data line DL and connection electrodes 131, 132, 133, 134, 135, 136, 137, and 138. FIG. 16 illustrates only the fourth conductive layer for convenience of illustration and description.

The data line DL may be disposed to extend in the y direction in each pixel area. The data line DL may be electrically connected to the drain region D2 of the second transistor T2 through a contact hole 31 passing through the fourth insulating layer 114.

One end of the connection electrode 131 may be electrically connected to the gate electrode G2 of the second transistor T2 through a contact hole 32 passing through the fourth insulating layer 114. Another end of the connection electrode 131 may be electrically connected to the upper first gate electrode GWL2 through a contact hole 33 passing through the fourth insulating layer 114.

The connection electrode 132 may be electrically connected to the source region S3 of the third transistor T3 through a contact hole 34 passing through the fourth insulating layer 114, and may be electrically connected to the connection electrode 121 through a contact hole 35 passing through the fourth insulating layer 114. Accordingly, the source region S3 of the third transistor T3 may be electrically connected to the reference voltage line VRL.

One end of the connection electrode 133 may be electrically connected to the third electrode layer through a contact hole 36 passing through the fourth insulating layer 114, and thus may be electrically connected to the first gate electrode G11 of the first transistor T1. Another end of the connection electrode 133 may be electrically connected to the source region S2 of the second transistor T2 and the drain region D3 of the third transistor T3 through a contact hole 37 passing through the fourth insulating layer 114.

The connection electrode 134 may include a first region 134*a* overlapping the third electrode layer and a second region 134*b* protruding and extending from the first region 134*a* in the y direction. The connection electrode 134 may electrically connect the source region S1 of the first transistor T1 to the fourth transistor T4 and the sixth transistor T6.

The first region 134*a* of the connection electrode 134 may be electrically connected to the source region S1 of the first transistor T1 through a contact hole 38 passing through the fourth insulating layer 114. The first region 134*a* of the connection electrode 134 may be electrically connected to the second electrode layer through a contact hole 39 passing through the second insulating layer 112 and the fourth insulating layer 114 and thus may be electrically connected to the second gate electrode G12 of the first transistor T1, the second electrode C12 of the first capacitor C1, and the second electrode C22 of the second capacitor C2. The contact holes 38 and 39 may be located in the opening SOP2 of the third electrode layer. The second region 134*b* of the connection electrode 134 may be electrically connected to the drain region D6 of the sixth transistor T6 through a contact hole 40 passing through the fourth insulating layer 114. The second region 134*b* of the connection electrode 134 may be electrically connected to the drain region D4 of the fourth transistor T4 through a contact hole 41 passing through the fourth insulating layer 114.

The connection electrode 135 may be electrically connected to the connection electrode 122 through a contact hole 43 passing through the fourth insulating layer 114, and may be electrically connected to the drain region D5 of the fifth transistor T5 through a contact hole 42 passing through the fourth insulating layer 114. Accordingly, the drain region D5 of the fifth transistor T5 may be electrically connected to the first driving voltage line PLh.

One end of the connection electrode 136 may be electrically connected to the source region S6 of the sixth transistor T6 through a contact hole 44 passing through the fourth insulating layer 114. Another end of the connection electrode 136 may overlap a portion of the repair line RL. The another end of the connection electrode 136 may be insulated from the repair line RL, and may be electrically connected to the repair line RL in case that a defect occurs in a pixel circuit disposed in a corresponding pixel area later.

The connection electrode 137 may be electrically connected to the source region S4 of the fourth transistor T4 through a contact hole 45 passing through the fourth insulating layer 114, and may be connected to the first initializing voltage line VL1 through a contact hole 46 passing through the fourth insulating layer 114.

The connection electrode 138 may be electrically connected to the source region S7 of the seventh transistor T7 through a contact hole 47 passing through the fourth insulating layer 114, and may be connected to the second initializing voltage line VL2 through a contact hole 48 passing through the fourth insulating layer 114. According to an embodiment, the connection electrode 138 disposed in the first pixel area PCA1 may be electrically connected to the 2-1-th initializing voltage line VL21 through a contact hole 48*a*, and the connection electrodes 138 disposed in the second pixel area PCA2 and the third pixel area PCA3 may be electrically connected to the 2-2-th initializing voltage line VL22 through contact holes 48*b*, respectively.

Figure 17A:
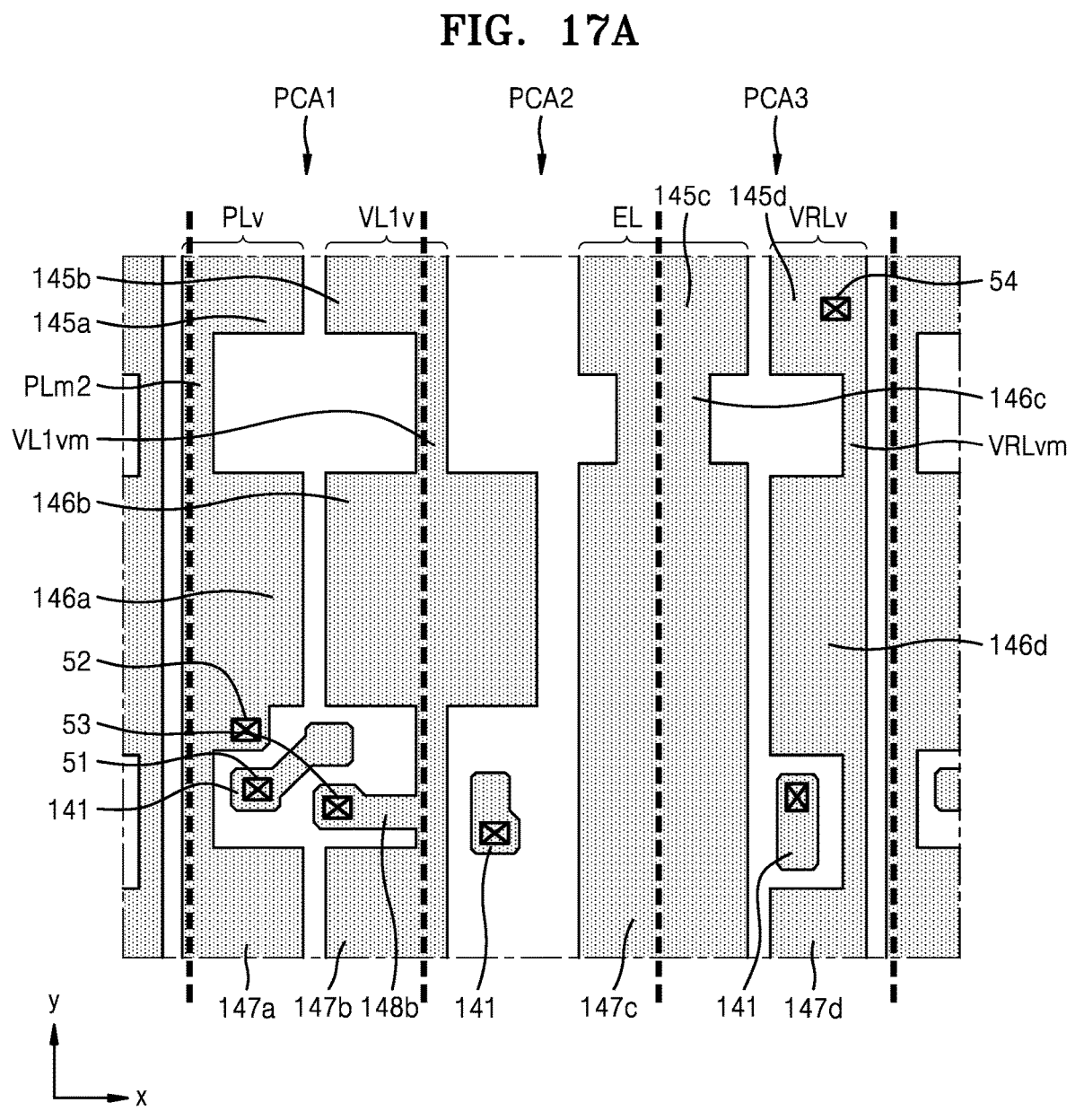
Figure 17C:
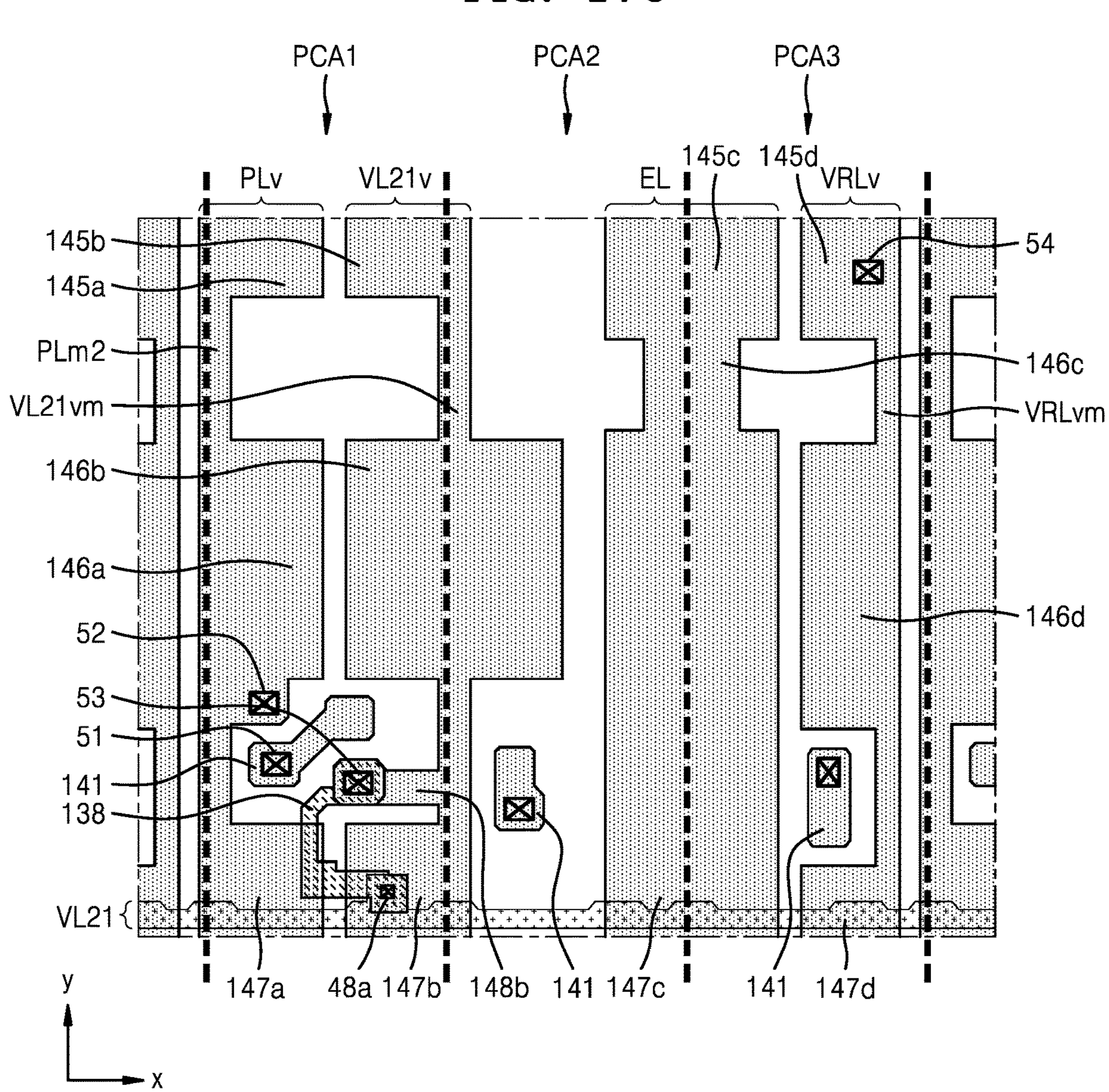

A fifth insulating layer 115 may be disposed on the fourth insulating layer 114 while covering the fourth conductive layer, and a fifth conductive layer may be disposed on the fifth insulating layer 115. As shown in FIGS. 17A to 17C, the fifth conductive layer may include vertical conductive lines and a connection electrode 141. In FIGS. 17A to 17C, only the fifth conductive layer and some of its lower conductive layers are shown for convenience of illustration and description.

The connection electrode 141 may be electrically connected to the connection electrode 136 through a contact hole 51 passing through the fifth insulating layer 115, and may be electrically connected to the source region S6 of the sixth transistor T6.

The vertical conductive lines may include a second driving voltage line PLv, vertical initializing voltage lines, a common voltage line EL, and a vertical reference voltage line VRLv. The vertical initializing voltage lines may include a first vertical initializing voltage line VL1*v*, a 2-1-th vertical initializing voltage line VL21*v*, and a 2-2-th vertical initializing voltage line VL22*v*. The second driving voltage line PLv, the vertical initializing voltage lines, the common voltage line EL, and the vertical reference voltage line VRLv may each extend in the y direction, and may be spaced apart from each other in the x direction in the first pixel area PCA1, the second pixel area PCA2, and the third pixel area PCA3.

For each unit pixel area PCAu, the second driving voltage line PLv, one of the vertical initializing voltage lines, the common voltage line EL, and the vertical reference voltage line VRLv may be sequentially and repeatedly disposed in the x direction. For each unit pixel area PCAu, one of the first vertical initializing voltage line VL1*v*, the 2-1-th vertical initializing voltage line VL21*v*, and the 2-2-th vertical initializing voltage line VL22*v* may be disposed in the first pixel area PCA1 and the second pixel area PCA2. For example, the vertical conductive lines may be arranged in the x direction in the order of the second driving voltage line PLv, the first vertical initializing voltage line VL1*v*, the common voltage line EL, the vertical reference voltage line VRLv, the second driving voltage line PLv, the 2-1-th vertical Initializing voltage line VL21*v*, the common voltage line EL, the vertical reference voltage line VRLv, the second driving voltage line PLv, the 2-2-th vertical initializing voltage line VL22*v*, the common voltage line EL, and the vertical reference voltage line VRLv.

FIG. 17A illustrates an example in which the second driving voltage line PLv, the first vertical initializing voltage line VL1*v*, the common voltage line EL, and the vertical reference voltage line VRLv are sequentially disposed in the x direction in the unit pixel area PCAu.

The second driving voltage line PLv may be disposed in the first pixel area PCA1. The second driving voltage line PLv may include a main line PLm2 extending in the y direction and a first region 145*a*, a second region 146*a*, and a third region 147*a* each protruding and extending from the main line PLm2 in the x direction. The main line PLm2 may overlap the data line DL located in the first pixel area PCA1. The first region 145*a* may overlap the first gate line GWL and the reference voltage line VRL. The extension of the first region 145*a* may overlap the first initializing voltage line VL1, the 2-1-th initializing voltage line VL21, and the 2-2-th initializing voltage line VL22 located in a pixel area adjacent to the first pixel area PCA1 in the +y direction. The second region 146*a* may overlap the first transistor T1, the first capacitor C1, and the second capacitor C2. The third region 147*a* may overlap the first initializing voltage line VL1, the 2-1-th initializing voltage line VL21, and the 2-2-th initializing voltage line VL22. The extension of the third region 147*a* may overlap the first gate line GWL and the reference voltage line VRL located in a pixel area adjacent to the first pixel area PCA1 in the −y direction. The second region 146*a* of the second driving voltage line PLv may be electrically connected to the connection electrode 135 of the first pixel area PCA1 through a contact hole 52 passing through the fifth insulating layer 115. Accordingly, the second driving voltage line PLv may be electrically connected to the first driving voltage line PLh. The driving voltage line PL may have a mesh structure in the display area DA by including the first driving voltage line PLh and the second driving voltage line PLv.

The first vertical initializing voltage line VL1*v* may be disposed in the first pixel area PCA1 and the second pixel area PCA2. The first vertical initializing voltage line VL1*v* may include a main line VL1*vm* extending in the y direction and a first region 145*b*, a second region 146*b*, a third region 147*b*, and a fourth region 148*b* each protruding and extending from the main line VL1*vm* in the x direction. The first region 145*b*, the third region 147*b*, and the fourth region 148*b* may be located in the first pixel area PCA1, and the second region 146*b* may be located in the first pixel area PCA1 and the second pixel area PCA2.

The main line VL1*vm* may overlap the data line DL located in the second pixel area PCA2. The first region 145*b* may overlap the first gate line GWL and the reference voltage line VRL located in the first pixel area PCA1. The extension of the first region 145*b* may overlap the first initializing voltage line VL1, the 2-1-th initializing voltage line VL21, and the 2-2-th initializing voltage line VL22 located in a pixel area adjacent to the first pixel area PCA1 in the +y direction. The second region 146*b* may overlap the first transistor T1, the first capacitor C1, and the second capacitor C2 located in the first pixel area PCA1 and the second pixel area PCA2. The third region 147*b* may overlap the first initializing voltage line VL1, the 2-1-th initializing voltage line VL21, and the 2-2-th initializing voltage line VL22 located in the first pixel area PCA1. The extension of the third region 147*b* may overlap the first gate line GWL and the reference voltage line VRL located in a pixel area adjacent to the first pixel area PCA1 in the −y direction.

The fourth region 148*b* may be located between the second region 146*b* and the third region 147*b*, and may be electrically connected to the connection electrode 137 located in the first pixel area PCA1 through a contact hole 53 passing through the fifth insulating layer 115. Accordingly, the first vertical initializing voltage line VL1*v* may be electrically connected to the first initializing voltage line VL1, and the first initializing voltage line VL1 may have a mesh structure in the display area DA.

The shape of the connection electrode 138 and/or the vertical initializing voltage lines of FIGS. 17B and 17C may be different from the shape of the connection electrode 138 and/or the vertical initializing voltage lines shown in FIGS. 16 and 17A.

As shown in FIG. 17B, the 2-2-th vertical initializing voltage line VL22*v* may be disposed in the first pixel area PCA1 and the second pixel area PCA2 of the unit pixel area PCAu. The 2-2-th vertical initializing voltage line VL22*v* may include a main line VL22*vm*extending in the y direction and a first region 145*b*, a second region 146*b*, a third region 147*b*, and a fourth region 148*b* each protruding and extending from the main line VL22*vm* in the x direction. The first region 145*b* and the third region 147*b* may be located in the first pixel area PCA1, the fourth region 148*b* may be located in the second pixel area PCA2, and the second region 146*b* may be located in the first pixel area PCA1 and the second pixel area PCA2.

The main line VL22*vm* may overlap the data line DL located in the second pixel area PCA2. The first region 145*b* may overlap the first gate line GWL and the reference voltage line VRL located in the first pixel area PCA1. The extension of the first region 145*b* may overlap the first initializing voltage line VL1, the 2-1-th initializing voltage line VL21, and the 2-2-th initializing voltage line VL22 located in a pixel area adjacent to the first pixel area PCA1 in the +y direction. The second region 146*b* may overlap the first transistor T1, the first capacitor C1, and the second capacitor C2 located in the first pixel area PCA1 and the second pixel area PCA2. The third region 147*b* may overlap the first initializing voltage line VL1, the 2-1-th initializing voltage line VL21, and the 2-2-th initializing voltage line VL22 located in the first pixel area PCA1. The extension of the third region 147*b* may overlap the first gate line GWL and the reference voltage line VRL located in a pixel area adjacent to the first pixel area PCA1 in the −y direction.

The fourth region 148*b* may be electrically connected to the connection electrode 138 located in the second pixel area PCA2 through a contact hole 53 passing through the fifth insulating layer 115. The connection electrode 138 of the second pixel area PCA2 may be electrically connected to the 2-2-th initializing voltage line VL22 through the contact hole 48*b*. Accordingly, the 2-2-th vertical initializing voltage line VL22*v* may be electrically connected to the 2-2-th initializing voltage line VL22, and the 2-2-th initializing voltage line VL22 may have a mesh structure in the display area DA.

As shown in FIG. 17C, the 2-1-th vertical initializing voltage line VL21*v* may be disposed in the first pixel area PCA1 and the second pixel area PCA2 of the unit pixel area PCAu. The 2-1-th vertical initializing voltage line VL21*v* may include a main line VL21*vm* extending in the y direction and a first region 145*b*, a second region 146*b*, a third region 147*b*, and a fourth region 148*b* each protruding and extending from the main line VL21*vm* in the x direction. The first region 145*b*, the third region 147*b*, and the fourth region 148*b* may be located in the first pixel area PCA1, and the second region 146*b* may be located in the first pixel area PCA1 and the second pixel area PCA2.

The main line VL21*vm* may overlap the data line DL located in the second pixel area PCA2. The first region 145*b* may overlap the first gate line GWL and the reference voltage line VRL located in the first pixel area PCA1. The extension of the first region 145*b* may overlap the first initializing voltage line VL1, the 2-1-th initializing voltage line VL21, and the 2-2-th initializing voltage line VL22 located in a pixel area adjacent to the first pixel area PCA1 in the +y direction. The second region 146*b* may overlap the first transistor T1, the first capacitor C1, and the second capacitor C2 located in the first pixel area PCA1 and the second pixel area PCA2. The third region 147*b* may overlap the first initializing voltage line VL1, the 2-1-th initializing voltage line VL21, and the 2-2-th initializing voltage line VL22 located in the first pixel area PCA1. The extension of the third region 147*b* may overlap the first gate line GWL and the reference voltage line VRL located in a pixel area adjacent to the first pixel area PCA1 in the −y direction.

The fourth region 148*b* may be located between the second region 146*b* and the third region 147*b*, and may be electrically connected to the connection electrode 138 located in the first pixel area PCA1 through the contact hole 53 passing through the fifth insulating layer 115. The connection electrode 138 of the first pixel area PCA1 may be electrically connected to the 2-1-th initializing voltage line VL21 through the contact hole 48*a*. Accordingly, the 2-1-th vertical initializing voltage line VL21*v* may be electrically connected to the 2-1-th initializing voltage line VL21, and the 2-1-th initializing voltage line VL21 may have a mesh structure in the display area DA.

The common voltage line EL may be disposed in the second pixel area PCA2 and the third pixel area PCA3. The common voltage line EL may extend in the y direction, and may include a first region 145*c* having a first width in the x direction, a second region 146*c* having a second width less than the first width, and a third region 147*c* having the first width. The first region 145*c*, the second region 146*c*, and the third region 147*c* may overlap the data line DL located in the third pixel area PCA3. The first region 145*c* may overlap the first gate line GWL, the reference voltage line VRL, and the third gate line GRL located in the second pixel area PCA2 and the third pixel area PCA3. The third region 147*c* may overlap the first transistor T1, the first capacitor C1, the second capacitor C2, the fourth gate line EML, the fifth gate line EMBL, the second gate line GIL, the first initializing voltage line VL1, the 2-1-th initializing voltage line VL21, and the 2-2-th initializing voltage line VL22 located in the first and second pixel areas PCA1 and PCA2.

The vertical reference voltage line VRLv may be disposed in the third pixel area PCA3. The vertical reference voltage line VRLv may include a main line VRLvm extending in the y direction and a first region 145*d*, a second region 146*d*, and a third region 147*d* each protruding and extending from the main line VRLvm in the x direction. The first region 145*d* may overlap the first gate line GWL and the third gate line VRL. The extension of the first region 145*d* may overlap the first initializing voltage line VL1, the 2-1-th initializing voltage line VL21, and the 2-2-th initializing voltage line VL22 located in a pixel area adjacent to the third pixel area PCA3 in the +y direction. The second region 146*d* may overlap the first transistor T1, the first capacitor C1, and the second capacitor C2. The third region 147*d* may overlap the first initializing voltage line VL1, the 2-1-th initializing voltage line VL21, and the 2-2-th initializing voltage line VL22. The extension of the third region 147*d* may overlap the first gate line GWL and the reference voltage line VRL located in a pixel area adjacent to the third pixel area PCA3 in the −y direction. The first region 146*d* of the vertical reference voltage line VRLv may be electrically connected to the connection electrode 132 through a contact hole 54 passing through the fifth insulating layer 115. Accordingly, the vertical reference voltage line VRLv may be electrically connected to the reference voltage line VRL, and the reference voltage line VRL may have a mesh structure in the display area DA.

The connection electrodes 121, 122, 131, 132, 133, 134, 135, 136, 137, 138, and 141 of each of the first pixel area PCA1, the second pixel area PCA2, and the third pixel area PCA3 may have different shapes depending on the positions of the wires arranged in a pixel area.

Figure 18:
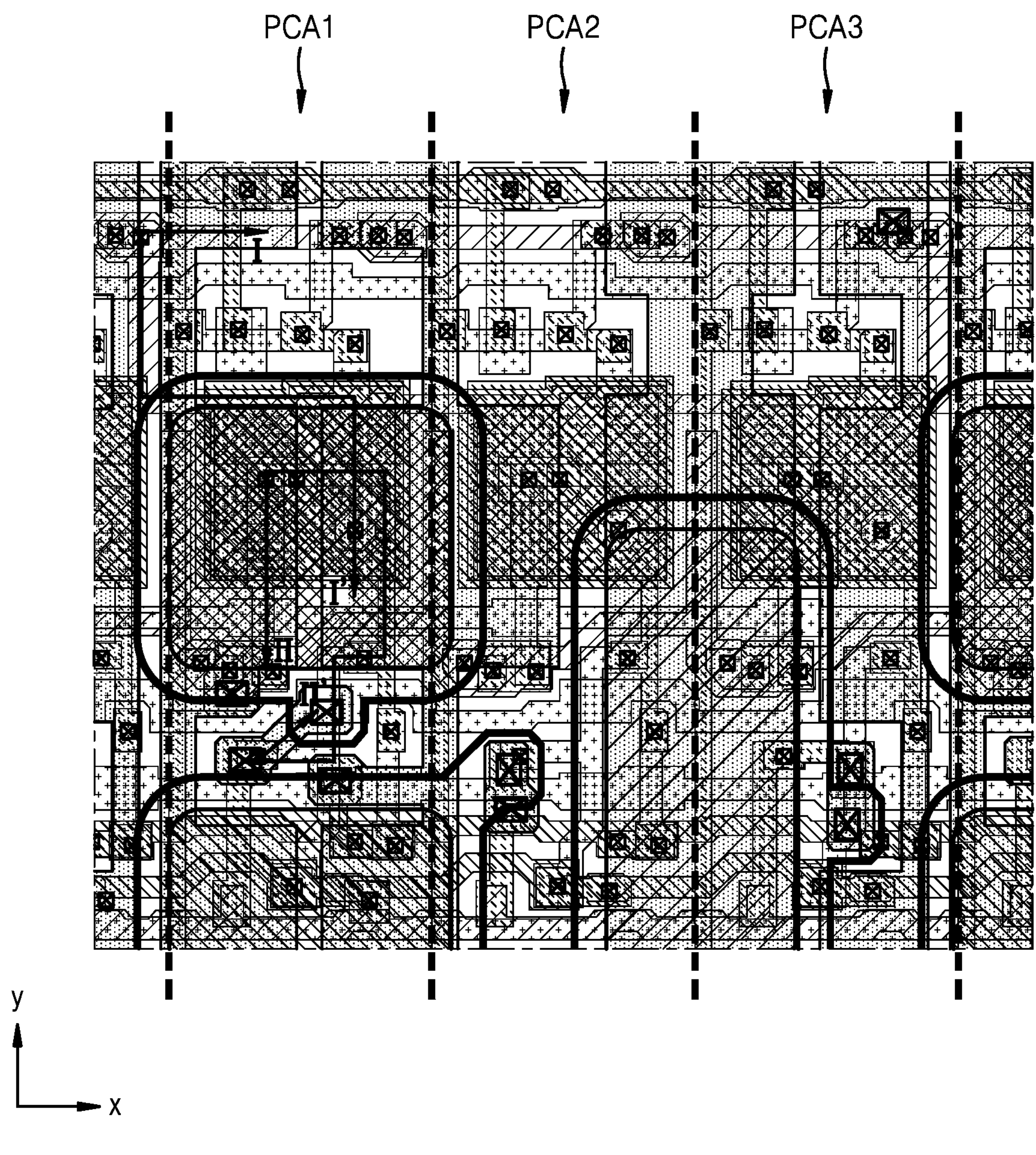

A sixth insulating layer 116 may be disposed on the fifth insulating layer 115 while covering the fifth conductive layer, and, as shown in FIG. 18, an organic light-emitting diodes OLED as a display element may be disposed on the sixth insulating layer 116. FIG. 18 illustrates organic light-emitting diodes disposed on a unit pixel area shown in FIG. 17A.

According to an embodiment, the first insulating layer 111, the second insulating layer 112, the third insulating layer 113, and the fourth insulating layer 114 may be inorganic insulating layers, and the fifth insulating layer 115 and the sixth insulating layer 116 may be organic insulating layers. The inorganic insulating layers may include an inorganic material including oxide or nitride. For example, the inorganic insulating layers may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). The organic insulating layers may include an organic material, such as acryl, benzocyclobutene (BCB), polyimide, or hexamethyldisiloxane (HMDSO).

Figure 19:
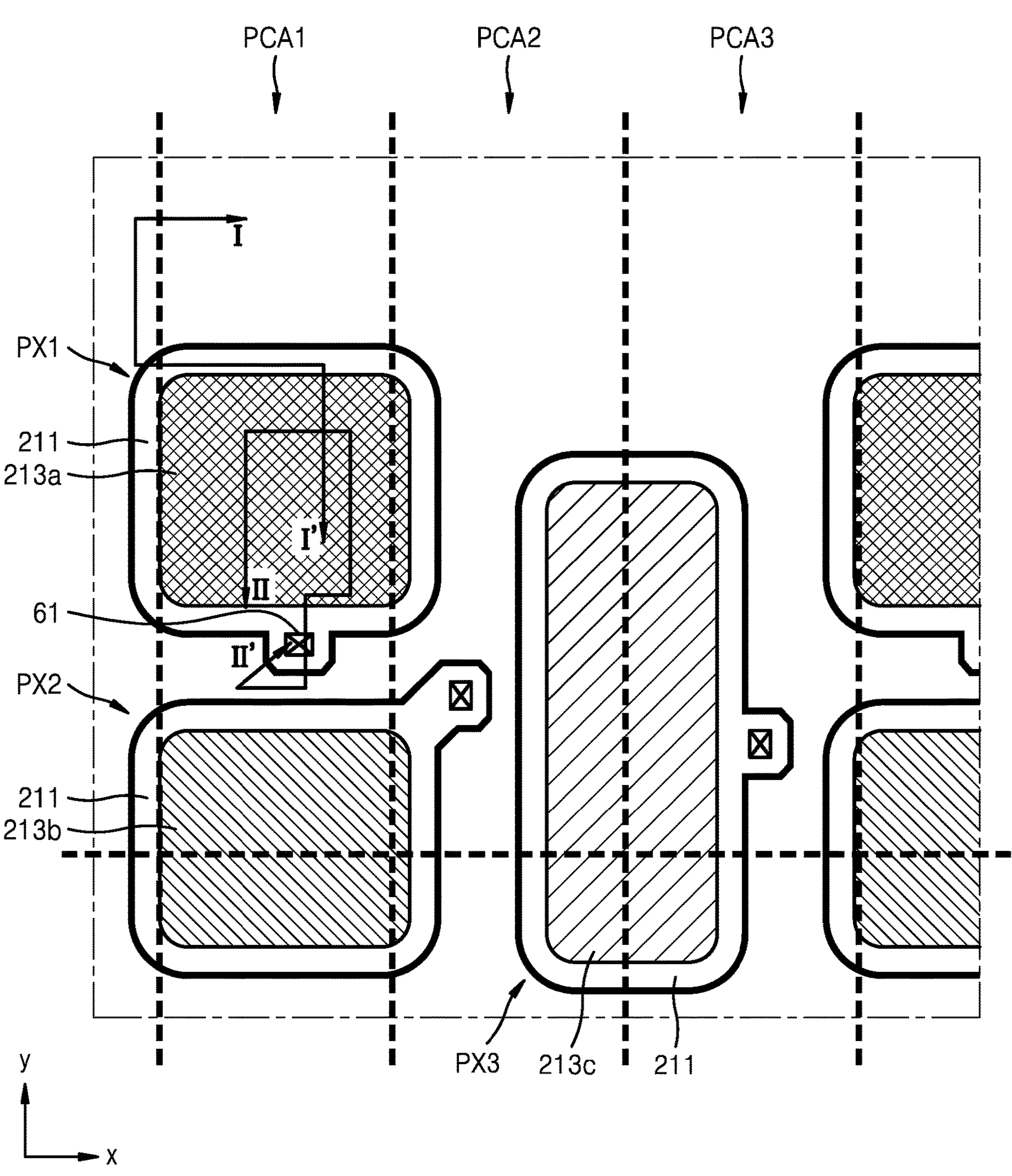

FIG. 19 illustrates organic light-emitting diodes which are portions of the pixels shown in FIG. 18. Each organic light-emitting diode OLED may include a pixel electrode 211, an opposite electrode 215, and an emission layer 213*a* between the pixel electrode 211 and the opposite electrode 215. FIG. 19 illustrates a pixel electrode 211 and an emission layer 213*a* of the first pixel PX1, a pixel electrode 211 and an emission layer 213*b* of the second pixel PX2, and a pixel electrode 211 and an emission layer 213*c* of the third pixel PX3. FIGS. 20 and 21 illustrate an organic light-emitting diode OLED including the pixel electrode 211, the emission layer 213*a*, and the opposite electrode 215 of the first pixel PX1.

The pixel electrode 211 may be connected to a pixel circuit by being electrically connected to a lower connection electrode through a contact hole 61 of the sixth insulating layer 116. Referring to FIG. 19, the pixel electrode 211 of the first pixel PX1 may be electrically connected to the first transistor T1 by being electrically connected to the connection electrode 141 disposed in the first pixel area PCA1. The pixel electrode 211 of the second pixel PX2 may be electrically connected to the first transistor T1 by being electrically connected to the connection electrode 141 disposed in the second pixel area PCA2. The pixel electrode 211 of the third pixel PX3 may be electrically connected to the first transistor T1 by being electrically connected to the connection electrode 141 disposed in the third pixel area PCA3.

According to an embodiment, the pixel electrode 211 of the first pixel PX1 and the pixel electrode 211 of the second pixel PX2 may overlap the pixel circuit of the first pixel area PCA1, and may be disposed adjacent to each other in the y direction. The pixel electrode 211 of the third pixel area PX3 may overlap the pixel circuits of the second and third pixel areas PCA2 and PCA3. For example, each of the pixel electrode 211 of the first pixel PX1 and the pixel electrode 211 of the second pixel PX2 may have an approximately square shape, and the pixel electrode 211 of the third pixel area PX3 may have a rectangular shape having longer sides in the y direction.

A pixel definition layer 117 covering an edge of the pixel electrode 211 may be disposed on the sixth insulating layer 116. An opening 117OP exposing a portion of the pixel electrode 211 and defining an emission area may be defined in the pixel defining layer 117. The pixel definition layer 117 may be a single or multi-layered organic insulating layer and/or a single or multi-layered inorganic insulating layer.

The opposite electrode 215 may be integrally formed to correspond to organic light-emitting diodes OLED included in the display area DA.

Figure 22:
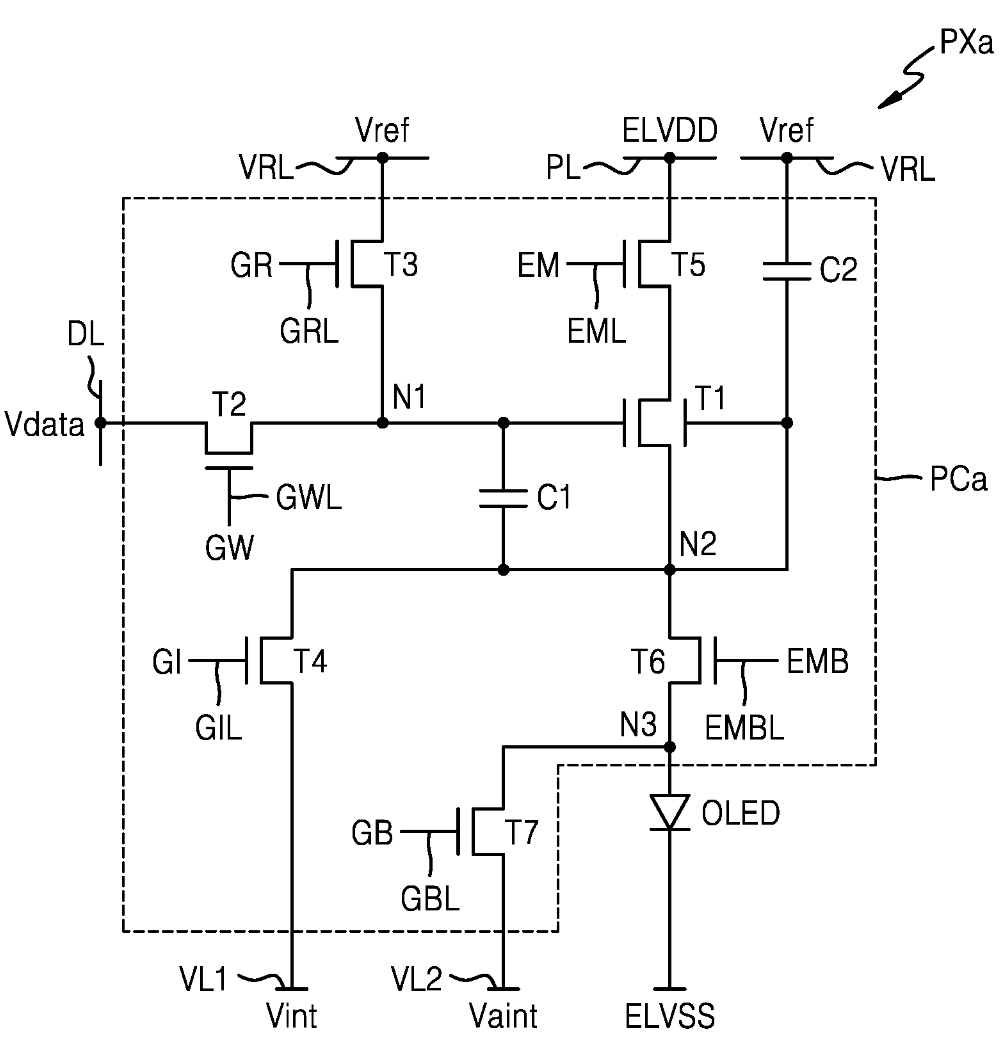
FIG. 22 is a schematic diagram of an equivalent circuit of a pixel according to an embodiment.
Figure 23:
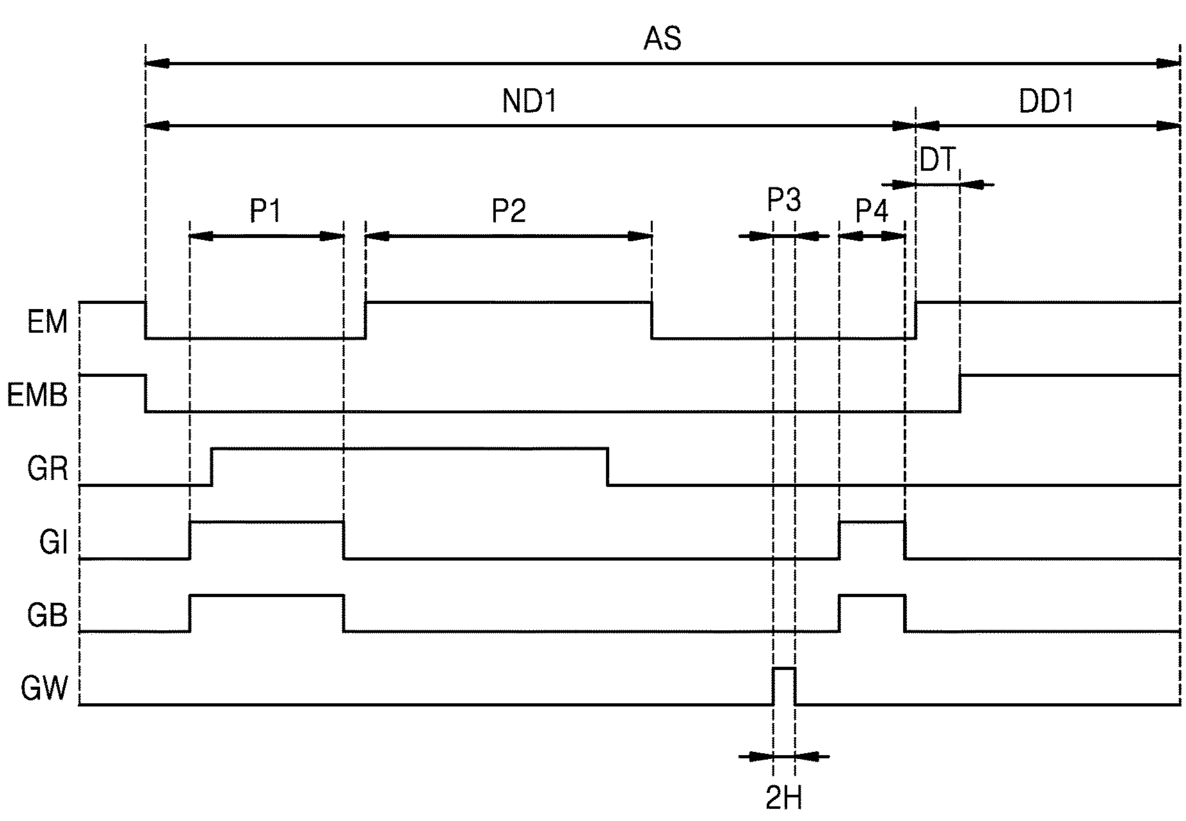
FIGS. 23 and 24 are schematic views illustrating signals for explaining an operation of the pixel of FIG. 22.
Figure 24:
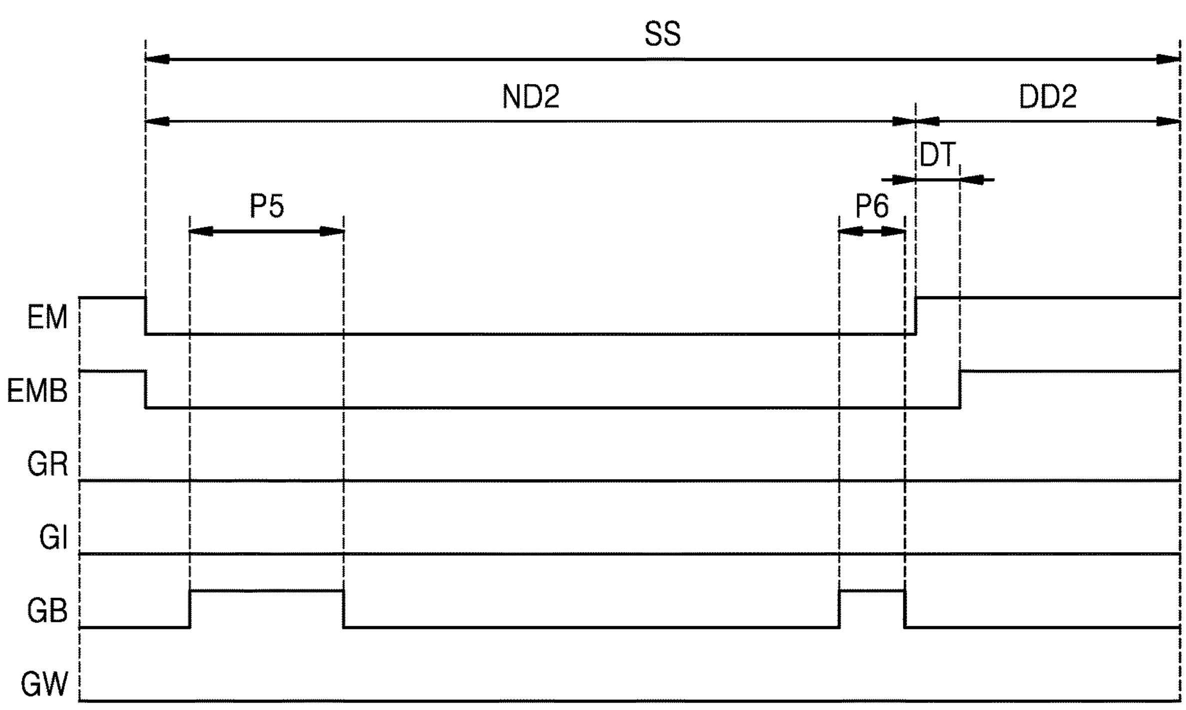

FIG. 22 is a schematic diagram of an equivalent circuit PCa of a pixel PXa according to an embodiment. FIGS. 23 and 24 are schematic views illustrating signals for explaining an operation of the pixel PXa of FIG. 22.

The pixel PXa of FIG. 22 may be different from the pixel PX of FIG. 4 at least in that a gate of a seventh transistor T7 is connected to a sixth gate line GBL to supply a sixth gate signal GB. In the display apparatus 10 illustrated in FIG. 2, sixth gate lines GBL may be further disposed in the pixel portion 11, and the gate driving circuit 13 may further generate the sixth gate signal GB.

As shown in FIGS. 23 and 24, the pixel PXa may operate in one first scan period AS and one second scan period SS during one frame 1F. A difference from an operation of the pixel PX described with reference to FIGS. 4 to 7 will now be described.

As shown in FIG. 23, the first scan period AS may include a first non-emission period ND1 in which the pixel PXa does not emit light and a first emission period DD1 in which the pixel PXa emits light. The first non-emission period ND1 may include a first period P1, a second period P2, a third period P3, and a fourth period P4.

In the first period P1, the second gate signal GI of an on-voltage may be supplied (applied) to the second gate line GIL, and the sixth gate signal GB of an on-voltage may be supplied to the sixth gate line GBL. The third gate signal GR of an on voltage may be supplied to the third gate line GRL. The fourth transistor T4 may be turned on by the second gate signal GI, and the third transistor T3 may be turned on by the third gate signal GR. The second terminal of the first transistor T1 may be initialized to the first initializing voltage Vint by the turned-on fourth transistor T4. The first gate of the first transistor T1 may be initialized to the reference voltage Vref by the turned-on third transistor T3. The seventh transistor T7 may be turned on by the sixth gate signal GB, and the pixel electrode of the organic light-emitting diode OLED may be initialized to the second initializing voltage Vaint by the turned-on seventh transistor T7.

In the second period P2, the third gate signal GR of an on voltage may be supplied to the third gate line GRL, and the fourth gate signal EM may be supplied to the fourth gate line EML. The third transistor T3 may be turned on by the third gate signal GR, and the fifth transistor T5 may be turned on by the fourth gate signal EM. Accordingly, the threshold voltage Vth of the first transistor T1 may be compensated for by storing a voltage corresponding to the threshold voltage Vth of the first transistor T1 in the first capacitor C1.

In the third period P3, the first gate signal GW of an on voltage may be supplied to the first gate line GWL. The second transistor T2 may be turned on by the first gate signal GW, and the turned-on second transistor T2 may transmit the data signal Vdata from the data line DL to the first gate of the first transistor T1. Thus, the first capacitor C1 may be charged with a voltage corresponding to the threshold voltage Vth of the first transistor T1 and the data signal Vdata.

In the fourth period P4, the second gate signal GI of an on-voltage may be supplied (applied) to the second gate line GIL, and the sixth gate signal GB of an on-voltage may be supplied to the sixth gate line GBL. The fourth transistor T4 may be turned on by the second gate signal GI, and the first initializing voltage Vint may be transmitted to the second terminal of the first transistor T1 by the turned-on fourth transistor T4. The seventh transistor T7 may be turned on by the sixth gate signal GB, and the second initializing voltage Vaint may be transmitted to the pixel electrode of the organic light-emitting diode OLED by the turned-on seventh transistor T7.

In the first emission period DD1, the fourth gate signal EM of an on voltage may be supplied to the fourth gate line EML, and the fifth gate signal EMB of an on voltage may be supplied to the fifth gate line EMBL. The fifth transistor T5 may be turned on by the fourth gate signal EM, and the first driving voltage ELVDD may be supplied to the first terminal of the first transistor T1 by the turned-on fifth transistor T5. The sixth transistor T6 may be turned on by the fifth gate signal EMB, the first transistor T1 may output a driving current having a magnitude corresponding to the voltage corresponding to the data signal Vdata stored in the first capacitor C1, and the organic light-emitting diode OLED may emit light with a luminance corresponding to the magnitude of the driving current.

As shown in FIG. 24, the second scan period SS may include a second non-emission period ND2 in which the pixel PXa does not emit light and a second emission period DD2 in which the pixel PXa emits light. The second non-emission period ND2 may include a fifth period P5 and a sixth period P6. The second scan period SS may not include a compensation period corresponding to the second period P2 of the first scan period AS and a writing period corresponding to the third period P3 of the first scan period AS.

During the fifth period P5, the sixth gate signal GB of an on voltage may be supplied to the sixth gate line GBL. The seventh transistor T7 may be turned on by the sixth gate signal GB, and the pixel electrode of the organic light-emitting diode OLED may be initialized to the second initializing voltage Vaint by the turned-on seventh transistor T7.

During the sixth period P6, the sixth gate signal GB of an on voltage may be supplied to the sixth gate line GBL. The seventh transistor T7 may be turned on by the sixth gate signal GB, and the pixel electrode of the organic light-emitting diode OLED may be initialized to the second initializing voltage Vaint by the turned-on seventh transistor T7.

In the second emission period DD2, the fourth gate signal EM of an on voltage may be supplied to the fourth gate line EML, and the fifth gate signal EMB of an on voltage may be supplied to the fifth gate line EMBL. The fifth transistor T5 may be turned on by the fourth gate signal EM, and the first driving voltage ELVDD may be supplied to the first terminal of the first transistor T1 by the turned-on fifth transistor T5. The sixth transistor T6 may be turned on by the fifth gate signal EMB, the first transistor T1 may output a driving current having a magnitude corresponding to the voltage stored in the first capacitor C1, e.g., the data signal Vdata, and the organic light-emitting diode OLED may emit light with a luminance corresponding to the magnitude of the driving current. The data signal Vdata stored in the first capacitor C1 in the second emission period DD2 may be a data signal supplied to the pixel and maintained in the third period P3 of the first scan period AS.

In each of the first emission period DD1 and the second emission period DD2, the on voltage application timing of the fifth gate signal EMB may be delayed a time period DT (e.g., a predetermined or selectable time period) from the on voltage application timing of the fourth gate signal EM. In the embodiment of FIGS. 22 to 24, by initializing the pixel electrode in each of a fifth period P5 and a sixth period P6 corresponding to periods before and after the compensation period of the first scan period AS in the second scan period SS, even in case that one or more second scan periods SS are included in one frame, a luminance deviation according to a driving speed may be minimized. By initializing a driving transistor only in the first scan period AS, occurrence of spots (mura) due to a voltage drop of a first initializing voltage of a screen may be minimized.

In the embodiment of FIGS. 22 to 24, during one frame, the first gate signal GW, the second gate signal GI, and the third gate signal GR may be supplied only in the first scan period AS, and the sixth gate signal GB may be supplied in the first scan period AS and the second scan period SS. The fourth gate signal EM and the fifth gate signal EMB may be supplied in the first scan period AS and the second scan period SS. In other words, during one frame, the period of each of the first gate signal GW, the second gate signal GI, and the third gate signal GR may be one cycle, and the period of each of the fourth gate signal EM, the fifth gate signal EMB, and the sixth gate signal GB may be two cycles.

According to another embodiment, the fourth period P4 of the first scan period AS and the sixth period P6 of the second scan period SS may be omitted.

Figure 25:
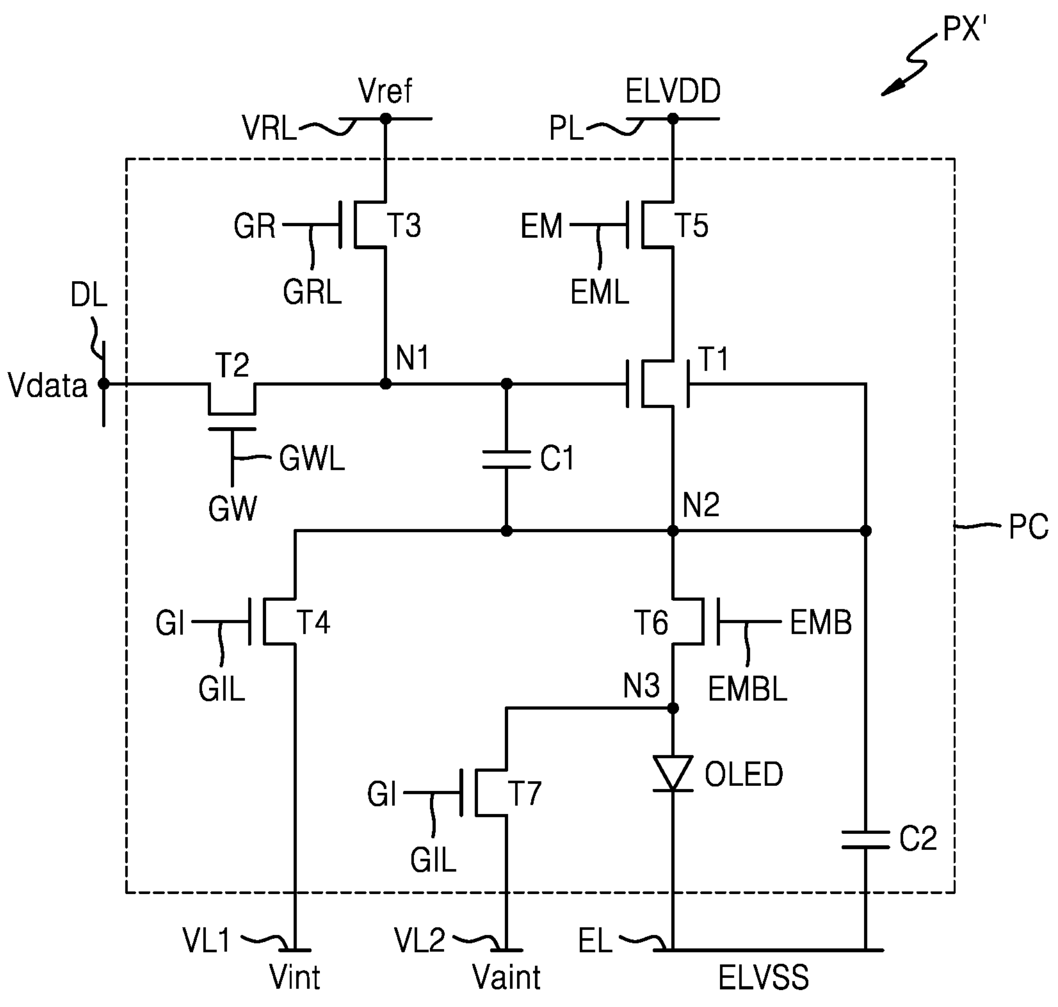
FIGS. 25 through 27 are schematic diagrams of equivalent circuits of pixels according to an embodiment.

Although not shown in the drawings, according to another embodiment, the second capacitor C2 may be connected to a conductive line to which a voltage supplied at intervals of one cycle during one frame is applied or a conductive line which does not have a voltage fluctuation during one frame, other than the reference voltage line VRL. For example, the second capacitor C2 may be connected between the first initializing voltage line VL1 and the second node N2, connected between the second initializing voltage line VL2 and the second node N2. Or according to another embodiment, as shown FIG. 25, the second capacitor C2 may be connected between the common voltage line EL to which the second driving voltage ELVSS is applied and the second node N2.

Figure 26:
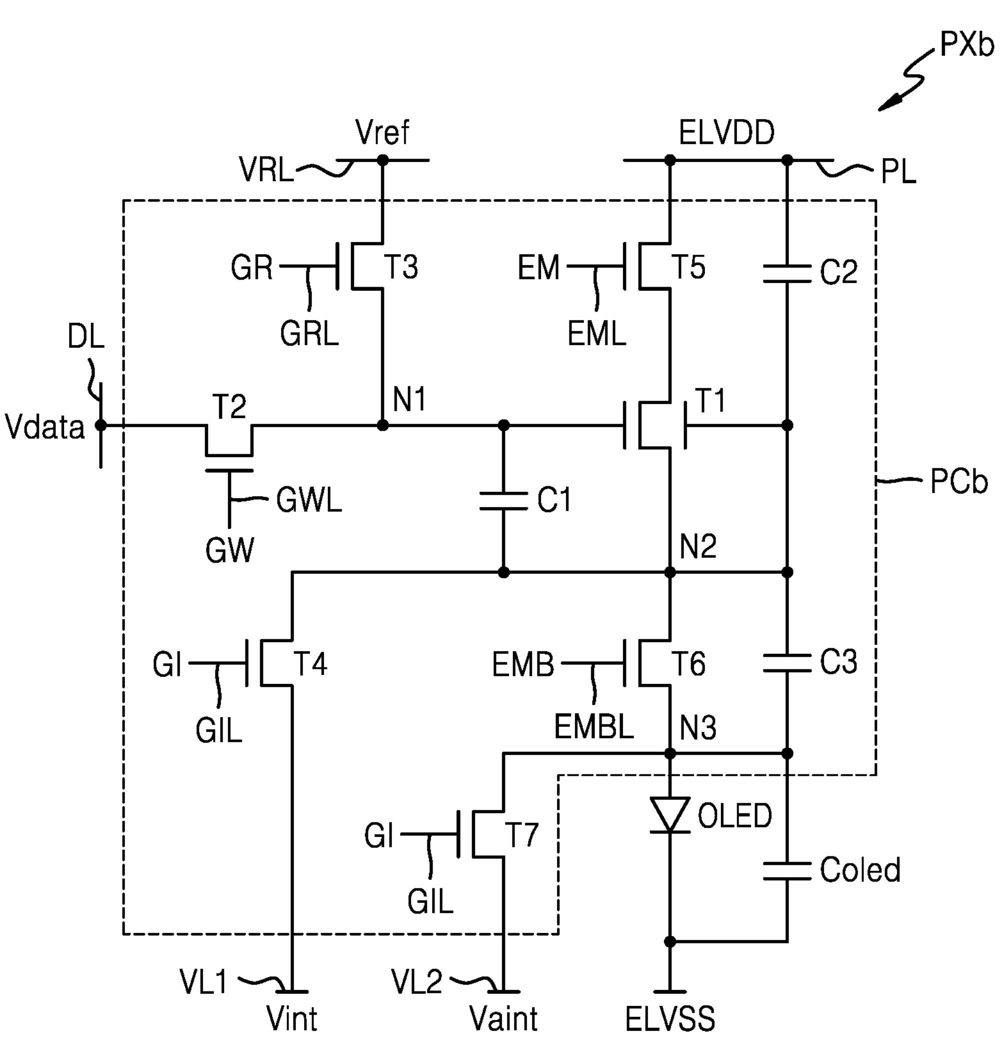
Figure 27:
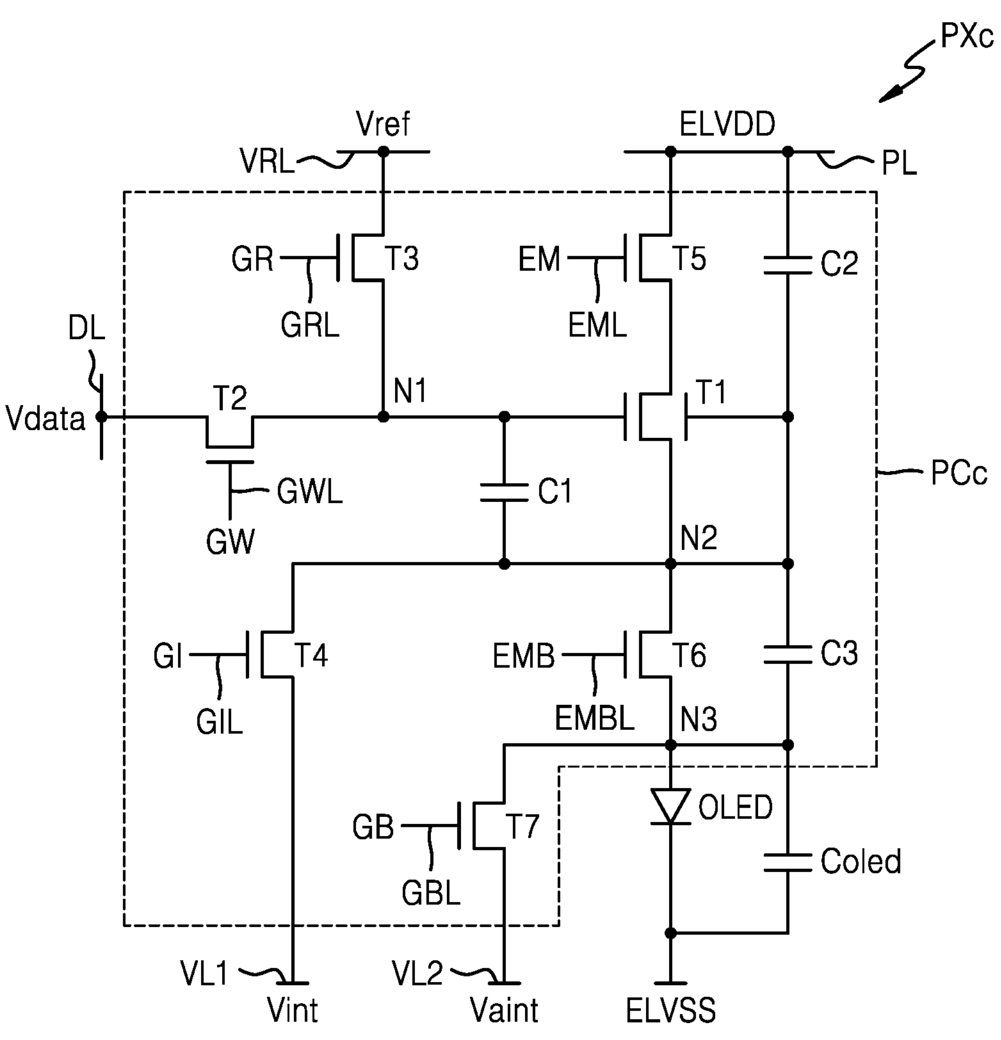

FIGS. 26 and 27 are schematic diagrams of equivalent circuits PCb and PCc of pixels PXb and PXc, according to an embodiment.

The pixel PXb of FIG. 26 may be different from the pixel PX of FIG. 4 at least in that the second capacitor C2 is connected between the driving voltage line PL and the second node N2 and a third capacitor C3 is added between the second node N2 and the third node N3. A first electrode of the third capacitor C3 may be connected to the second node N2, and a second electrode thereof may be connected to the third node N3. The second electrode of the third capacitor C3 may be disposed on the first electrode of the third capacitor C3 and may be electrically connected to the pixel electrode of the organic light-emitting diode OLED. According to an embodiment, the first electrode of the third capacitor C3 and the second electrode C22 (see FIG. 20) of the second capacitor C2 may be disposed on the same layer, and the second electrode of the third capacitor C3 may be a portion of a semiconductor layer of the sixth transistor T6 (e.g., the third semiconductor layer ACT3 of FIG. 13).

Even in case that the voltage of the second node N2 varies according to a variation in the first driving voltage ELVDD, the third capacitor C3 may be disposed between the second node N2 and the third node N3, and thus the voltage of the second node N2 may be compensated for by a parasitic capacitor Coled of the organic light-emitting diode OLED.

The pixel PXb illustrated in FIG. 26 may operate in the first scan period AS of FIG. 6 and the one or more second scan periods SS of FIG. 7 during one frame.

The pixel PXc of FIG. 27 may be different from the pixel PXb of FIG. 26 at least in that a gate of a seventh transistor T7 is connected to a sixth gate line GBL to supply a sixth gate signal GB. The pixel PXc illustrated in FIG. 27 may operate in the first scan period AS of FIG. 23 and the one or more second scan periods SS of FIG. 24 during one frame.

FIGS. 28A to 29B are schematic cross-sectional views of structures of a display element according to an embodiment.

The organic light-emitting diode OLED as a display element according to an embodiment may include a pixel electrode 211, an opposite electrode 215, and an intermediate layer 213 between the pixel electrode 211 (first electrode, anode) and the opposite electrode 215 (second electrode, cathode).

The pixel electrode 211 may include light-transmissive conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials. For example, the pixel electrode 211 may have a multi-layered structure of ITO/Ag/ITO.

The opposite electrode 215 may be disposed on the intermediate layer 213. The opposite electrode 215 may include a metal, an alloy, an electrically conductive compound each having a low work function, or an arbitrary combination thereof. For example, the opposite electrode 215 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The opposite electrode 215 may be a transmissive electrode, a semi-transmissive electrode, or a reflective electrode.

The intermediate layer 213 may include a low molecular or high molecular organic material that emits light of a certain color. In addition to various organic materials, the intermediate layer 213 may further include a metal-containing compound (such as an organic metal compound), an inorganic material (such as quantum dots), and the like.

According to an embodiment, the intermediate layer 213 may include an emission layer and a first functional layer and a second functional layer respectively below and above the emission layer. The first functional layer may include a hole transport layer HTL, or may include a hole transport layer HTL and a hole injection layer HIL. The second functional layer may include an electron transport layer ETL and/or an electron injection layer EIL. The first functional layer or the second functional layer may be omitted. The first functional layer and the second functional layer may be integral with each other to correspond to organic light-emitting diodes OLED included in the display area DA.

According to an embodiment, the intermediate layer 213 may include two or more emitting parts sequentially stacked each other between the pixel electrode 211 and the opposite electrode 215, and a charge generation layer CGL disposed between two emitting parts. In case that the intermediate layer 213 includes an emitting part and a charge generation layer CGL, the organic light-emitting diode OLED may be a tandem light-emitting device. The organic light-emitting diode OLED may improve color purity and luminous efficiency by having a stacked structure of emitting parts.

An emitting part may include an emission layer and a first functional layer and a second functional layer respectively below and above the emission layer. The charge generation layer CGL may include a negative charge generation layer and a positive charge generation layer. The luminous efficiency of the organic light-emitting diode OLED, which is a tandem light-emitting device including emission layers, may be further increased by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 28A:
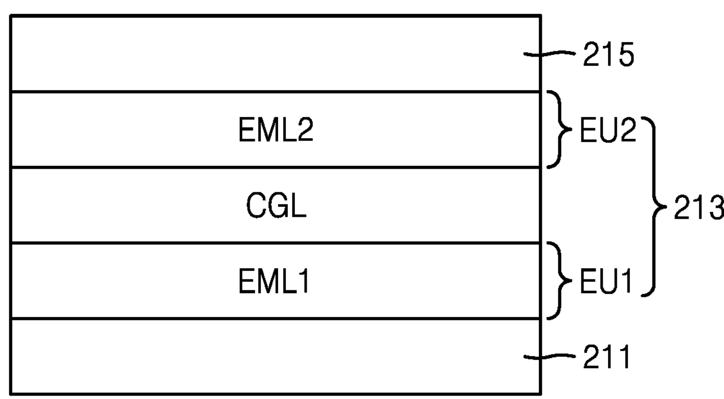
FIGS. 28A through 29B are schematic cross-sectional views of structures of a display element according to an embodiment.

According to an embodiment, as shown in FIG. 28A, the organic light-emitting diode OLED may include a first emitting part EU1 including a first emission layer EML1 and a second emitting part EU2 including a second emission layer EML2, which are sequentially stacked on each other. The charge generation layer CGL may be interposed between the first emitting part EU and the second emitting part EU2. For example, the organic light-emitting diode OLED may include the pixel electrode 211, the first emission layer EML1, the charge generation layer CGL, the second emission layer EML2, and the opposite electrode 215 sequentially stacked on one another. The first functional layer and the second functional layer may be provided below and above the first emission layer EML1, respectively. The first functional layer and the second functional layer may be provided below and above the second emission layer EML2, respectively. The first emission layer EML1 may be a blue emission layer, and the second emission layer EML2 may be a yellow emission layer.

Figure 28B:
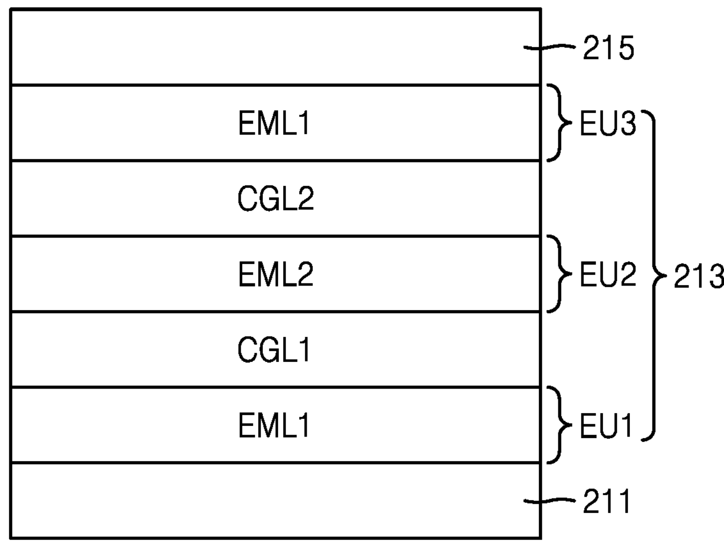

According to an embodiment, as shown in FIG. 28B, the organic light-emitting diode OLED may include a first emitting part EU1 and a third emitting part EU3 each including a first emission layer EML1 and a second emission part EU2 including a second emission layer EML2. A first charge generation layer CGL1 may be provided between the first emitting part EU1 and the second emitting part EU2, and a second charge generation layer CGL2 may be provided between the second emitting part EU2 and the third emitting part EU3. For example, the organic light-emitting diode OLED may include the pixel electrode 211, the first emission layer EML1, the first charge generation layer CGL1, the second emission layer EML2, the second charge generation layer CGL2, the first emission layer EML1, and the opposite electrode 215 sequentially stacked on one another. The first functional layer and the second functional layer may be provided below and above the first emission layer EML1, respectively. The first functional layer and the second functional layer may be provided below and above the second emission layer EML2, respectively. The first emission layer EML1 may be a blue emission layer, and the second emission layer EML2 may be a yellow emission layer.

According to an embodiment, in the organic light-emitting diode OLED, the second emitting part EU2 may further include a third emission layer EML3 and/or a fourth emission layer EML4 disposed below and/or above the second emission layer EML2 to directly contact the second emission layer EML2, in addition to the second emission layer EML2. The "directly contact" may mean that other layers are not disposed between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 28C:
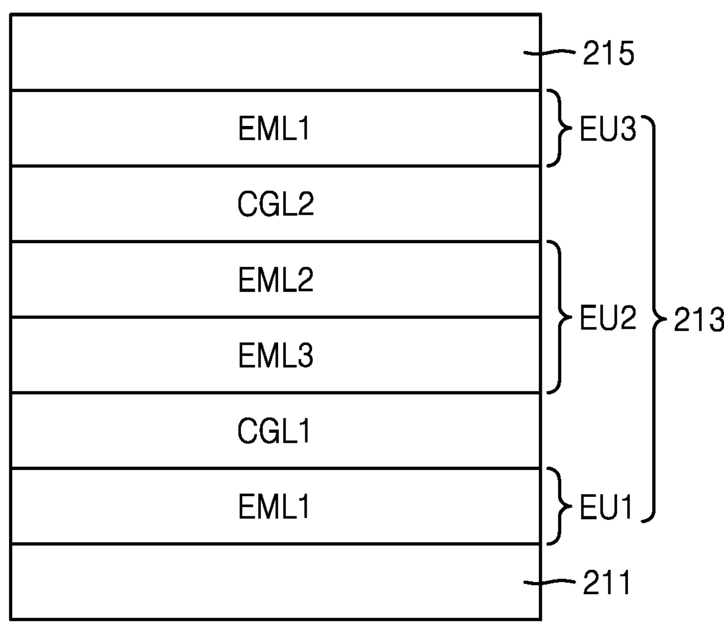

For example, as shown in FIG. 28C, the organic light-emitting diode OLED may include the pixel electrode 211, the first emission layer EML1, the first charge generation layer CGL1, the third emission layer EML3, the second emission layer EML2, the second charge generation layer CGL2, the first emission layer EML1, and the opposite electrode 215 sequentially stacked on one another. As another example, as shown in FIG. 28D, the organic light-emitting diode OLED may include the pixel electrode 211, the first emission layer EML1, the first charge generation layer CGL1, the third emission layer EML3, the second emission layer EML2, a fourth emission layer EML4, the second charge generation layer CGL2, the first emission layer EML1, and the opposite electrode 215 sequentially stacked on one another.

Figure 28D:
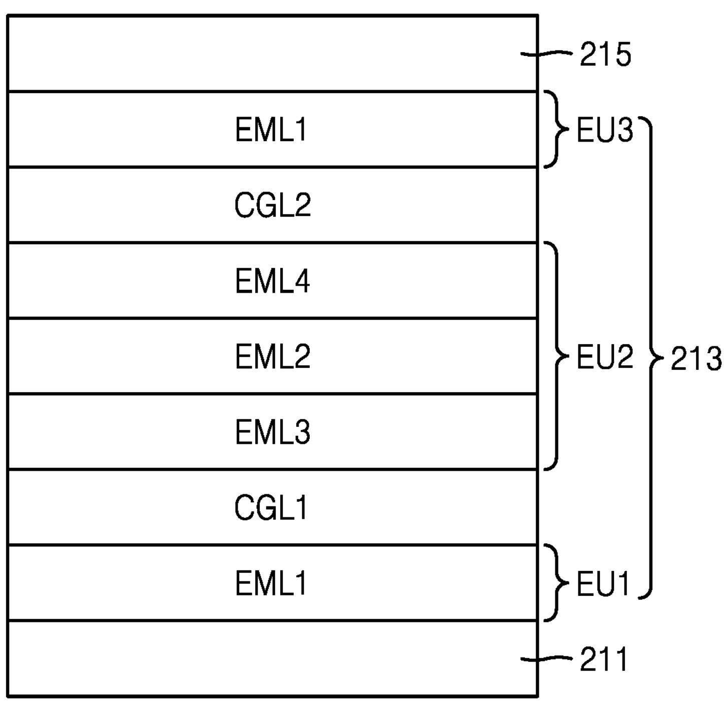
Figure 29A:
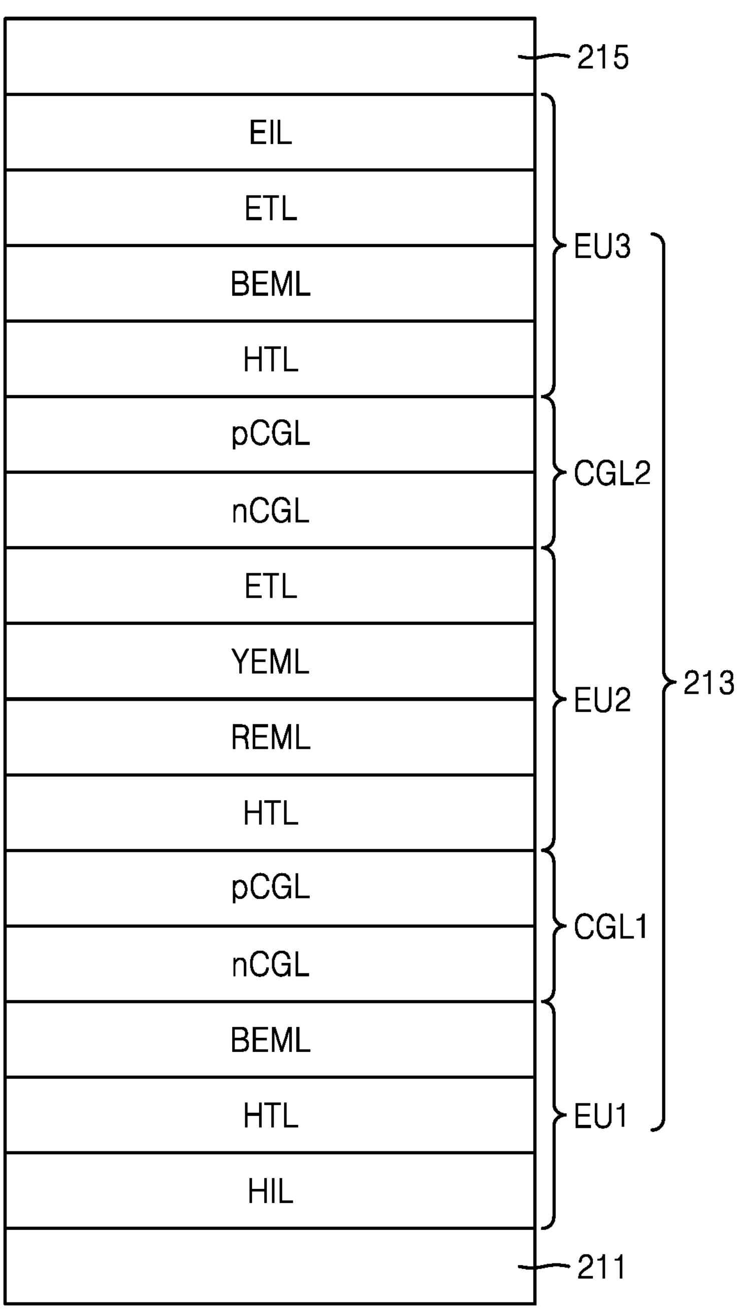
Figure 29B:
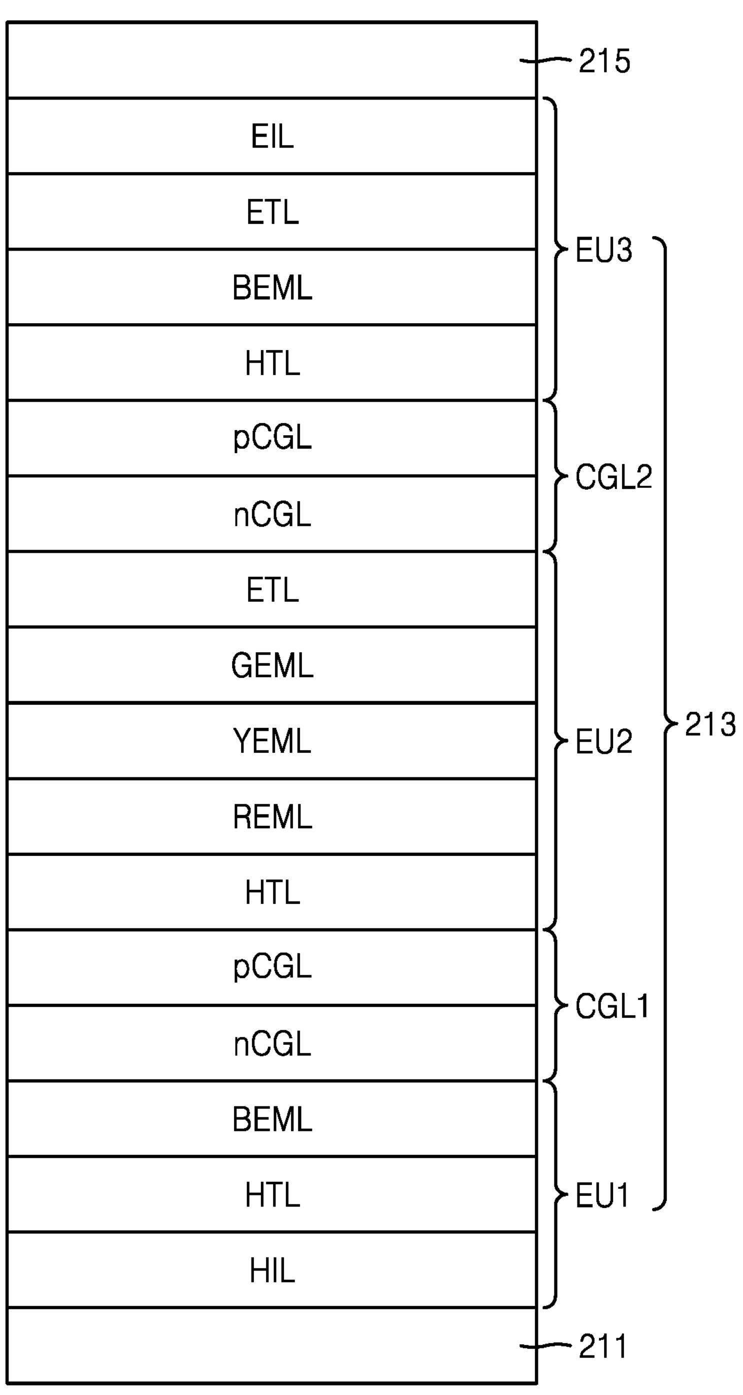

FIG. 29A is a schematic cross-sectional view illustrating an example of the organic light-emitting diode of FIG. 28C, and FIG. 29B is a schematic cross-sectional view illustrating an example of the organic light-emitting diode of FIG. 28D.

Referring to FIG. 29A, the organic light-emitting diode OLED may include a first emitting part EU1, a second emitting part EU2, and a third emitting part EU3 sequentially stacked on one another. A first charge generation layer CGL1 may be provided between the first emitting part EU1 and the second emitting part EU2, and a second charge generation layer CGL2 may be provided between the second emitting part EU2 and the third emitting part EU3. Each of the first charge generation layer CGL1 and the second charge generation layer CGL2 may include a negative charge generation layer nCGL and a positive charge generation layer pCGL.

The first emitting part EU1 may include a blue emission layer BEML. The first emitting part EU1 may further include a hole injection layer HIL and a hole transport layer HTL between the pixel electrode 211 and the blue emission layer BEML. According to an embodiment, a p-doped layer may be further included between the hole injection layer HIL and the hole transport layer HTL. The p-doped layer may be formed by doping the hole injection layer HIL with a p-type doping material. According to an embodiment, at least one of a blue light auxiliary layer, an electron blocking layer, and a buffer layer may be further included between the blue emission layer BEML and the hole transport layer HTL. The blue light auxiliary layer may increase luminous efficiency of the blue emission layer BEML. The blue light auxiliary layer may increase luminous efficiency of the blue emission layer BEML by adjusting a hole charge balance. The electron blocking layer may prevent injection of electrons into the hole transport layer HTL. The buffer layer may compensate for a resonance distance according to the wavelength of light emitted by the emission layer.

The second emitting part EU2 may include a yellow emission layer YEML and a red emission layer REML directly contacting the yellow emission layer YEML below the yellow emission layer YEML. The second emitting part EU2 may further include a hole transport layer HTL between the positive charge generation layer pCGL of the first charge generation layer CGL1 and the red emission layer REML, and may further include an electron transport layer ETL between the yellow emission layer YEML and the negative charge generation layer nCGL of the second charge generation layer CGL2.

The third emitting part EU3 may include a blue emission layer BEML. The third emitting part EU3 may further include a hole transport layer HTL between the positive charge generation layer pCGL of the second charge generation layer CGL2 and the blue emission layer BEML. The third emitting part EU3 may further include an electron transport layer ETL and an electron injection layer EIL between the blue emission layer BEML and the opposite electrode 215. The electron transport layer ETL may be a single layer or multiple layers. According to an embodiment, at least one of a blue light auxiliary layer, an electron blocking layer, and a buffer layer may be further included between the blue emission layer BEML and the hole transport layer HTL. At least one of a hole blocking layer and a buffer layer may be further included between the blue emission layer BEML and the electron transport layer ETL. The hole blocking layer may prevent injection of holes into the electron transport layer ETL.

The organic light-emitting diode OLED shown in FIG. 29B may be the same as the organic light-emitting diode OLED shown in FIG. 29A except for the stacked structure of the second emitting part EU2. Referring to FIG. 29B, the second emitting part EU2 may include a yellow emission layer YEML, a red emission layer REML directly contacting the yellow emission layer YEML below the yellow emission layer YEML, and a green emission layer GEML directly contacting the yellow emission layer YEML above the yellow emission layer YEML. The second emitting part EU2 may further include a hole transport layer HTL between the positive charge generation layer pCGL of the first charge generation layer CGL1 and the red emission layer REML, and may further include an electron transport layer ETL between the green emission layer GEML and the negative charge generation layer nCGL of the second charge generation layer CGL2.

Figure 30:
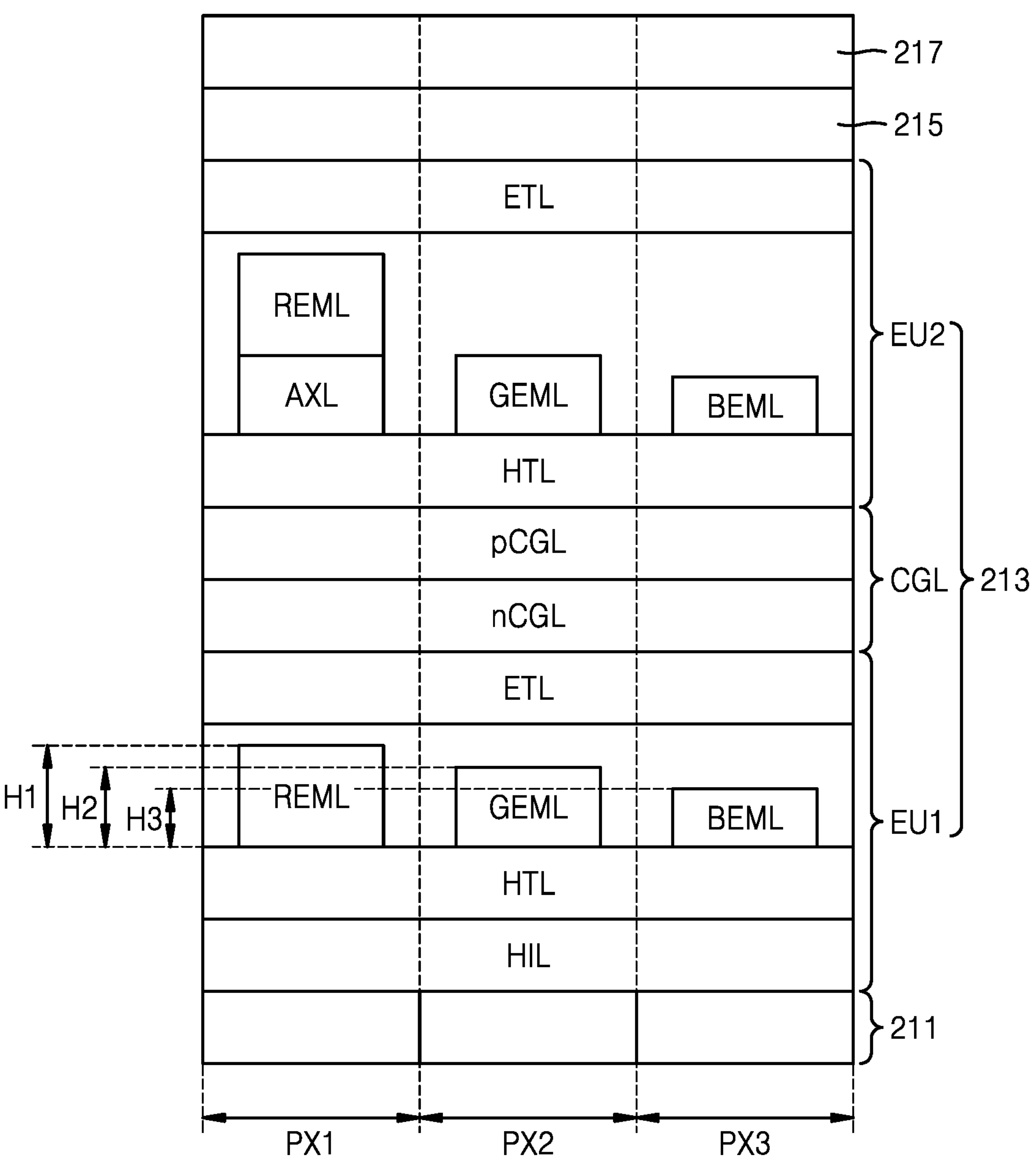
FIG. 30 is a schematic cross-sectional view of a structure of a pixel of a display apparatus according to an embodiment.

FIG. 30 is a schematic cross-sectional view of a structure of a pixel of a display apparatus according to an embodiment.

Referring to FIG. 30, the display apparatus may include pixels. The pixels may include a first pixel PX1, a second pixel PX2, and a third pixel PX3. Each of the first pixel PX1, the second pixel PX2, and the third pixel PX3 may include a pixel electrode 211, an opposite electrode 215, and an intermediate layer 213. According to an embodiment, the first pixel PX1 may be a red pixel, the second pixel PX2 may be a green pixel, and the third pixel PX3 may be a blue pixel. Each pixel may include an organic light-emitting diode OLED as a display element, and the organic light-emitting diode OLED of each pixel may be electrically connected to a pixel circuit.

The pixel electrodes 211 may be independently included in the first pixel PX1, the second pixel PX2, and the third pixel PX3.

The intermediate layer 213 of the organic light-emitting diode OLED of each of the first pixel PX1, the second pixel PX2, and the third pixel PX3 may include the first emitting part EU1 and the second emitting part EU2 sequentially stacked on each other, and the charge generation layer CGL between the first emitting part EU1 and the second emitting part EU2. The charge generation layer may include a negative charge generation layer nCGL and a positive charge generation layer pCGL. The charge generation layer CGL may be a common layer continuously formed in the first pixel PX1, the second pixel PX2, and the third pixel PX3.

The first emitting part EU1 of the first pixel PX1 may include a hole injection layer HIL, a hole transport layer HTL, a red emission layer REML, and an electron transport layer ETL sequentially stacked on the pixel electrode 211. The first emitting part EU1 of the second pixel PX2 may include a hole injection layer HIL, a hole transport layer HTL, a green emission layer GEML, and an electron transport layer ETL sequentially stacked on the pixel electrode 211. The first emitting part EU1 of the third pixel PX3 may include a hole injection layer HIL, a hole transport layer HTL, a blue emission layer BEML, and an electron transport layer ETL sequentially stacked on the pixel electrode 211. Each of the hole injection layer HIL, the hole transport layer HTL, and the electron transport layer ETL of the first emitting part EU1 may be a common layer continuously formed in the first pixel PX1, the second pixel PX2, and the third pixel PX3.

The second emitting part EU2 of the first pixel PX1 may include a hole injection layer HIL, an auxiliary layer AXL, a red emission layer REML, and an electron transport layer ETL sequentially stacked on the charge generation layer CGL. The second emitting part EU2 of the second pixel PX2 may include a hole injection layer HIL, a green emission layer GEML, and an electron transport layer ETL sequentially stacked on the charge generation layer CGL. The second emitting part EU2 of the third pixel PX3 may include a hole transport layer HTL, a blue emission layer BEML, and an electron transport layer ETL sequentially stacked on the charge generation layer CGL. Each of the hole transport layer HTL and the electron transport layer ETL of the second emitting parts EU2 may be a common layer continuously formed in the first pixel PX1, the second pixel PX2, and the third pixel PX3. According to an embodiment, at least one of a hole blocking layer and a buffer layer may be included between the emission layer and the electron transport layer ETL in the second emitting part EU2 of the first pixel PX1, the second pixel PX2, and the third pixel PX3.

A thickness H1 of the red emission layer REML, a thickness H2 of the green emission layer GEML, and a thickness H3 of the blue emission layer BEML may be determined according to a resonance distance. The auxiliary layer AXL is a layer added to adjust the resonance distance, and may include a resonance auxiliary material. For example, the auxiliary layer AXL and the hole transport layer HTL may include the same material.

In FIG. 30, only the first pixel PX1 may include the auxiliary layer AXL. However, embodiments are not limited thereto. For example, the auxiliary layer AXL may be included in at least one of the first pixel PX1, the second pixel PX2, and the third pixel PX3 in order to adjust the resonance distance of each of the first pixel PX1, the second pixel PX2, and the third pixel PX3.

The display apparatus may further include a capping layer 217 disposed outside the opposite electrode 215. The capping layer 217 may serve to improve luminous efficiency according to the principle of constructive interference. Accordingly, the light extraction efficiency of the organic light-emitting diode OLED may be increased, and thus the luminous efficiency of the organic light-emitting diode OLED may be improved.

While the disclosure has been particularly shown and described with reference to exemplary embodiments thereof, it will be understood by those of ordinary skill in the art that various changes in form and details may be made therein without departing from the spirit and scope as defined by the following claims.

According to embodiments, a display apparatus capable of improving a display quality may be provided. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure and as defined by the following claims.

What is claimed is:

1. A display apparatus comprising:

a plurality of pixels, wherein each of the plurality of pixels comprises:

- a first transistor including a first terminal, a second terminal, a first gate, and a second gate connected to the second terminal;
- a second transistor connected to the first gate of the first transistor and a data line;
- a third transistor connected to the first gate of the first transistor and a first voltage line;
- a fourth transistor connected to the first terminal of the first transistor and a second voltage line;
- a first capacitor including a first electrode connected to the first gate of the first transistor and a second electrode connected to the second terminal of the first transistor; and
- a second capacitor including a first electrode connected to the first voltage line and a second electrode connected to the second terminal of the first transistor, and the first electrode of the second capacitor and the first voltage line are disposed on a same layer.

2. The display apparatus of claim 1, wherein the second electrode of the second capacitor is connected to the second gate of the first transistor.

3. The display apparatus of claim 1, wherein the first electrode of the first capacitor includes an upper electrode and a lower electrode, the upper electrode and the first gate of the first transistor are disposed on a same layer, the lower electrode and the first electrode of the second capacitor are disposed on a same layer, and the lower electrode is connected to the upper electrode.

4. The display apparatus of claim 1, wherein during one frame, a gate signal is supplied to a gate of the third transistor once, and a gate signal is supplied to a gate of the fourth transistor two or more times.

5. The display apparatus of claim 1, wherein each of the plurality of pixels further comprises:

a fifth transistor connected to the second terminal of the first transistor and a third voltage line;

a sixth transistor connected to the second terminal of the first transistor and a light-emitting diode; and a seventh transistor connected to the light-emitting diode and a fourth voltage line, and a same gate signal is supplied to a gate of the fifth transistor and a gate of the seventh transistor.

6. The display apparatus of claim 5, wherein a timing at which a gate signal is applied to the gate of the fourth transistor precedes a timing at which a gate signal is applied to the gate of the sixth transistor.

7. The display apparatus of claim 1, wherein each of the plurality of pixels further comprises:

a fifth transistor connected to the second terminal of the first transistor and a third voltage line;

a sixth transistor connected to the second terminal of the first transistor and a light-emitting diode; and a seventh transistor connected to the light-emitting diode and a fourth voltage line, and a gate signal supplied to a gate of the fifth transistor and a gate signal supplied to a gate of the seventh transistor are different.

8. The display apparatus of claim 7, wherein during one frame, a gate signal is supplied to a gate of the fifth transistor once, and a gate signal is supplied to a gate of the seventh transistor two or more times.

9. The display apparatus of claim 1, wherein one frame includes a first scan period including a first non-emission period and a first emission period and a second scan period including a second non-emission period and a second emission period, each of the plurality of pixels further comprises a fifth transistor connected to the second terminal of the first transistor and a third voltage line, and the first non-emission period comprises:

a writing period in which a first gate signal is applied to a gate of the second transistor;

a first period in which a second gate signal is applied to a gate of the fifth transistor and a third gate signal is applied to a gate of the third transistor, before the writing period; and a second period in which the third gate signal is applied to a gate of the third transistor and a fourth gate signal is applied to a gate of the fourth transistor, between the writing period and the first period.

10. The display apparatus of claim 9, wherein the second non-emission period comprises a third period in which the second gate signal is applied to the gate of the fifth transistor.

11. A display apparatus comprising:

a plurality of pixels, wherein each of the plurality of pixels comprises:

a first transistor including a first terminal, a second terminal, a first gate, and a second gate connected to the second terminal;

a second transistor connected to the first gate of the first transistor and a data line;

a third transistor connected to the first gate of the first transistor and a first voltage line;

a fourth transistor connected to the first terminal of the first transistor and a second voltage line;

a fifth transistor connected to the second terminal of the first transistor and a light-emitting diode;

a first capacitor including a first electrode connected to the first gate of the first transistor and a second electrode connected to the second terminal of the first transistor; and a second capacitor including a first electrode connected to the first voltage line and a second electrode connected to the second terminal of the first transistor, and a timing at which a gate signal is applied to a gate of the fourth transistor precedes a timing at which a gate signal is applied to a gate of the fifth transistor.

12. The display apparatus of claim 11, wherein the second electrode of the second capacitor is connected to the second gate of the first transistor.

13. The display apparatus of claim 11, wherein the first electrode of the first capacitor includes an upper electrode and a lower electrode, the upper electrode and the first gate of the first transistor are disposed on a same layer, the lower electrode and the first electrode of the second capacitor are disposed on a same layer, and the lower electrode is connected to the upper electrode.

14. The display apparatus of claim 11, wherein during one frame, a gate signal is supplied to a gate of the third transistor once, and a gate signal is supplied to a gate of the fourth transistor two or more times.

15. The display apparatus of claim 11, wherein each of the plurality of pixels further comprises:

a sixth transistor connected to the second terminal of the first transistor and a third voltage line; and a seventh transistor connected to the light-emitting diode and a fourth voltage line, and a same gate signal is supplied to a gate of the sixth transistor and a gate of the seventh transistor.

16. The display apparatus of claim 11, wherein each of the plurality of pixels further comprises:

a sixth transistor connected to the second terminal of the first transistor and a third voltage line; and a seventh transistor connected to the light-emitting diode and a fourth voltage line, and a gate signal supplied to a gate of the sixth transistor and a gate signal supplied to a gate of the seventh transistor are different.

17. The display apparatus of claim 16, wherein during one frame, a gate signal is supplied to a gate of the sixth transistor once, and a gate signal is supplied to a gate of the seventh transistor two or more times.

18. A display apparatus comprising:

a plurality of pixels, wherein each of the plurality of pixels comprises:

a first transistor including a first terminal, a second terminal, a first gate, and a second gate connected to the second terminal;

a second transistor connected to the first gate of the first transistor and a data line;

a third transistor connected to the first gate of the first transistor and a first voltage line;

a fourth transistor connected to the first terminal of the first transistor and a second voltage line;

a first capacitor including a first electrode connected to the first gate of the first transistor and a second electrode connected to the second terminal of the first transistor;

a second capacitor including a first electrode connected to the second voltage line and a second electrode connected to the second terminal of the first transistor; and a third capacitor including a first electrode connected to the second terminal of the first transistor and a second electrode connected to one electrode of a light-emitting diode.

19. The display apparatus of claim 18, wherein each of the plurality of pixels further comprises:

a fifth transistor connected to the second terminal of the first transistor and a third voltage line;

a sixth transistor connected to the second terminal of the first transistor and the light-emitting diode; and a seventh transistor connected to the light-emitting diode and a fourth voltage line, a same gate signal is supplied to a gate of the fifth transistor and a gate of the seventh transistor, and a timing at which a gate signal is applied to a gate of the fourth transistor precedes a timing at which a gate signal is applied to a gate of the sixth transistor.

20. The display apparatus of claim 18, wherein each of the plurality of pixels further comprises:

a fifth transistor connected to the second terminal of the first transistor and a third voltage line;

a sixth transistor connected to the second terminal of the first transistor and the light-emitting diode; and a seventh transistor connected to the light-emitting diode and a fourth voltage line, a gate signal supplied to a gate of the fifth transistor and a gate signal supplied to a gate of the seventh transistor are different, and a timing at which a gate signal is applied to a gate of the fourth transistor precedes a timing at which a gate signal is applied to a gate of the sixth transistor.

21. A display apparatus comprising:

a plurality of pixels, wherein each of the plurality of pixels comprises:

a first transistor including a first terminal, a second terminal, a first gate, and a second gate connected to the second terminal;

a second transistor connected to the first gate of the first transistor and a data line;

a third transistor connected to the first gate of the first transistor and a first voltage line;

a fourth transistor connected to the first terminal of the first transistor and a second voltage line;

a fifth transistor connected to the second terminal of the first transistor and a first electrode of a light-emitting diode;

a first capacitor including a first electrode connected to the first gate of the first transistor and a second electrode connected to the second terminal of the first transistor; and a second capacitor including a first electrode connected to the second terminal of the first transistor and a second electrode connected to a second electrode of the light-emitting diode.

22. The display apparatus of claim 21, wherein the first electrode of the second capacitor is connected to the second gate of the first transistor.

23. The display apparatus of claim 21, wherein the first electrode of the first capacitor includes an upper electrode and a lower electrode, the upper electrode and the first gate of the first transistor are disposed on a same layer, the lower electrode and the first electrode of the second capacitor are disposed on a same layer, and the lower electrode is connected to the upper electrode.

24. The display apparatus of claim 21, wherein during one frame, a gate signal is supplied to a gate of the third transistor once, and a gate signal is supplied to a gate of the fourth transistor two or more times.

25. The display apparatus of claim 21, wherein each of the plurality of pixels further comprises:

a sixth transistor connected to the second terminal of the first transistor and a third voltage line; and a seventh transistor connected to the first electrode of the light-emitting diode and a fourth voltage line, and a same gate signal is supplied to a gate of the sixth transistor and a gate of the seventh transistor.

26. The display apparatus of claim 21, wherein a timing at which a gate signal is applied to a gate of the fourth transistor precedes a timing at which a gate signal is applied to a gate of the fifth transistor.

27. The display apparatus of claim 21, wherein each of the plurality of pixels further comprises:

a sixth transistor connected to the second terminal of the first transistor and a third voltage line; and a seventh transistor connected to the first electrode of the light-emitting diode and a fourth voltage line, and a gate signal supplied to a gate of the sixth transistor and a gate signal supplied to a gate of the seventh transistor are different.

28. The display apparatus of claim 27, wherein during one frame, a gate signal is supplied to a gate of the sixth transistor once, and a gate signal is supplied to a gate of the seventh transistor two or more times.

29. The display apparatus of claim 21, wherein one frame includes a first scan period including a first non-emission period and a first emission period and a second scan period including a second non-emission period and a second emission period, each of the plurality of pixels further comprises a sixth transistor connected to the second terminal of the first transistor and a third voltage line, and the first non-emission period comprises:

a writing period in which a first gate signal is applied to a gate of the second transistor;

a first period in which a second gate signal is applied to a gate of the sixth transistor and a third gate signal is applied to a gate of the third transistor, before the writing period; and a second period in which the third gate signal is applied to a gate of the third transistor and a fourth gate signal is applied to a gate of the fourth transistor, between the writing period and the first period.

30. The display apparatus of claim 29, wherein the second non-emission period comprises a third period in which the second gate signal is applied to the gate of the sixth transistor.

* * * * *